US012720983B2

(12) United States Patent
Cui et al.

(10) Patent No.: US 12,720,983 B2
(45) Date of Patent: Aug. 25, 2026

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Hongda Cui, Beijing (CN); Qiwei Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 389 days.

(21) Appl. No.: 18/580,139

(22) PCT Filed: Aug. 22, 2022

(86) PCT No.: PCT/CN2022/113940
§ 371 (c)(1),
(2) Date: Jan. 17, 2024

(87) PCT Pub. No.: WO2024/040389
PCT Pub. Date: Feb. 29, 2024

(65) Prior Publication Data
US 2025/0040368 A1 Jan. 30, 2025

(51) Int. Cl.
*H10K 59/131* (2023.01)
*H10K 59/121* (2023.01)
*H10K 59/65* (2023.01)

(52) U.S. Cl.
CPC ....... *H10K 59/131* (2023.02); *H10K 59/1213* (2023.02); *H10K 59/1216* (2023.02); *H10K 59/65* (2023.02)

(58) Field of Classification Search
CPC ............. H10K 59/131; H10K 59/1213; H10K 59/1216; H10K 59/121; H10K 59/65
See application file for complete search history.

(56) References Cited

U.S. PATENT DOCUMENTS 11,342,400 B2 * 5/2022 Zhao .................... H10K 59/131
11,700,754 B2 * 7/2023 Kim ..................... G09G 3/3233 257/40

(Continued)

OTHER PUBLICATIONS

European Search Report of the European application No. 22955939.8, issued on Oct. 21, 2024. 11 pages.

*Primary Examiner* — Nikolay K Yushin

(57) ABSTRACT

Disclosed are a display panel and a display apparatus, the display panel includes a display region, the display region includes a light transmitting display region and a conventional display region located on at least one side of the light transmitting display region, the conventional display region includes a first region, a second region, and a third region; at least one circuit unit of the first region in the conventional display region is connected with a light emitting device in the light transmitting display region, at least one circuit unit of the third region in the conventional display region includes a data connection line, a second high-voltage power supply line includes a first sub-high-voltage power supply line and a second sub-high-voltage power supply line connected with each other, the second sub-high-voltage power supply line is located on a side of the first sub-high-voltage power supply line away from the base substrate.

20 Claims, 51 Drawing Sheets

(56) References Cited

U.S. PATENT DOCUMENTS

| | | | | |
|---|---|---|---|---|
| 11,737,322 | B2 * | 8/2023 | Youn | H10K 59/88 257/40 |
| 2020/0133343 | A1 * | 4/2020 | Lee | G02B 6/0078 |
| 2021/0210584 | A1 | 7/2021 | Youn et al. | |
| 2021/0384266 | A1 | 12/2021 | Zhao et al. | |
| 2024/0203318 | A1 * | 6/2024 | Han | H10K 59/131 |
| 2024/0212610 | A1 * | 6/2024 | Huang | H10K 59/121 |
| 2024/0431159 | A1 * | 12/2024 | Wang | H10K 59/131 |

* cited by examiner

Pxij
300
100
200

DISPLAY PANEL AND DISPLAY APPARATUS

CROSS-REFERENCE TO RELATED APPLICATION

The present application is a U.S. National Phase Entry of International Application No. PCT/CN2022/113940 having an international filing date of Aug. 22, 2022, contents of the above-identified application should be interpreted as being incorporated into the present application by reference.

TECHNICAL FIELD

The present disclosure relates to, but is not limited to, the field of display technologies, and more particularly, to a display panel and a display apparatus.

BACKGROUND

An Organic Light Emitting Diode (OLED) and a Quantum dot Light Emitting Diode (QLED) are active light emitting display devices and have advantages such as self-luminescence, a wide viewing angle, a high contrast ratio, low power consumption, an extremely high response speed, lightness and thinness, flexibility, and a low cost. With constant development of display technologies, a flexible display apparatus (Flexible Display) in which an OLED or a QLED is used as a light emitting device and signal control is performed through a Thin Film Transistor (TFT) has become a mainstream product in the field of display at present.

SUMMARY

The following is a summary of subject matter described herein in detail. The summary is not intended to limit the scope of protection of claims.

In a first aspect, the present disclosure provides a display panel, including: a display region, wherein the display region includes: a light transmitting display region and a conventional display region located on at least one side of the light transmitting display region, the conventional display region includes a first region, a second region, and a third region, at least one circuit unit of the first region is connected with a light emitting device in the light transmitting display region, at least one circuit unit of the third region includes a data connection line, a high-voltage power supply line located in the first region is a first high-voltage power supply line, a high-voltage power supply line located in the second region is a second high-voltage power supply line, and a high-voltage power supply line located in the third region is a third high-voltage power supply line; the second high-voltage power supply line includes a first sub-high-voltage power supply line and a second sub-high-voltage power supply line connected with each other, the second sub-high-voltage power supply line is located on a side of the first sub-high-voltage power supply line away from a base substrate, the first high-voltage power supply line and the second sub-high-voltage power supply line are disposed in a same layer, and the third high-voltage power supply line and the first sub-high-voltage power supply line are disposed in a same layer.

In an exemplary implementation mode, the data connection line includes: a first connection line and a second connection line extending along a second direction which are connected with each other, the first connection line is located on a side of the third high-voltage power supply line close to the base substrate, the second connection line and the first high-voltage power supply line are disposed in a same layer; an orthographic projection of the first connection line on the base substrate is at least partially overlapped with an orthographic projection of a data signal line on the base substrate, and an orthographic projection of the second connection line on the base substrate is at least partially overlapped with an orthographic projection of the third high-voltage power supply line on the base substrate.

In an exemplary implementation mode, the first connection line includes: a first data connection portion extending along the second direction and a second data connection portion extending along a first direction, the first data connection portion is connected with the second data connection portion and the second connection line, respectively, and the first direction and the second direction intersect; an orthographic projection of the first data connection portion on the base substrate is at least partially overlapped with the orthographic projection of the data signal line on the base substrate.

In an exemplary implementation mode, a length of the second sub-high-voltage power supply line along a first direction is less than a length of the first sub-high-voltage power supply line along the first direction, and an orthographic projection of the second sub-high-voltage power supply line on the base substrate is at least partially overlapped with an orthographic projection of the first sub-high-voltage power supply line on the base substrate.

In an exemplary implementation mode, a length of the first high-voltage power supply line along the first direction and a length of the first sub-high-voltage power supply line along the first direction are approximately equal to that of the third high-voltage power supply line, and a shape of the first high-voltage power supply line, a shape of the first sub-high-voltage power supply line, and a shape of the third high-voltage power supply line are approximately the same.

In an exemplary implementation mode, a length of the second sub-high-voltage power supply line along the first direction is approximately equal to a length of a second connection line along the first direction, and a shape of the second sub-high-voltage power supply line is approximately the same as a shape of the second connection line.

In an exemplary implementation mode, an area of an overlapping region of an orthographic projection of the second sub-high-voltage power supply line on the base substrate and an orthographic projection of the first sub-high-voltage power supply line on the base substrate is larger than an area of an overlapping region of an orthographic projection of the second connection line on the base substrate and an orthographic projection of the third high-voltage power supply line on the base substrate.

In an exemplary implementation mode, the light emitting device includes an anode, an organic emitting layer, and a cathode, and the display panel further includes a plurality of first anode connection lines extending along a first direction, a first anode connection line is disposed in a same layer as the third high-voltage power supply line, and is configured to connect at least one circuit unit of the first region and an anode of the light emitting device located in the light transmitting display region.

In an exemplary implementation mode, the light transmitting display region includes: a central region and an edge region surrounding and disposed on an outside of the central region; the display panel further includes a second anode connection line, and the second anode connection line is located on a side of the first high-voltage power supply line away from the base substrate; the first anode connection line is configured to connect at least one circuit unit of the first region and an anode of a light emitting device located in the edge region, and the second anode connection line is configured to connect at least one circuit unit of the first region and an anode of a light emitting device located in the central region.

In an exemplary implementation mode, the first anode connection line includes a metal signal line and the second anode connection line includes a transparent conductive signal line.

In an exemplary implementation mode, the light emitting structure layer includes: a plurality of light emitting units, at least one light emitting unit includes: a first light emitting device, a second light emitting device, and a third light emitting device, different light emitting devices emitting light of different colors, the first light emitting device and the second light emitting device emit red or blue light, and the third light emitting device emits green light; for a light emitting unit located in the edge region, a length of a first anode connection line connected with a third light emitting device of a same light emitting unit along the first direction is smaller than a length of a first anode connection line connected with a first light emitting device and a second light emitting device of the same light emitting unit along the first direction.

In an exemplary implementation mode, a length of a first anode connection line connected with any third light emitting device located in the edge region along the first direction is smaller than a length of a first anode connection line connected with any first light emitting device located in the edge region and a first anode connection line connected with any second light emitting device located in the edge region along the first direction.

In an exemplary implementation mode, the edge region accounts for about 3% to 8% of an area of the light transmitting display region, or a quantity of light emitting units included in the edge region is 5% to 10% of a quantity of light emitting units in the light transmitting display region.

In an exemplary implementation mode, a pixel circuit includes at least a capacitor and a plurality of transistors, the capacitor includes: a first electrode plate and a second electrode plate; the display panel includes a semiconductor layer, a first insulation layer, a first conductive layer, a second insulation layer, a second conductive layer, a third insulation layer, a third conductive layer, a fourth insulation layer, a fourth conductive layer, a first planarization layer, and a fifth conductive layer disposed sequentially on the base substrate; the semiconductor layer includes at least active layers of the plurality of transistors; the first conductive layer includes at least gate electrodes of a plurality of transistors and the first electrode plate of the capacitor, the second conductive layer includes at least the second electrode plate of the capacitor, the third conductive layer includes at least first electrodes and second electrodes of the plurality of transistors and the first connection line, the fourth conductive layer includes at least a first anode connection line, the first sub-high-voltage power supply line, and the third high-voltage power supply line, and the fifth conductive layer includes at least the data signal line, the first high-voltage power supply line, the second sub-high-voltage power supply line, and the second connection line.

In an exemplary implementation mode, the pixel circuit includes: a writing transistor connected with the data signal line, and the second electrode plate of the capacitor located in the third region includes: a capacitor main body portion and an auxiliary capacitor portion connected with each other, a shape of the capacitor main body portion is substantially the same as that of the second electrode plate of the capacitor located in the first region and the second region; an orthographic projection of the auxiliary capacitor portion on the base substrate is at least partially overlapped with an orthographic projection of an active layer of the writing transistor on the base substrate.

In an exemplary implementation mode, the third conductive layer further includes: a data connection block, an orthographic projection of the data connection block on the base substrate is at least partially overlapped with orthographic projections of the auxiliary capacitor portion and the second connection line on the base substrate; the data connection block is respectively connected with the first connection line and the second connection line.

In an exemplary implementation mode, the data connection block and a second data connection portion are located on a same side of a first data connection portion and are electrically connected with the first data connection portion; an orthographic projection of the first data connection portion on the base substrate is at least partially overlapped with an orthographic projection of the second electrode plate of the capacitor on the base substrate.

In an exemplary implementation mode, the pixel circuit further includes: a first light emitting transistor and a second light emitting transistor, the first light emitting transistor is connected with a high-voltage power supply line and the second light emitting transistor is connected with an anode of a light emitting device; the fourth conductive layer further includes: a first connection electrode, a second connection electrode, a third connection electrode, and a fourth connection electrode; the first connection electrode has an orthographic projection on the base substrate which is at least partially overlapped with an orthographic projection of a first electrode of a writing transistor of at least one circuit unit located in the first region to the third region on the base substrate, and is electrically connected with the first electrode of the writing transistor of the at least one circuit unit located in the first region to the third region, the second connection electrode has an orthographic projection on the base substrate which is at least partially overlapped with an orthographic projection of a second electrode of a second light emitting transistor in at least one circuit located in the first region to the third region on the base substrate, and is electrically connected with the second electrode of the second light emitting transistor in the at least one circuit located in the first region to the third region, the third connection electrode has an orthographic projection on the base substrate which is at least partially overlapped with an orthographic projection of a first electrode of a first light emitting transistor in at least one circuit unit located in the first region on the base substrate, and is connected with the first electrode of the first light emitting transistor in the at least one circuit unit located in the first region, an orthographic projection of the fourth connection electrode on the base substrate is at least partially overlapped with an orthographic projection of a data connection block on the base substrate, and is at least partially overlapped with the orthographic projection of the data connection block on the base substrate.

In an exemplary implementation mode, the fifth conductive layer further includes: a fifth connection electrode, the fifth connection electrode has an orthographic projection on the base substrate which is at least partially overlapped with the orthographic projection of the second connection electrode on the base substrate, and is connected with the second connection electrode.

In an exemplary implementation mode, orthographic projections of a plurality of first anode connection lines on the base substrate are at least partially overlapped with orthographic projections of the second electrode plate of the capacitor and an anode of a connected light emitting device on the base substrate.

In an exemplary implementation mode, the data signal line has an orthographic projection on the base substrate that is at least partially overlapped with the orthographic projection of the first connection electrode on the base substrate and is connected with the first connection electrode, the first high-voltage power supply line has an orthographic projection on the base substrate that is at least partially overlapped with the orthographic projection of the third connection electrode on the base substrate and is connected with the third connection electrode, and the second connection line has an orthographic projection on the base substrate that is at least partially overlapped with the orthographic projection of the fourth connection electrode on the base substrate and is connected with the fourth connection electrode.

In an exemplary implementation mode, further including a transparent conductive layer located on a side of a second planarization layer away from the base substrate, the transparent conductive layer includes a second anode connection line, the second anode connection line has an orthographic projection on the base substrate that is at least partially overlapped with the orthographic projection of the fifth connection electrode on the base substrate, and is connected with the fifth connection electrode.

In a second aspect, the present disclosure also provides a display apparatus, including the above-described display panel and a photosensitive sensor, the photosensitive sensor is located in the light transmitting display region of the display panel.

After drawings and detailed description are read and understood, other aspects may be comprehended.

BRIEF DESCRIPTION OF DRAWINGS

The accompany drawings are used for providing further understanding of technical solutions of the present disclosure, constitute a part of the specification. The accompany drawings, together with embodiments of the present disclosure, are used for explaining the technical solutions of the present disclosure, and do not constitute limitations on the technical solutions of the present disclosure.

DETAILED DESCRIPTION

Figures 1, 2:
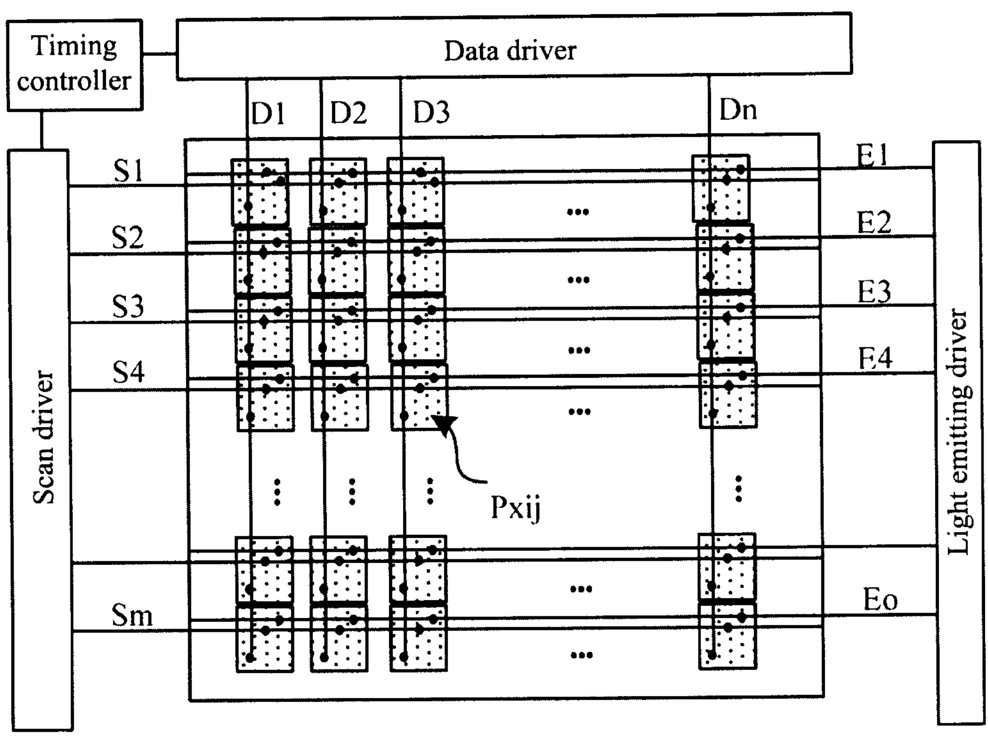
FIG. 1 is a schematic diagram of a structure of a display apparatus.
FIG. 2 is a schematic diagram of a structure of a display panel.

The embodiments of the present disclosure will be described below with reference to the drawings in detail. Implementation modes may be implemented in a plurality of different forms. Those of ordinary skills in the art may easily understand such a fact that modes and contents may be transformed into other forms without departing from the purpose and scope of the present disclosure. Therefore, the present disclosure should not be explained as being limited to contents recorded in following implementation modes only. The embodiments in the present disclosure and features in the embodiments may be randomly combined with each other in case of no conflict.

In the drawings, a size of one or more constituent elements, a thickness of a layer, or a region is sometimes exaggerated for clarity. Therefore, one mode of the present disclosure is not necessarily limited to the size, and a shape and a size of one or more components in the drawings do not reflect an actual scale. In addition, the accompanying drawings schematically illustrate ideal examples, and a mode of the present disclosure is not limited to shapes, numerical values, or the like shown in the drawings.

Ordinal numerals "first", "second", "third", etc., in the specification are set to avoid confusion of constituent elements, not to limit a quantity. In the present disclosure, "plurality represents two or more than two.

In the specification, for convenience, expressions "central", "above", "below", "front", "back", "vertical", "horizontal", "top", "bottom", "inside", "outside", etc., indicating orientations or positional relationships are used for illustrating positional relationships between constituent elements with reference to the drawings, only for convenience of describing the specification and simplifying the description, and do not indicate or imply that a referred apparatus or element must have a specific orientation and be structured and operated in the specific orientation, thus they cannot be understood as limitations on the present disclosure. The positional relationships between the constituent elements are changed as appropriate according to a direction where the constituent elements are described. Therefore, appropriate replacements may be made according to situations, not limited to the expressions in the specification.

In the specification, unless otherwise specified and defined, terms "mounting", "mutual connection", and "connection" should be generally understood. For example, it may be a fixed connection, a detachable connection, or an integrated connection; it may be a mechanical connection or a connection; it may be a direct connection, an indirect connection through a middleware, or internal communication inside two elements. Those of ordinary skills in the art may understand meanings of the above-mentioned terms in the present disclosure according to situations.

In the specification, an "electrical connection" includes a case that constituent elements are connected together through an element having some electrical function. The "element having some electrical function" is not particularly limited as long as electrical signals between the connected constituent elements may be transmitted. Examples of the "element having some electrical function" not only include an electrode and a wiring, but also include a switching element such as a transistor, a resistor, an inductor, a capacitor, another element with a plurality of functions, etc.

In the specification, a transistor refers to an element which at least includes three terminals, i.e., a gate, a drain, and a source. The transistor has a channel region between the drain (drain electrode terminal, drain region, or drain electrode) and the source (source electrode terminal, source region, or source electrode), and a current can flow through the drain, the channel region, and the source. In the specification, the channel region refers to a region through which a current mainly flows.

In the specification, a first electrode may be a drain and a second electrode may be a source, or, a first electrode may be a source and a second electrode may be a drain. In a case that transistors with opposite polarities are used, or in a case that a direction of a current is changed during operation of a circuit, or the like, functions of the "source" and the "drain" are sometimes interchangeable. Therefore, the "source" and the "drain" are interchangeable in the specification. In addition, the gate may also be referred to as a control electrode.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

A triangle, rectangle, trapezoid, pentagon, or hexagon, etc. in the specification is not strictly defined, and it may be an approximate triangle, rectangle, trapezoid, pentagon, or hexagon, etc. There may be some small deformations caused by tolerance, and there may be a chamfer, an arc edge, deformation, etc.

In the specification, "about" and "substantially" refer to that a boundary is not defined strictly and a case within a process and measurement error range is allowed. In the specification, "substantially the same" refers to a case where numerical values differ by less than 10%.

FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver, respectively. The data driver is respectively connected with a plurality of data signal lines (e.g., D1 to Dn), the scan driver is respectively connected with a plurality of scan signal lines (e.g., S1 to Sm), and the light emitting driver is respectively connected with a plurality of light emitting signal lines (e.g., E1 to Eo). Among them, n, m, and o may be natural numbers. The pixel array may include a plurality of sub-pixels Pxij, wherein i and j may be natural numbers. At least one sub-pixel Pxij may include a circuit unit and a light emitting device connected with the circuit unit. The circuit unit may at least include a pixel circuit which may be connected with a scan signal line, a light emitting signal line, and a data signal line, respectively.

In an exemplary implementation mode, the timing controller may provide a grayscale value and a control signal suitable for a specification of the data signal driver to the data signal driver, may provide a clock signal, a scan start signal, etc. suitable for a specification of the scan driver to the scan driver, and may provide a clock signal, an emission stop signal, etc. suitable for a specification of the light emitting driver to the light emitting driver. The data driver may generate a data voltage to be provided to the data signal lines D1, D2, D3, . . . , and Dn using the grayscale value and the control signal that are received from the timing controller. For example, the data driver may sample the gray scale value by using a clock signal, and apply a data voltage corresponding to the gray scale value to the data signal lines D1 to Dn by taking a pixel row as a unit. The scan driver may generate a scan signal to be provided to the scan signal lines S1, S2, S3, . . . , and Sm by receiving the clock signal and the scan start signal from the timing controller. For example, the scan driver may sequentially provide a scan signal with an on-level pulse to the scan signal lines S1 to Sm. For example, the scan driver may be constructed in a form of a shift register, and may generate a scan signal in a manner of sequentially transmitting a scan start signal provided in a form of an on-level pulse to a next-stage circuit under control of a clock signal. The light emitting driver may generate a light emitting control signal to be provided to the light emitting signal lines E1, E2, E3, . . . , and Eo by receiving the clock signal, the emission stop signal, etc. from the timing controller. For example, the light emitting driver may sequentially provide an emission signal with an off-level pulse to the light emitting signal lines E1 to Eo. For example, the light emitting driver may be constructed in a form of a shift register and generate a light emitting control signal in a manner of sequentially transmitting an emission stop signal provided in a form of an off-level pulse to a next-stage circuit under control of a clock signal.

FIG. 2 is a schematic diagram of a structure of a display panel. As shown in FIG. 2, the display panel may include a display region 100, a bonding region 200 located on one side of the display region 100, and a bezel region 300 located on another side of the display region 100. In some examples, the display region 100 may be a planar region including a plurality of sub-pixels Pxij that form a pixel array, the plurality of sub-pixels Pxij may be configured to display a dynamic picture or a static image, and the display region 100 may be referred to as an Active Area (AA). In some examples, the display panel may be a flexible substrate, and accordingly the display panel may be deformable, for example, may be crimped, bent, folded, or curled.

In an exemplary implementation mode, the bonding region 200 may include a fanout region, a bending region, a drive chip region, and a bonding pin region that are disposed sequentially along a direction away from the display region 100. The fanout region is connected to the display region 100, and the fanout region leads signal lines of an integrated circuit and a bonding pad in the bonding region into the display region which is relatively wide in a fanout trace manner. The fanout region includes at least a data fanout line, and a plurality of data fanout lines are configured to connect data signal lines of the display region 100 in a fanout trace manner and extend to the bending region. The bending region is connected to the fanout region and may include a composite insulation layer provided with a groove, and is configured to enable the drive chip region and the bonding pin region to be bent to a back of the display region 100. An Integrated Circuit (IC) may be disposed in the drive chip region, and the integrated circuit may be configured to be connected with the plurality of data fanout lines. The bonding pin region may include a bonding pad, and the bonding pad may be configured to be bonded and connected with an external Flexible Printed Circuit (FPC). In an exemplary implementation mode, the bezel region 300 may include a circuit region, a power supply line region, and a crack dam region, and a cutting region which are sequentially disposed along the direction away from the display region 100. The circuit region is connected to the display region 100 and may include at least a gate drive circuit, the gate drive circuit is connected with the scan signal line, the reset signal line, and the light emitting signal line that are connected with the pixel circuit in the display region 100. The power supply line region is connected to the circuit region and may at least include a bezel power supply lead line that extends along a direction parallel to an edge of the display region and is connected with a cathode in the display region 100. The crack dam region is connected to the power supply line region and may at least include a plurality of cracks disposed on the composite insulation layer. The cutting region is connected to the crack dam region and may at least include a cutting groove disposed on the composite insulation layer, and the cutting groove is configured such that a cutting device cuts along the cutting groove respectively after preparation of all film layers of the display panel are completed.

In an exemplary implementation mode, the fanout region in the bonding region 200 and the power supply line region in the bezel region 300 may be provided with a first dam spacer and a second dam spacer, the first dam spacer and the second dam spacer may extend along the direction parallel to the edge of the display region 100, thus forming an annular structure surrounding the display region 100. The edge of the display region is an edge of the display region 100 on a side close to the bonding region 200 or the bezel region 300.

Figure 3:
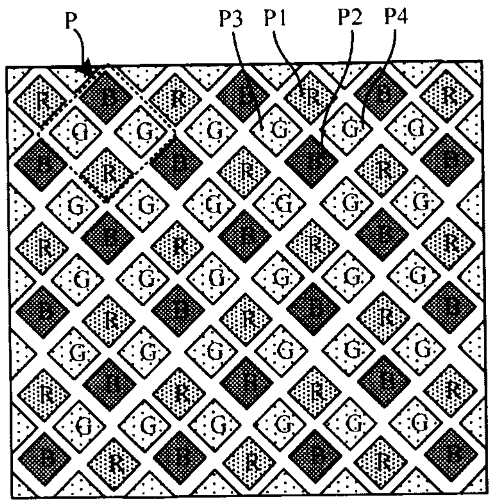
FIG. 3 is a schematic diagram of a planar structure of a display region in a display panel.

FIG. 3 is a schematic diagram of a planar structure of a display region in a display panel. As shown in FIG. 3, the display panel may include a plurality of pixel units P arranged in a matrix. At least one pixel unit P may include a first sub-pixel P1 emitting light of a first color, a second sub-pixel P2 emitting light of a second color, and a third sub-pixel P3 and a fourth sub-pixel P4 emitting light of a third color. Each sub-pixel may include a circuit unit and a light emitting device, the circuit unit may at least include a pixel circuit which is connected with a scan signal line, a data signal line, and a light emitting signal line respectively, and the pixel circuit may be configured to receive a data voltage transmitted by the data signal line and output a corresponding current to the light emitting device under control of the scan signal line and the light emitting signal line. The light emitting device in each sub-pixel is connected with a pixel circuit of the sub-pixel where the light emitting device is located, and the light emitting device is configured to emit light with corresponding brightness in response to a current output by the pixel circuit of the sub-pixel where the light emitting device is located.

In an exemplary implementation mode, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In some examples, a shape of a light emitting device of a sub-pixel may be a rectangle, a diamond, a pentagon, or a hexagon. Light emitting devices of four sub-pixels may be arranged in a diamond-shaped manner to form an RGBG pixel arrangement. In another exemplary embodiment, the light emitting devices of the four sub-pixels may be arranged side by side horizontally, side by side vertically, or in a manner to form a square, etc., which is not limited here in the present disclosure.

In an exemplary implementation mode, a pixel unit may include three sub-pixels, and light emitting devices of the three sub-pixels may be arranged side by side horizontally, side by side vertically, or in a manner like a Chinese character "品", which is not limited here in the present disclosure.

In an exemplary implementation mode, in a direction perpendicular to the display panel, the display panel may include a base substrate, and a drive circuit layer, a light emitting structure layer, and an encapsulation structure layer sequentially disposed on the base substrate. In some possible implementation modes, the display substrate may include another film layer, such as a touch structure layer, which is not limited in the present disclosure.

In an exemplary implementation mode, the base substrate may be a flexible base substrate, or may be a rigid base substrate. The drive circuit layer of each sub-pixel may include a pixel circuit composed of a plurality of transistors and a capacitor. The light emitting structure layer of each sub-pixel may at least include an anode, a pixel definition layer, an organic emitting layer, and a cathode. The anode is connected with the pixel circuit, the organic emitting layer is connected with the anode, the cathode is connected with the organic emitting layer, and the organic emitting layer emits light of a corresponding color under drive of the anode and the cathode. The encapsulation structure layer may include a first encapsulation layer, a second encapsulation layer, and a third encapsulation layer that are stacked. The first encapsulation layer and the third encapsulation layer may be made of an inorganic material, the second encapsulation layer may be made of an organic material, and the second encapsulation layer is disposed between the first encapsulation layer and the third encapsulation layer to form a laminated structure of an inorganic material/an organic material/an inorganic material, which may ensure that external water vapor cannot enter the light emitting structure layer.

In an exemplary implementation mode, the organic emitting layer may include an Emitting Layer (EL), and any one or more of following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In some examples, one or more layers of hole injection layers, hole transport layers, electron block layers, hole block layers, electron transport layers, and electron injection layers of all sub-pixels may be respectively connected together to be a common layer. Emitting layers of adjacent sub-pixels may be overlapped slightly, or may be mutually isolated.

Figure 4A:
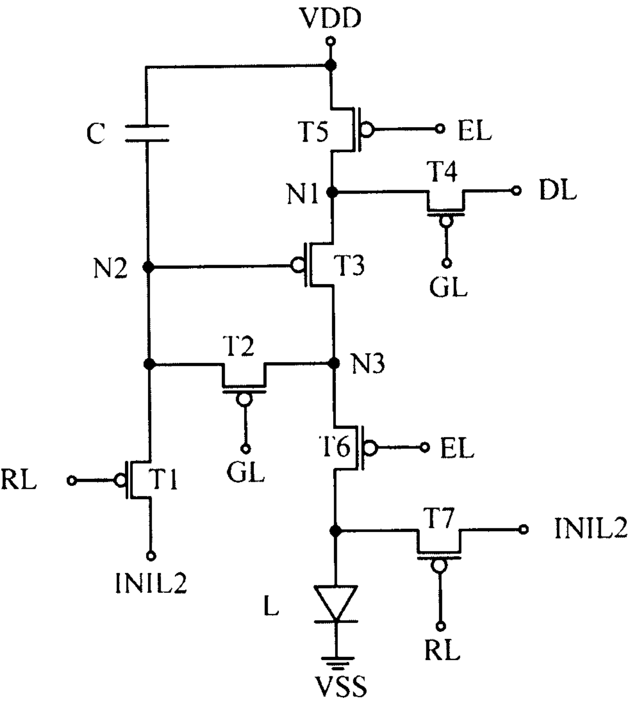
FIG. 4A is a schematic diagram of an equivalent circuit of a pixel circuit.

FIG. 4A is a schematic diagram of an equivalent circuit of a pixel circuit. In an exemplary implementation mode, the pixel circuit may have a structure of 3TIC, 4TIC, 5TIC, 5T2C, 6TIC, 7TIC, or 8TIC. The pixel circuit of an exemplary embodiment is described by taking a 7T1C structure as an example. However, the embodiment is not limited thereto.

In an exemplary implementation mode, as shown in FIG. 4A, the pixel circuit according to the example may include seven transistors (i.e., a first transistor T1 to a seventh transistor T7) and one capacitor C. The pixel circuit is respectively connected with eight signal lines (including, for example, a data signal line DL, a scan signal line GL, a reset signal line RL, a light emitting signal line EL, a first initial signal line INIL1, a second initial signal line INIL2, a high-voltage power supply line VDD, and a low-voltage power supply line VSS).

In an exemplary implementation mode, the seven transistors of the pixel circuit may be P-type transistors, or may be N-type transistors. Adopting a same type of transistors in the pixel circuit may simplify a process flow, reduce process difficulties of the display panel, and improve a yield of products. In some possible implementation modes, the seven transistors in the pixel circuit may include a P-type transistor and an N-type transistor.

In an exemplary implementation mode, for the seven transistors in the pixel circuit, a low temperature poly silicon thin film transistor may be adopted, or an oxide thin film transistor may be adopted, or a low temperature poly silicon thin film transistor and an oxide thin film transistor may be adopted. An active layer of a low temperature poly silicon thin film transistor is made of Low Temperature Poly Silicon (LTPS), and an active layer of an oxide thin film transistor is made of an oxide semiconductor (Oxide). The low temperature poly silicon thin film transistor has advantages such as a high migration rate and fast charging, and the oxide thin film transistor has advantages such as a low leakage current. The low temperature poly silicon thin film transistor and the oxide thin film transistor are integrated on one display panel, that is, an LTPS+Oxide (LTPO for short) display panel, so that advantages of both the low temperature poly silicon thin film transistor and the oxide thin film transistor may be utilized, low-frequency drive may be achieved, power consumption may be reduced, and display quality may be improved.

In an exemplary implementation mode, the high-voltage power supply line VDD may be configured to provide a constant first voltage signal to the pixel circuit, and the low-voltage power supply line VSS may be configured to provide a constant second voltage signal to the pixel circuit, and the first voltage signal is greater than the second voltage signal. The scan signal line GL may be configured to provide a scan signal to the pixel circuit, the data signal line DL may be configured to provide a data signal to the pixel circuit, and the light emitting signal line EL may be configured to provide a light emitting control signal to the pixel circuit. In some examples, in a pixel circuit of an n-th row, the reset signal line RL may be electrically connected with a scan signal line GL of a pixel circuit of an (n-1)-th row to be inputted with a scan signal. Herein, n is an integer greater than 0. In this way, signal lines of the display panel may be reduced, and a narrow bezel design of the display panel may be achieved. However, the embodiment is not limited thereto.

In an exemplary implementation mode, the first initial signal line INIL1 may be configured to provide a first initial signal to the pixel circuit, the second initial signal line INIL2 may be configured to provide a second initial signal to the pixel circuit. For example, the first initial signal may be different from the second initial signal. The first initial signal and the second initial signal may be constant voltage signals, and their magnitude may be between, for example, the first voltage signal provided by the high-voltage power supply line VDD and the second voltage signal provided by the low-voltage power supply line VSS, but are not limited thereto. In other examples, the first initial signal and the second initial signal may be the same and only the first initial signal line may be provided to provide the first initial signal.

In an exemplary implementation mode, as shown in FIG. 4A, a gate of the first transistor T1 is electrically connected with the reset signal line RL, a first electrode of the first transistor T1 is electrically connected with the first initial signal line INIL1, and a second electrode of the first transistor T1 is electrically connected with a gate of the third transistor T3. A gate of the second transistor T2 is electrically connected with the scan signal line GL, a first electrode of the second transistor T2 is electrically connected with the gate of the third transistor T3, and a second electrode of the second transistor T2 is electrically connected with a second electrode of the third transistor T3. The gate of the third transistor T3 is connected with a first node N1, a first electrode of the third transistor T3 is connected with a second node N2, and the second electrode of the third transistor T3 is connected with a third node N3. The third transistor T3 may be referred to as a drive transistor, and the third transistor T3 determines an amount of a drive current flowing between the high-voltage power supply line VDD and the low-voltage power supply line VSS according to a potential difference between the gate and the first electrode of the third transistor T3. A gate of the fourth transistor T4 is electrically connected with the scan signal line GL, a first electrode of the fourth transistor T4 is electrically connected with the data signal line DL, and a second electrode of the fourth transistor T4 is electrically connected with the first electrode of the third transistor T3. The fourth transistor may be referred to as a writing transistor. A gate of the fifth transistor T5 is electrically connected with the light emitting signal line EL, a first electrode of the fifth transistor T5 is electrically connected with the high-voltage power supply line VDD, and a second electrode of the fifth transistor T5 is electrically connected with the first electrode of the third transistor T3. The fifth transistor may be referred to as a first light emitting transistor. A gate of a sixth transistor T6 is electrically connected with the light emitting signal line EL, a first electrode of the sixth transistor T6 is electrically connected with the second electrode of the third transistor T3, and a second electrode of the sixth transistor T6 is electrically connected with an anode of a light emitting device L. The sixth transistor T6 may be referred to as a second light emitting transistor. A gate of the seventh transistor T7 is electrically connected with the reset signal line RL, a first electrode of the seventh transistor T7 is electrically connected with the second initial signal line INIL2, and a second electrode of the seventh transistor T7 is electrically connected with the anode of the light emitting device L. A first electrode plate of the capacitor C is electrically connected with the gate of the third transistor T3, and a second electrode plate of the capacitor C is electrically connected with the high-voltage power supply line VDD.

In the example, the first node N1 is a connection point of the capacitor C, the first transistor T1, the third transistor T3, and the second transistor T2, the second node N2 is a connection point of the fifth transistor T5, the fourth transistor T4, and the third transistor T3, the third node N3 is a connection point of the third transistor T3, the second transistor T2, and the sixth transistor T6, and the fourth node N4 is a connection point of the sixth transistor T6, the seventh transistor T7, and the light emitting device L.

In an exemplary implementation mode, the light emitting device L may be an OLED including a first electrode (anode), an organic emitting layer, and a second electrode (cathode) which are stacked, or may be a QLED including a first electrode (anode), a quantum dot emitting layer, and a second electrode (cathode) which are stacked. A second electrode of the light emitting device is connected with the low-voltage power supply line VSS, a signal of the low-voltage power supply line VSS is a continuously provided low-level signal, and a signal of the high-voltage power supply line VDD is a continuously provided high-level signal.

Figure 4B:
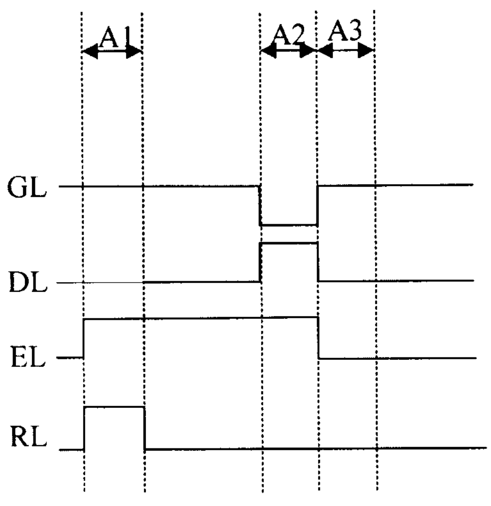
FIG. 4B is a working timing diagram of a pixel circuit.

In an exemplary implementation mode, FIG. 4B is a working timing diagram of a pixel circuit, as shown in FIGS. 4A and 4B, taking a case in which the first transistor T1 to the seventh transistor T7 included in the pixel circuit are all P-type transistors as an example, a working process of the pixel circuit may include following stages.

A first stage A1 is referred to as a reset stage. A low-level signal provided by the reset signal line RL enables the first transistor T1 to be turned on, and a first initial signal provided by the first initial signal line INIL1 is provided to the first node N1 to initialize the first node N1 and clear an original data voltage in the capacitor C. The scan signal line GL provides a high-level signal and the light emitting signal line EL provides a high-level signal, so that the fourth transistor T4, the second transistor T2, the fifth transistor T5, the sixth transistor T6, and the seventh transistor T7 are turned off. The light emitting device L does not emit light in this stage.

A second stage A2 is referred to as a data writing stage or a threshold compensation stage. The scan signal line GL provides a low-level signal, the reset signal line RL and the light emitting signal line EL both provide high-level signals, and the data signal line DL outputs a data signal DATA. In this stage, since the first electrode plate of the capacitor C is at a low level, the third transistor T3 is turned on. The scan signal line GL provides the low-level signal, so that the second transistor T2, the fourth transistor T4, and the seventh transistor T7 are turned on. The second transistor T2 and the fourth transistor T4 are turned on, so that a data voltage Vdata output by the data signal line DL is provided to the first node N1 through the second node N2, the turned-on third transistor T3, the third node N3, and the turned-on second transistor T2, and the capacitor C is charged with a difference between the data voltage Vdata output by the data signal line DL and a threshold voltage of the third transistor T3. A voltage of the first electrode plate (i.e., the first node N1) of the capacitor C is Vdata−|Vth|, wherein Vdata is the data voltage output by the data signal line DL, and Vth is the threshold voltage of the third transistor T3. The seventh transistor T7 is turned on, so that a second initial signal provided by the second initial signal line INIL2 is provided to the anode of the light emitting device L to initialize (reset) the anode of the light emitting device L and clear a pre-stored voltage therein, so as to complete initialization, thereby ensuring that the light emitting device L does not emit light. The reset signal line RL provides a high-level signal, so that the first transistor T1 is turned off. The light emitting signal line EL provides a high-level signal, so that the fifth transistor T5 and the sixth transistor T6 are turned off.

A third stage A3 is referred to as a light emitting stage. The light emitting signal line EL provides a low-level signal, and the scan signal line GL and the reset signal line RL both provide high-level signals. The light emitting signal line EL provides the low-level signal, so that the fifth transistor T5 and the sixth transistor T6 are turned on, and a first voltage signal output by the high-voltage power supply line VDD provides a drive voltage to the anode of the light emitting device L through the turned-on fifth transistor T5, the third transistor T3, and the sixth transistor T6 to drive the light emitting device L to emit light.

In a drive process of the pixel circuit, a drive current flowing through the third transistor T3 (i.e., the drive transistor) is determined by a voltage difference between the gate and the first electrode of the third transistor T3. Since the voltage of the first node N1 is Vdata−|Vth|, the drive current of the third transistor T3 is as follows.

$$I = K \times (Vgs - Vth)^2 = K \times [(Vdd - Vdata + |Vth|) - Vth]^2 = K \times [Vdd - Vdata]^2$$

Herein, I is the drive current flowing through the third transistor T3, that is, a drive current for driving the light emitting device L, K is a constant, Vgs is the voltage difference between the gate and the first electrode of the third transistor T3, Vth is the threshold voltage of the third transistor T3, Vdata is the data voltage output by the data signal line DL, and Vdd is the first voltage signal output by the high-voltage power supply line VDD.

It may be seen from the above formula that a current flowing through the light emitting device L is independent of the threshold voltage of the third transistor T3. The pixel circuit of the embodiment may better compensate the threshold voltage of the third transistor T3.

With development of OLED display technologies, consumers have higher requirements for a display effect of a display product. An extremely narrow border has become a new trend in development of display products. Therefore, border narrowing or even a borderless design has attracted more and more attention in a design of an OLED display product. In a display panel, a bonding region generally includes a fanout region, a bending region, a drive chip region, and a bonding pin region sequentially disposed along a direction away from a display region. Since a width of the bonding region is smaller than a width of the display region, signal lines of an integrated circuit and a bonding pad in the bonding region need to pass through the fanout region before they can be led into the display region which is relatively wide in a fanout trace manner, the greater a width difference between the display region and the bonding region is, the more oblique fanout lines in a fan-shaped region is, the greater a distance between the drive chip region and the display region is, so the fan-shaped region occupies relatively large space, which makes it more difficult to make a narrowing design of a lower bezel, and the lower bezel is always maintained at about 2.0 mm.

In addition, a concept of a full-screen mobile phone has been widely concerned in the mobile phone market, and it is also a development direction of mobile phones in the future. In the full-screen mobile phone, a structure in which a camera is disposed in a display region (Full Display with Camera, FDC for short) is adopted, that is, a region where the camera is located will also be displayed. An FDC structure may allow a front visual region almost full of screen, thus making users get a better display effect.

An exemplary embodiment of the present disclosure provides a display panel, and a structure in which a data connection line is located in a display region (Fanout in AA, abbreviated as FIAA) is adopted. Ends of a plurality of data connection lines are correspondingly connected with a plurality of data signal lines in the display region, the other ends of the plurality of data connection lines extend to a bonding region and are correspondingly connected with an integrated circuit in the bonding region. Since the bonding region does not need to be provided with a fan-shaped oblique line, a width of a fanout region is reduced, and a width of a lower bezel is effectively reduced.

An exemplary embodiment of the present disclosure provides a display panel, including: a display region, the display region includes: a light transmitting display region and a conventional display region located on at least one side of the light transmitting display region, the conventional display region includes a first region, a second region, and a third region, at least one circuit unit of the first region is connected with a light emitting device in the light transmitting display region, at least one circuit unit of the third region includes a data connection line, a high-voltage power supply line located in the first region is a first high-voltage power supply line, a high-voltage power supply line located in the second region is a second high-voltage power supply line, and a high-voltage power supply line located in the third region is a third high-voltage power supply line; the second high-voltage power supply line includes a first sub-high-voltage power supply line and a second sub-high-voltage power supply line connected with each other, the second sub-high-voltage power supply line is located on a side of the first sub-high-voltage power supply line away from a base substrate, the first high-voltage power supply line and the second sub-high-voltage power supply line are disposed in a same layer, and the third high-voltage power supply line and the first sub-high-voltage power supply line are disposed in a same layer.

In an exemplary implementation mode, the display region includes the base substrate, and a drive circuit layer and a light emitting structure layer sequentially stacked on the base substrate, the drive circuit layer includes a plurality of circuit units, a plurality of data signal lines, a plurality of data connection lines, and a plurality of high-voltage power supply lines; the light emitting structure layer includes a plurality of light emitting devices, a circuit unit includes a pixel circuit, a data signal line is configured to provide a data signal to the pixel circuit, a high-voltage power supply line is configured to provide a high power supply voltage signal to the pixel circuit, and a data connection line is connected with the data signal line.

In an exemplary implementation mode, the base substrate may be a rigid base substrate or a flexible base substrate, wherein the rigid base substrate may be, but is not limited to, one or more of glass and metal foil; the flexible base substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fiber.

In an exemplary implementation mode, the light emitting structure layer may include a plurality of light emitting devices, and at least one light emitting device includes an anode, an organic emitting layer, and a cathode. A shape of the light emitting device may be any one or more of a triangle, a square, a rectangle, a diamond, a trapezoid, a parallelogram, a pentagon, a hexagon, and another polygon, which is not limited here in the present disclosure.

A display panel according to an embodiment of the present disclosure includes a display region, the display region includes a light transmitting display region and a conventional display region located on at least one side of the light transmitting display region, the conventional display region includes a first region, a second region, and a third region, at least one circuit unit of the first region is connected with a light emitting device in the light transmitting display region, at least one circuit unit of the third region includes a data connection line, a high-voltage power supply line located in the first region is a first high-voltage power supply line, a high-voltage power supply line located in the second region is a second high-voltage power supply line, and a high-voltage power supply located line located in the third region is a third high-voltage power supply line; the second high-voltage power supply line includes a first sub-high-voltage power supply line and a second sub-high-voltage power supply line connected with each other, the second sub-high-voltage power supply line is located on a side of the first sub-high-voltage power supply line away from a base substrate, the first high-voltage power supply line is disposed in a same layer as the second sub-high-voltage power supply line, and the third high-voltage power supply line is disposed in a same layer as the first sub-high-voltage power supply line. In the embodiment of the present disclosure, by disposing different high-voltage power supply lines in different regions of the conventional display region, compatibility of a FIAA structure and an FDC structure is achieved while ensuring a display effect.

In an exemplary implementation mode, the data connection line includes: a first connection line and a second connection line extending along a second direction which are connected with each other, the first connection line is located on a side of the third high-voltage power supply line close to the base substrate, and the second connection line and the first high-voltage power supply line are disposed in a same layer; an orthographic projection of the first connection line on the base substrate is at least partially overlapped with an orthographic projection of a data signal line on the base substrate, and an orthographic projection of the second connection line on the base substrate is at least partially overlapped with an orthographic projection of the third high-voltage power supply line on the base substrate.

In an exemplary implementation mode, the first connection line includes: a first data connection portion extending along the second direction and a second data connection portion extending along a first direction, the first data connection portion is connected with the second data connection portion and the second connection line, respectively, and the first direction and the second direction intersect; an orthographic projection of the first data connection portion on the base substrate is at least partially overlapped with the orthographic projection of the data signal line on the base substrate.

In the present disclosure, "A extends along a B direction" means that A may include a main portion and a secondary portion connected with the main portion, the main portion is a line, a line segment, or a strip-shaped body, the main portion extends along the B direction, and a length of the main portion extending along the B direction is greater than a length of the secondary portion extending along another direction. In following description, "A extends along a B direction" means "a main body portion of A extends along a B direction". In an exemplary implementation mode, a second direction Y may be a direction pointing to a bonding region from a display region, and an opposite direction of the second direction Y may be a direction pointing to the display region from the bonding region.

Figure 5A:
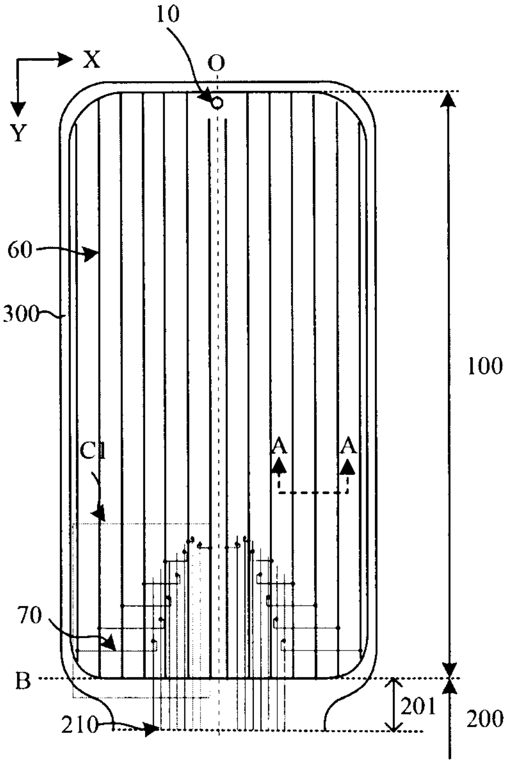
FIG. 5A is a schematic diagram of a planar structure of a display panel according to an exemplary embodiment of the present disclosure.
Figure 5B:
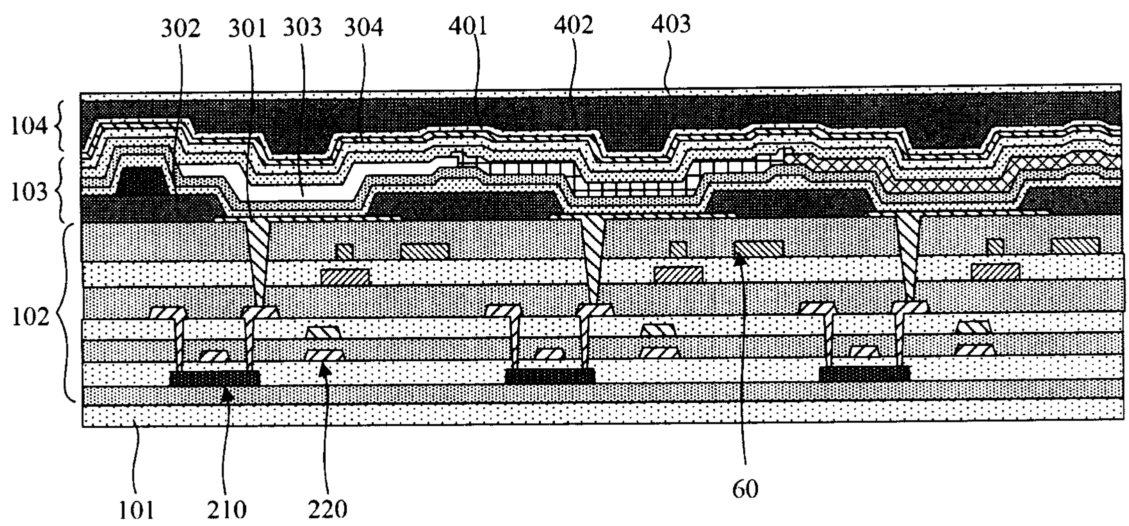
FIG. 5B is a sectional view taken along an A-A direction in FIG. 5A.

FIG. 5A is a schematic diagram of a planar structure of a display panel according to an exemplary embodiment of the present disclosure and FIG. 5B is a sectional view taken along an A-A direction in FIG. 5A. As shown in FIG. 5A to FIG. 5B, on a plane perpendicular to the display panel, the display panel may include a drive circuit layer 102 disposed on a base substrate 101, a light emitting structure layer 103 disposed on a side of the drive circuit layer 102 away from the base substrate, and an encapsulation structure layer 104 disposed on a side of the light emitting structure layer 103 away from the base substrate. On a plane parallel to the display panel, the display panel may at least include a display region 100, a bonding region 200 located on a side of the display region 100 in the second direction Y, and a bezel region 300 located on another side of the display region 100. In an exemplary implementation mode, the drive circuit layer of the display region 100 may include a plurality of circuit units constituting a plurality of unit rows and a plurality of unit columns, at least one circuit unit may include a pixel circuit, and the pixel circuit is configured to output a corresponding current to a connected light emitting device. The light emitting structure layer of the display region 100 may include a plurality of sub-pixels constituting a pixel array, at least one sub-pixel may include a light emitting device, the light emitting device is connected with a pixel circuit of a corresponding circuit unit, and the light emitting device is configured to emit light with corresponding brightness in response to a current outputted by the connected pixel circuit.

In an exemplary implementation mode, the drive circuit layer 102 of each sub-pixel may include a plurality of transistors and a storage capacitor, which constitute a pixel circuit. In FIG. 5B, only one transistor 210 and one storage capacitor 220 are taken as an example. The light emitting structure layer 103 may include an anode 301, a pixel definition layer 302, an organic emitting layer 303, and a cathode 304, the anode 301 is connected with a drain electrode of the transistor 210 through a via, the organic emitting layer 303 is connected with the anode 301, the cathode 304 is connected with the organic emitting layer 303, and the organic emitting layer 303 emits light of a corresponding color under drive of the anode 301 and the cathode 304. The encapsulation structure layer 104 may include a first encapsulation layer 401, a second encapsulation layer 402, and a third encapsulation layer 403 which are stacked, the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, which may ensure that external water vapor cannot enter the light emitting structure layer 103.

In an exemplary implementation mode, the base substrate may be a flexible base substrate, or may be a rigid base substrate. In an exemplary implementation mode, the rigid base substrate may be made of a material such as glass or quartz, the flexible base substrate may be made of a material such as Polyimide (PI), the flexible base substrate may be of a single-layer structure, or may be of a laminated structure formed by an inorganic material layer and a flexible material layer, which is not limited in the present disclosure.

In an exemplary implementation mode, as shown in FIG. 5A, the drive circuit layer of the display region 100 may further include a plurality of data signal lines 60 and a plurality of data connection lines 70, at least one data signal line 60 is connected with a plurality of pixel circuits in a unit column, the data signal line 60 is configured to provide a data signal to the connected pixel circuits, at least one data connection line 70 is correspondingly connected with the data signal line 60, and the data connection line 70 is configured such that the data signal line 60 is correspondingly connected with a leading out line 210 in the bonding region 200 through the data connection line 70.

In an exemplary implementation mode, a sub-pixel mentioned in the present disclosure refers to a region divided according to a light emitting device, and a circuit unit mentioned in the present disclosure refers to a region divided according to a pixel circuit. In an exemplary implementation mode, a position of an orthographic projection of the sub-pixel on the base substrate may correspond to a position of an orthographic projection of the circuit unit on the base substrate, or a position of an orthographic projection of the sub-pixel on the base substrate may not correspond to a position of an orthographic projection of the circuit unit on the base substrate.

In an exemplary implementation mode, a plurality of circuit units sequentially disposed along the first direction X may be referred to as a unit row, and a plurality of circuit units sequentially disposed along the second direction Y may be referred to as a unit column. A plurality of unit rows and a plurality of unit columns constitute a circuit unit array arranged in an array, and the first direction X and the second direction Y intersect. In an exemplary implementation mode, the second direction Y may be an extension direction (vertical direction) of a data signal line, and the first direction X may be perpendicular to the second direction Y (horizontal direction).

In an exemplary implementation mode, a circuit unit located in the first region, the second region, and the third region may include a drive circuit unit and a dummy circuit unit, a pixel circuit in the drive circuit unit may be configured to drive a light emitting device to emit light, a pixel circuit in the dummy circuit unit will not be configured to drive a light emitting device to emit light, to ensure display uniformity of the display panel that is set. The dummy circuit unit may be disposed between drive circuit units.

In an exemplary implementation mode, the bonding region 200 may include at least a lead region 201, a bending region, and a drive chip region which are sequentially disposed along a direction away from the display region, the lead region 201 is connected to the display region 100, the bending region is connected to the lead region 201, and the drive chip region is connected to the bending region. The lead region 201 may be provided with a plurality of leading out lines 210, the plurality of leading out lines 210 may extend along the second direction Y, first ends of the plurality of leading out lines 210 are connected with an integrated circuit of a composite circuit region, and second ends of the plurality of leading out lines 210 cross the bending region to extend to the lead region 201 and then are correspondingly connected with a data connection line 70, so that the integrated circuit applies a data signal to the data signal line through a leading out line and a data connection line. Since the data connection line is disposed in the display region, a length of the lead region in the second direction Y may be effectively reduced, a width of a lower bezel is greatly shortened, and a screen-to-body ratio is increased, which is beneficial to achieve full-screen display.

In an exemplary implementation mode, the plurality of data signal lines disposed in the display region 100 may have a shape of a line extending along the second direction Y, the plurality of data connection lines 70 disposed in the display region 100 may have a shape of a broken line, a data connection line 70 may include a first connection line extending along the first direction X and a second connection line extending along the second direction Y partially, first ends of a plurality of first connection lines (first ends of data connection lines 70) are correspondingly connected with a plurality of data signal lines 60 through connection holes, second ends of the plurality of first connection lines extend along the first direction X or an opposite direction of the first direction X and then are connected with a first end of the second connection line, and second ends of a plurality of second connection lines (second ends of the plurality of data connection lines 70) extend toward a direction of the bonding region 200 and cross a boundary B of the display region, and are correspondingly connected with the plurality of leading out lines 210 of the lead region 201. In an exemplary implementation mode, the boundary B of the display region may be a junction of the display region 100 and the bonding region 200.

In an exemplary implementation mode, a data connection line 70 and a leading out line 210 may be connected directly or may be connected through a via, which is not limited here in the present disclosure.

In an exemplary implementation mode, a plurality of second connection lines may be disposed parallel to a data signal line 60.

In an exemplary implementation mode, pitches between adjacent second connection lines in the first direction X may be substantially the same, and pitches between adjacent first connection lines in the second direction Y may be substantially the same, which is not limited here in the present disclosure.

In an exemplary implementation mode, the display region 100 may have a center line O, wherein a plurality of data signal lines 60 and a plurality of data connection lines 70 in the display region 100, and a plurality of leading out lines 210 in the lead region 201 may be symmetrically disposed with respect to the center line O, and the center line O may be a straight line bisecting a plurality of unit columns of the display region 100 and extending along the second direction Y.

Figure 5C:
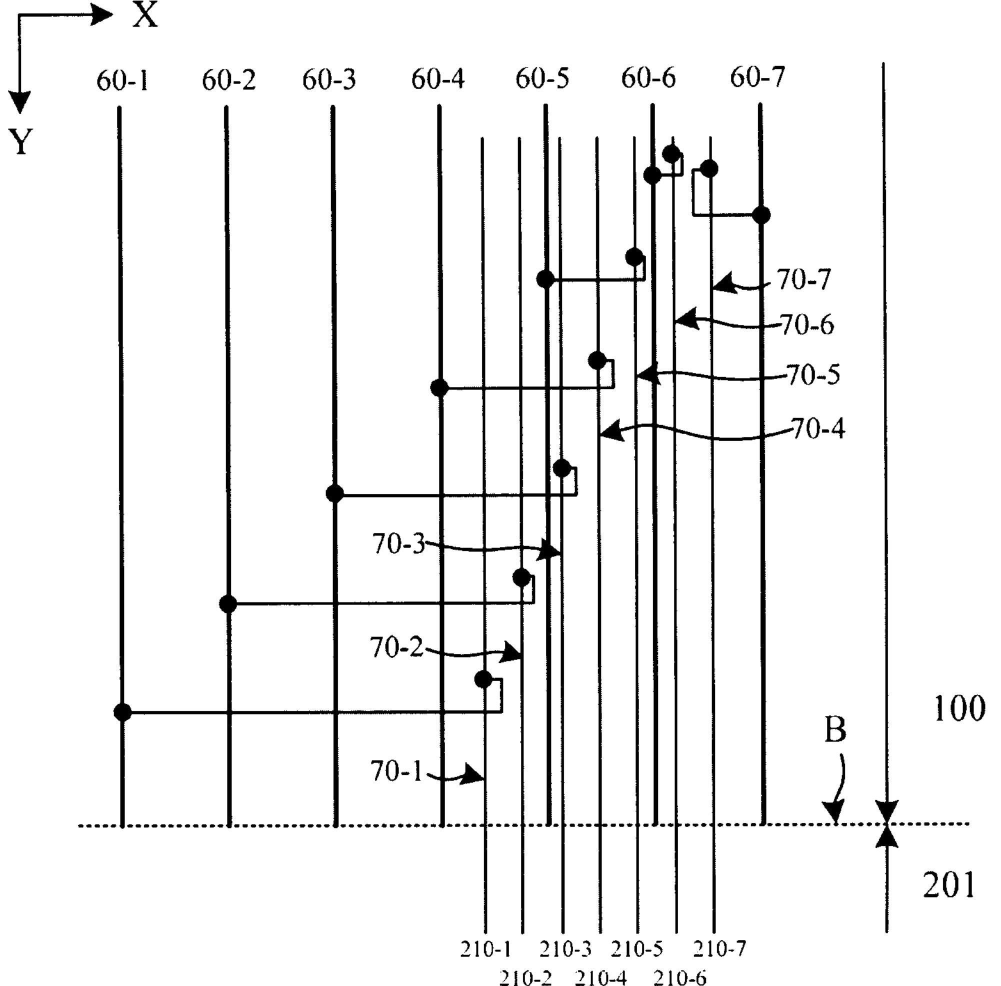
FIG. 5C is a schematic diagram of an arrangement of data connection lines according to an exemplary embodiment of the present disclosure.

FIG. 5C is a schematic diagram of an arrangement of data connection lines according to an exemplary embodiment of the present disclosure, and is an enlarged view of a C1 region in FIG. 5A, which illustrates a structure of 7 data signal lines, 7 data connection lines, and 7 leading out lines. As shown in FIG. 5C, in an exemplary implementation mode, the plurality of data signal lines of the display region 100 may include a first data signal line 60-1 to a seventh data signal line 60-7, the plurality of data connection lines of the display region 100 may include a first data connection line 70-1 to a seventh data connection line 70-7, and the plurality of leading out lines of the lead region 201 may include a first leading out line 210-1 to a seventh leading out line 210-7.

In an exemplary implementation mode, the first data signal line 60-1 to the seventh data signal line 60-7, the first data connection line 70-1 to the seventh data connection line 70-7, and the first leading out line 210-1 to the seventh leading out line 210-7 may all be disposed sequentially along the first direction X. A first end of an i-th data connection line 70-*i* is connected with an i-th data signal line 60-*i* through a connection hole in the display region 100, and a second end of the i-th data connection line 70-*i*, after extending to the lead region 201, is connected with an i-th leading out line 210-*i*, i=1 to 7.

In an exemplary implementation mode, distances between a plurality of connection holes through which data connection lines 70 and data signal lines 60 are connected correspondingly and an edge B of the display region may be different. For example, a distance between a connection hole connecting the first data connection line 70-1 and the first data signal line 60-1, and the edge B of the display region may be smaller than a distance between a connection hole connecting the second data connection line 70-2 and the second data signal line 60-2, and the edge B of the display region. For another example, the distance between the connection hole connecting the second data connection line 70-2 and the second data signal line 60-2, and the edge B of the display region may be greater than a distance between a connection hole connecting the third data connection line 70-3 and the third data signal line 60-3, and the edge B of the display region.

Figure 6:
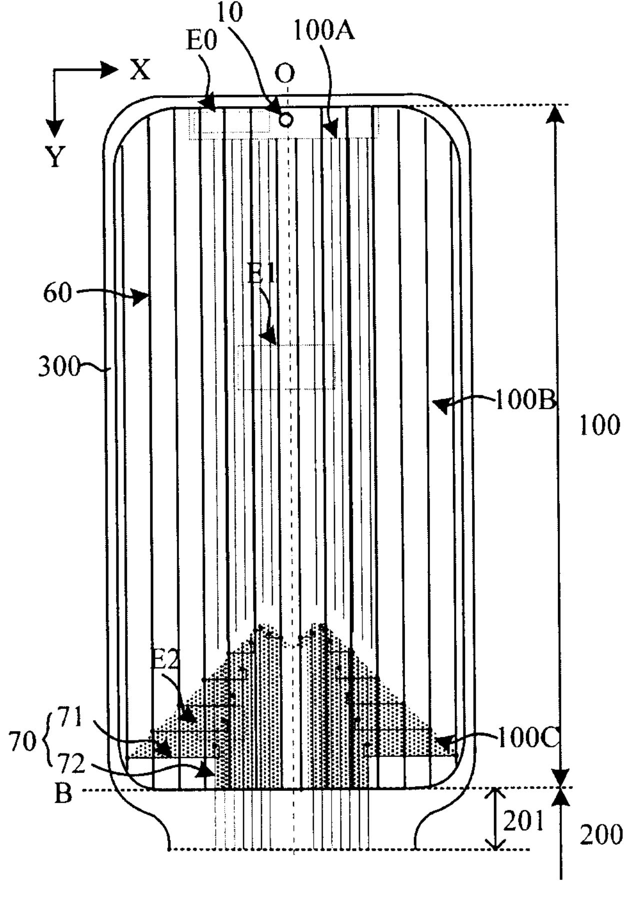
FIG. 6 is a schematic diagram of partition of a display region according to an exemplary embodiment of the present disclosure.

FIG. 6 is a schematic diagram of partition of a display region according to an exemplary embodiment of the present disclosure. As shown in FIG. 6, the display region includes a light transmitting display region 10 and a conventional display region, and the conventional display region includes a first region 100A, a second region 100B, and a third region 100C.

In an exemplary implementation mode, at least one circuit unit of the first region 100A is connected with a light emitting device in the light transmitting display region. The second region 100C is all regions of the conventional display region except the first region and the third region.

In an exemplary implementation mode, at least one circuit unit of the third region 100C includes a data connection line. The third region 100C may include a plurality of circuit units, and orthographic projections of pixel circuits in the plurality of circuit units of the third region 100C on a plane of the display panel are overlapped with an orthographic projection of a data connection line 70 on the plane of the display panel.

In an exemplary implementation mode, a filling region in FIG. 6 refers to a third region 100C where a data connection line is located, one portion of a data connection line 70 located in the third region 100C is located on a film layer that is different from a film layer on which a data signal line 60 is located, and is located on a side of a data signal line close to the base substrate, and the other portion of the data connection line 70 is in a same film layer as the data signal line. A portion of the data connection line 70 located on a film layer different from a film layer on which a data signal line is located is connected with the data signal line 60, and a portion of the data connection line 70 disposed in a same layer as the data signal line extends to the bonding region 201 along the second direction Y.

In an exemplary implementation mode, as shown in FIGS. 5A, 5C, and 6, a data connection line 70 may include a first connection line 71 extending along the first direction X and a second connection line 72 extending along the second direction Y partially, the first connection line 71 and the second connection line 72 constitute a data connection line 70 in a shape of a broken line. A first end of the first connection line 71 is connected with a data signal line 60 through a first connection hole, a second end of the first connection line 71, after extending along the first direction X or an opposite direction of the first direction X, is directly connected with a first end of the second connection line 72, and a second end of the second connection line 72, after extending toward a direction of the lead region 201 along the second direction Y, is connected with a leading out line 210.

In an exemplary implementation mode, the first connection line 71 and the data signal line 60 may be disposed in different conductive layers, and the second connection line 72 and the data signal line 60 may be located in a same conductive layer.

In an exemplary implementation mode, the first connection line includes a first data connection portion extending along the second direction and a second data connection portion extending along the first direction, the first data connection portion is connected with the second data connection portion and the second connection line, respectively, and the first direction and the second direction intersect.

In an exemplary implementation mode, division of various regions shown in FIG. 6 is only exemplary illustration. The first region 100A and the second region 100B have no data connection line, the third region 100C has a data connection line, a circuit unit of the first region 100A is connected with a light emitting device of the light transmitting display region, and a circuit unit of the second region 100B is not connected with a light emitting device of the light transmitting display region as a basis for division, thus shapes of three regions may be regular polygons or irregular polygons, and the display region may be divided into one or more first regions 100A, one or more second regions 100B, and one or more third regions 100C, which is not limited here in the present disclosure.

In an exemplary implementation mode, in a plane parallel to the display panel, a shape of the light transmitting display region may be any one or more of following: a rectangle, a polygon, a circle, and an ellipse. FIGS. 5A and 6 are illustrated by taking a circle as an example. For example, when the shape of the light transmitting display region is a circle, a diameter of the circle may be about 3 mm to 5 mm. For another example, when the shape of the light transmitting display region is a rectangle, a side length of the rectangle may be about 3 mm to 5 mm.

In an exemplary implementation mode, in a plane parallel to the display panel, a shape of the first region may be any one or more of following: a rectangle, a polygon, a circle, and an ellipse.

In an exemplary implementation mode, an area of the light transmitting display region may be larger than an area of the first region, or the area of the light transmitting display region may be equal to the area of the first region, or the area of the light transmitting display region may be smaller than the area of the first region. FIG. 5A and FIG. 6 are illustrated by taking a case that the area of the light transmitting display region is smaller than the area of the first region as an example.

In an exemplary implementation mode, resolutions of the light transmitting display region and the first region may be the same or may be different. Herein, a resolution (Pixel Per Inch, PPI for short) refers to a quantity of pixels per unit area, may be referred to as a pixel density. A higher a PPI value is, which represents that the display panel displays a picture at a higher density, and the picture is rich in detail.

In an exemplary implementation mode, a resolution of the first region may be greater than that of the light transmitting display region, i.e., a quantity of light emitting devices included by the first region within a unit area is greater than a quantity of light emitting devices included by the light transmitting display region, or the resolution of the first region may be less than that of the light transmitting display region, i.e., the quantity of light emitting devices included by the first region within a unit area is less than the quantity of light emitting devices included by the light transmitting display region, or the resolution of the first region may be equal to that of the light transmitting display region, i.e., the quantity of light emitting devices included by the first region within a unit area is equal to the quantity of light emitting devices included by the light transmitting display region.

In an exemplary implementation mode, a shape of the display region may be a rounded polygon or may be a circle. When the shape of the display region is a rounded polygon, the display region may further include: a straight line display boundary. FIG. 5A and FIG. 6 are illustrated by taking a case that the display region is a rounded rectangle as an example.

Figure 7A:
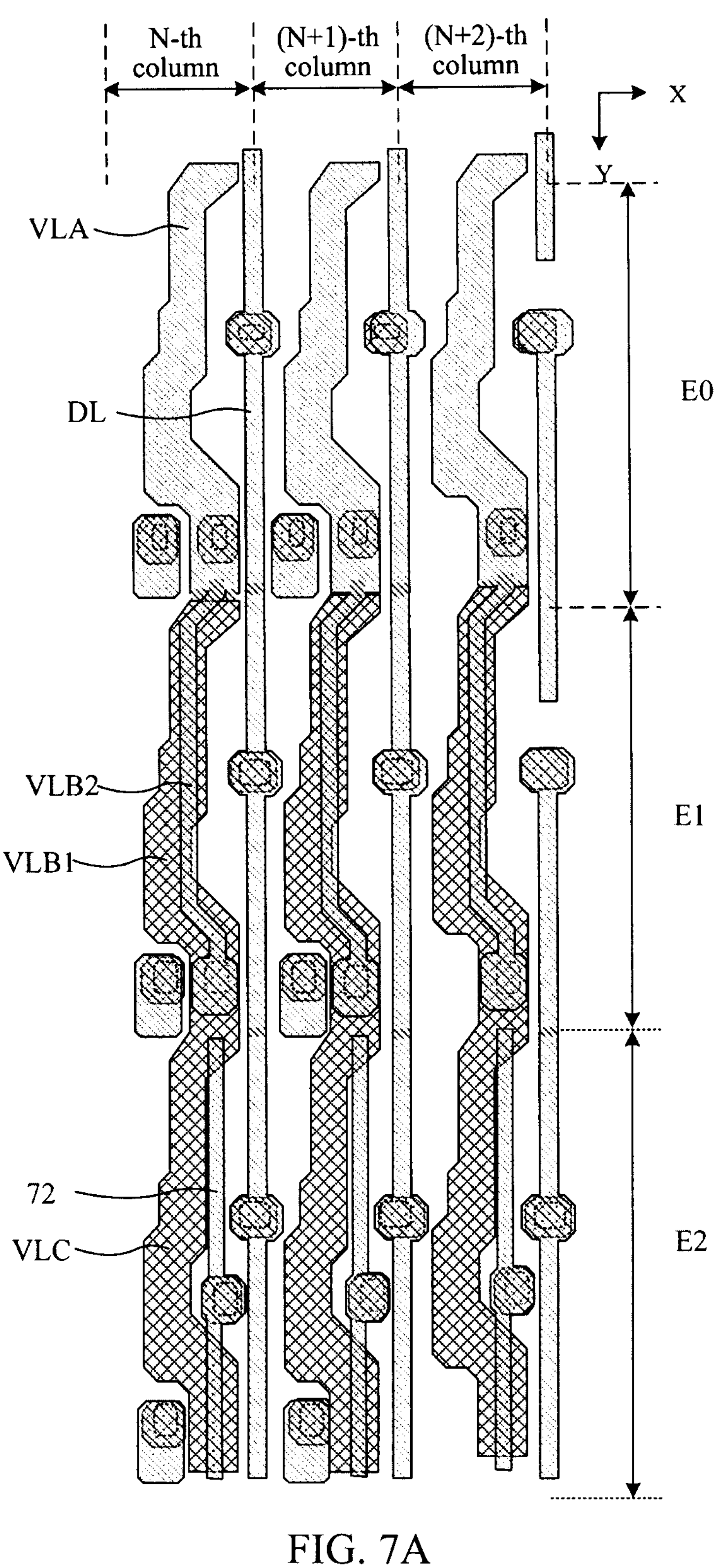
FIG. 7A is a schematic diagram of a structure of an E0 region, an E1 region, and an E2 region in FIG. 6 according to an embodiment of the present disclosure.
Figure 7B:
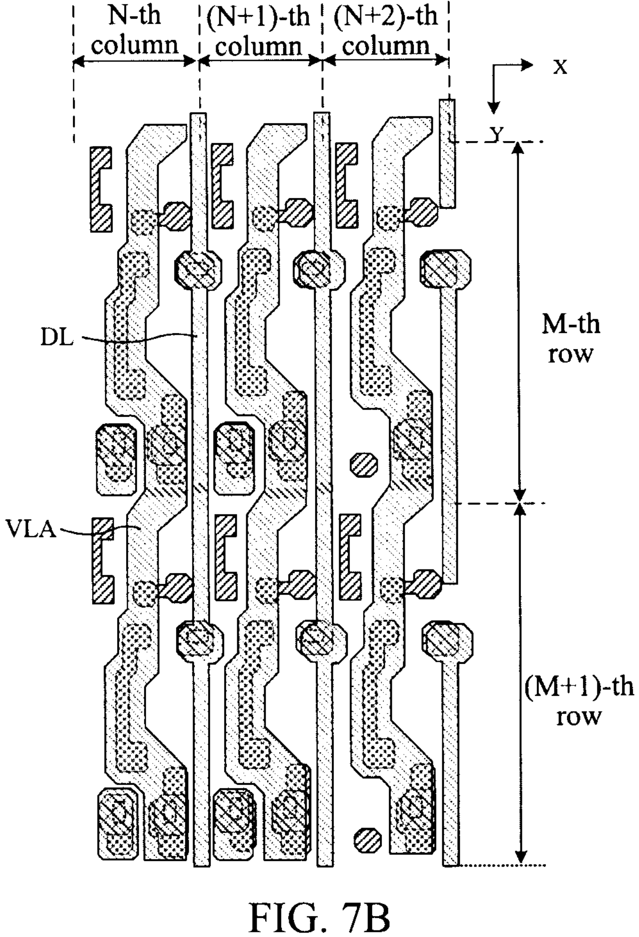
FIG. 7B is a schematic diagram of a structure of the E0 region in FIG. 6 according to an embodiment of the present disclosure.
Figure 7C:
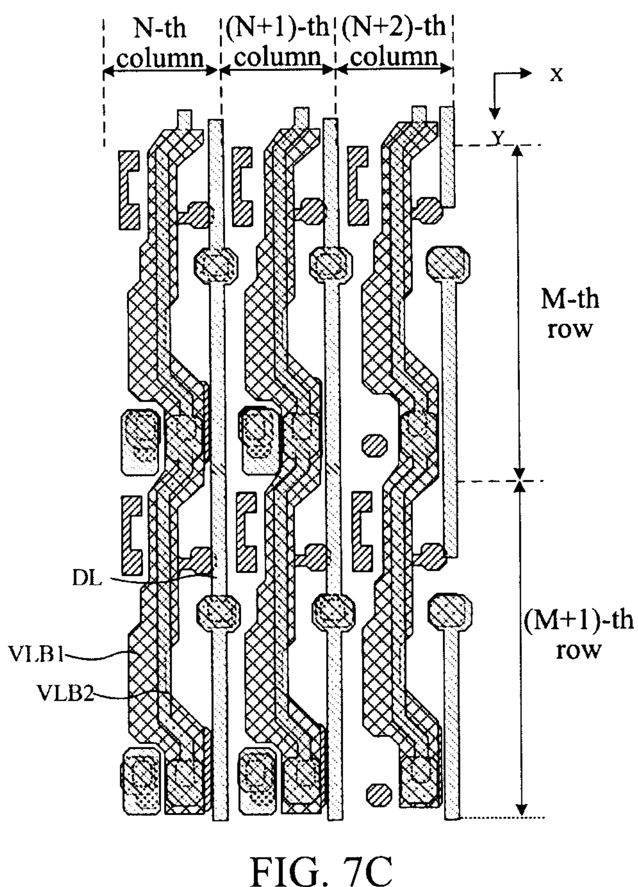
FIG. 7C is a schematic diagram of a structure of the E1 region in FIG. 6 according to an embodiment of the present disclosure.
Figure 7D:
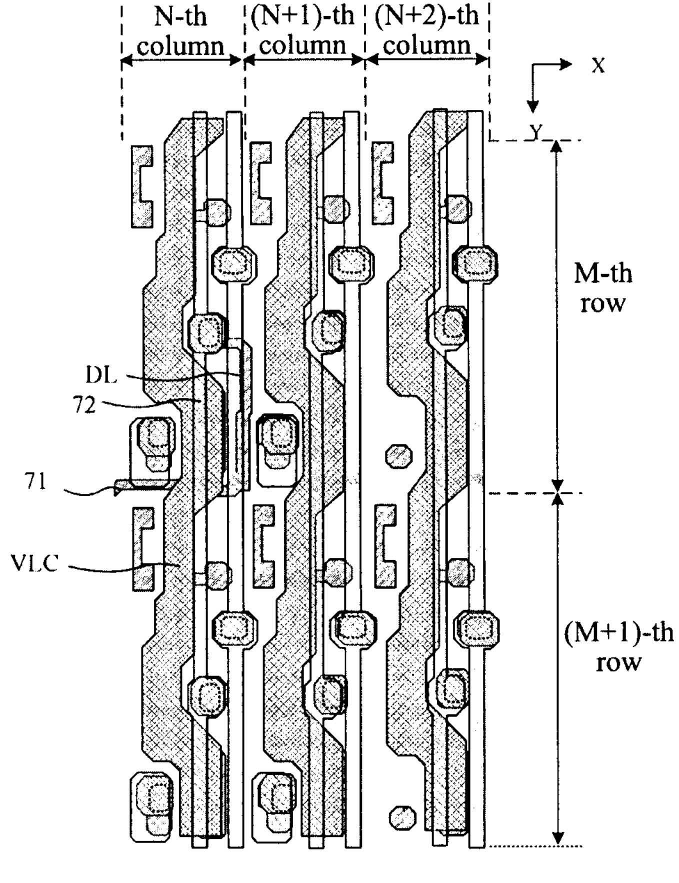
FIG. 7D is a schematic diagram of a structure of the E2 region in FIG. 6 according to an embodiment of the present disclosure.

FIG. 7A is a schematic diagram of a structure of an E0 region, an E1 region, and an E2 region in FIG. 6 according to an embodiment of the present disclosure, FIG. 7B is a schematic diagram of a structure of the E0 region in FIG. 6 according to an embodiment of the present disclosure, FIG. 7C is a schematic diagram of a structure of the E1 region in FIG. 6 according to an embodiment of the present disclosure, and FIG. 7D is a schematic diagram of a structure of the E2 region in FIG. 6 according to an embodiment of the present disclosure. The E0 region is located in a first region, the E1 region is located in a second region, and the E3 region is located in a third region. A high-voltage power supply line located in the first region is a first high-voltage power supply line, a high-voltage power supply line located in the second region is a second high-voltage power supply line, and a high-voltage power supply line located in the third region is a third high-voltage power supply line.

In an exemplary implementation mode, as shown in FIGS. 7A to 7D, the second high-voltage power supply line may include a first sub-high-voltage power supply line VLB1 and a second sub-high-voltage power supply line VLB2 connected with each other, the second sub-high-voltage power supply line VLB2 is located on a side of the first sub-high-voltage power supply line VLB1 away from the base substrate, the first high-voltage power supply line VLA is disposed in a same layer as the second sub-high-voltage power supply line VLB2, and the third high-voltage power supply line VLC is disposed in a same layer as the first sub-high-voltage power supply line VLB1.

In an exemplary implementation mode, as shown in FIGS. 7A to 7D, as shown in FIGS. 7A and 7D, data signal lines of the first region, the second region, and the third region may be a same data signal line, and a data signal line DL is disposed in a same layer as the first high-voltage power supply line.

As shown in FIGS. 7A and 7C, a length of the second sub-high-voltage power supply line VLB2 along the first direction X may be smaller than a length of the first sub-high-voltage power supply line VLB1 along the first direction X, and an orthographic projection of the second sub-high-voltage power supply line VLB2 on the base substrate is at least partially overlapped with an orthographic projection of the first sub-high-voltage power supply line VLB1 on the base substrate.

In an exemplary implementation mode, as shown in FIGS. 7A to 7C, a length of the first high-voltage power supply line VLA along the first direction X, a length of the first sub-high-voltage power supply line VLB1 along the first direction X and a length of the third high-voltage power supply line VLC along the first direction X are approximately equal, and a shape of the first high-voltage power supply line VLA, a shape of the first sub-high-voltage power supply line VLB1, and a shape of the third high-voltage power supply line VLC are approximately the same. Shapes of the first high-voltage power supply line VLA and the third high-voltage power supply line VLC are approximately the same as the shape of the first sub-high-voltage power supply line VLB1, which may eliminate an afterimage caused by a metal line when a screen of the display panel is turned off and ensure a display effect of the display panel.

In an exemplary implementation mode, as shown in FIGS. 7A and 7D, a data connection line may include a first connection line 71, and a second connection line 72 which extends along the second direction, that are connected with each other, the first connection line 71 is located on a side of the third high-voltage power supply line VLC close to the base substrate, and the second connection line 72 is disposed in a same layer as the first high-voltage power supply line VLA.

In an exemplary implementation mode, the second connection line 72 is disposed in a same layer as the first high-voltage power supply line VLA, which may achieve a low load and a high refresh rate.

In an exemplary implementation mode, as shown in FIGS. 7A and 7D, a length of the second sub-high-voltage power supply line VLB2 along the first direction X may be approximately equal to a length of the second connection line 72 along the first direction X, and a shape of the second sub-high-voltage power supply line VLB2 is substantially the same as that of the second connection line 72.

In an exemplary implementation mode, as shown in FIGS. 7A and 7D, an orthographic projection of the first connection line 71 on the base substrate is at least partially overlapped with an orthographic projection of the data signal line DL on the base substrate, and an orthographic projection of the second connection line 72 on the base substrate is at least partially overlapped with an orthographic projection of the third high-voltage power supply line VLC on the base substrate.

In an exemplary implementation mode, as shown in FIG. 7A, an area of an overlapping region of an orthographic projection of the second sub-high-voltage power supply line VLB2 on the base substrate and an orthographic projection of the first sub-high-voltage power supply line VLB1 on the base substrate is larger than an area of an overlapping region of an orthographic projection of the second connection line 72 on the base substrate and an orthographic projection of the third high-voltage power supply line VLC on the base substrate.

Figure 8A:
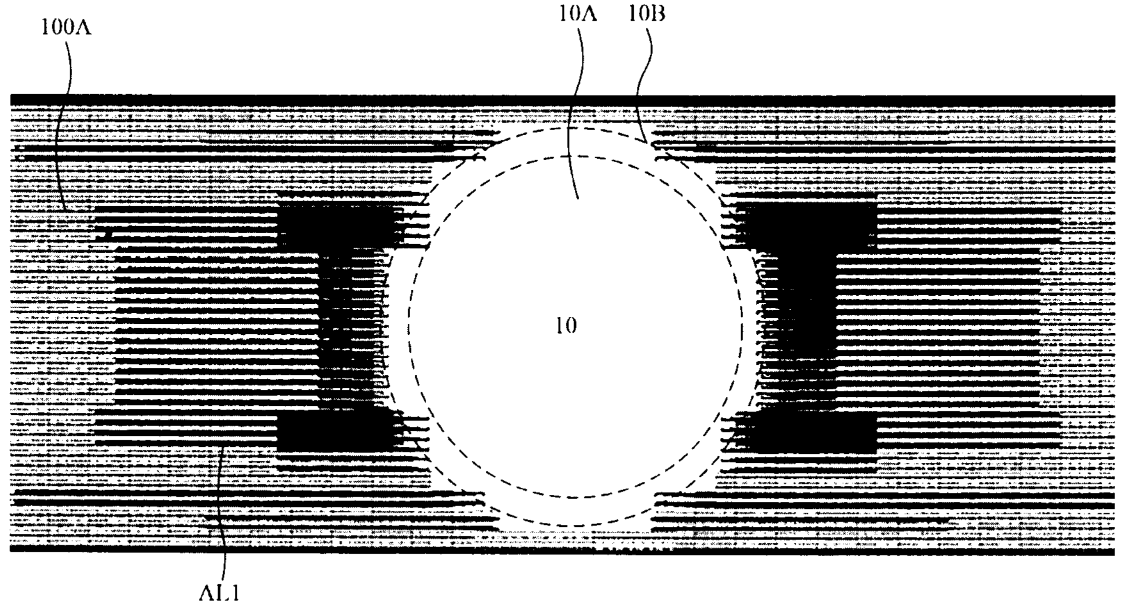
FIG. 8A is a schematic diagram of wiring of a first anode connection line of a display panel.
Figure 8B:
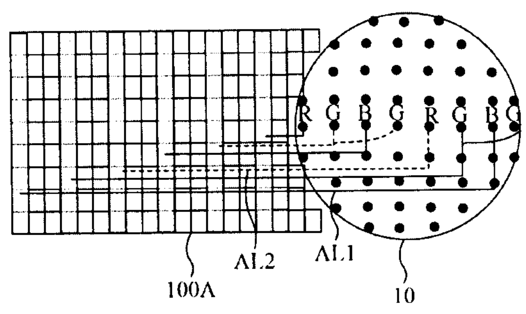
FIG. 8B is a schematic diagram of a connection of a first anode connection line of a display panel.
Figure 8C:
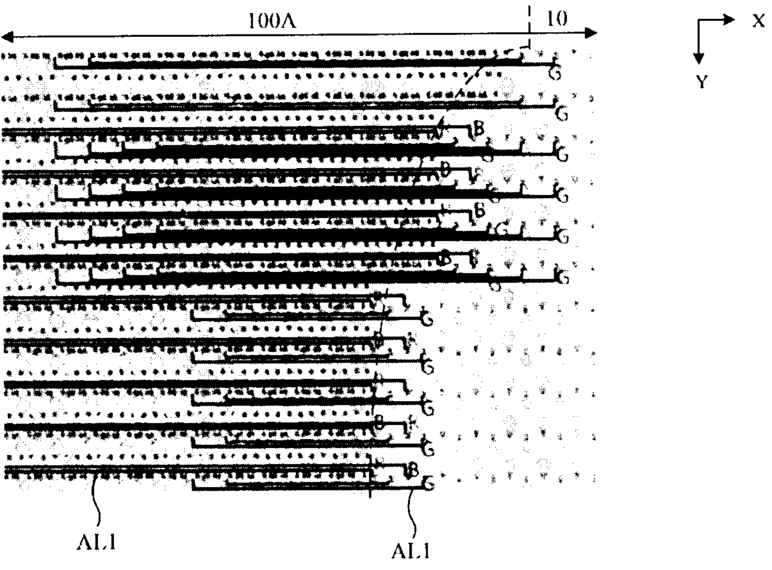
FIG. 8C is a schematic diagram I of partial wiring of a first anode connection line of a display panel.
Figure 8D:
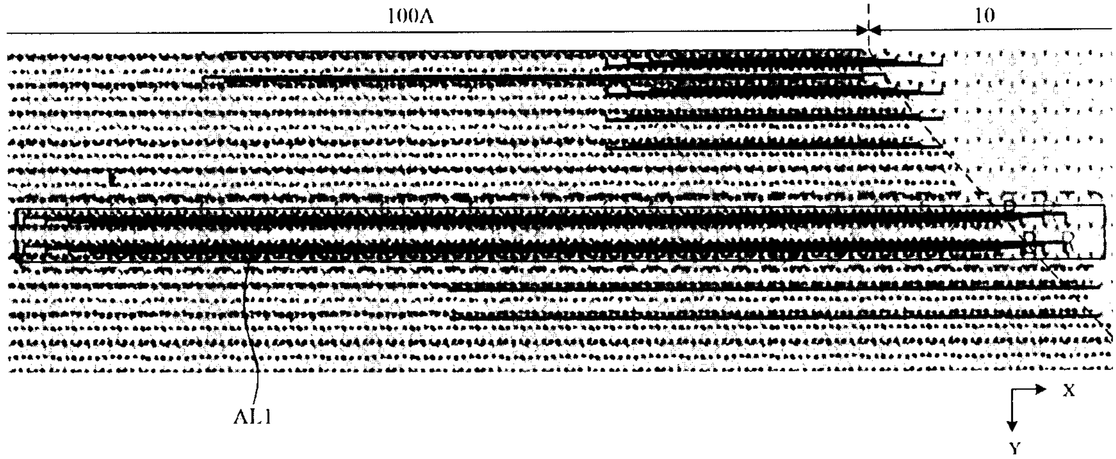
FIG. 8D is a schematic diagram II of partial wiring of a first anode connection line of a display panel.
Figure 8E:
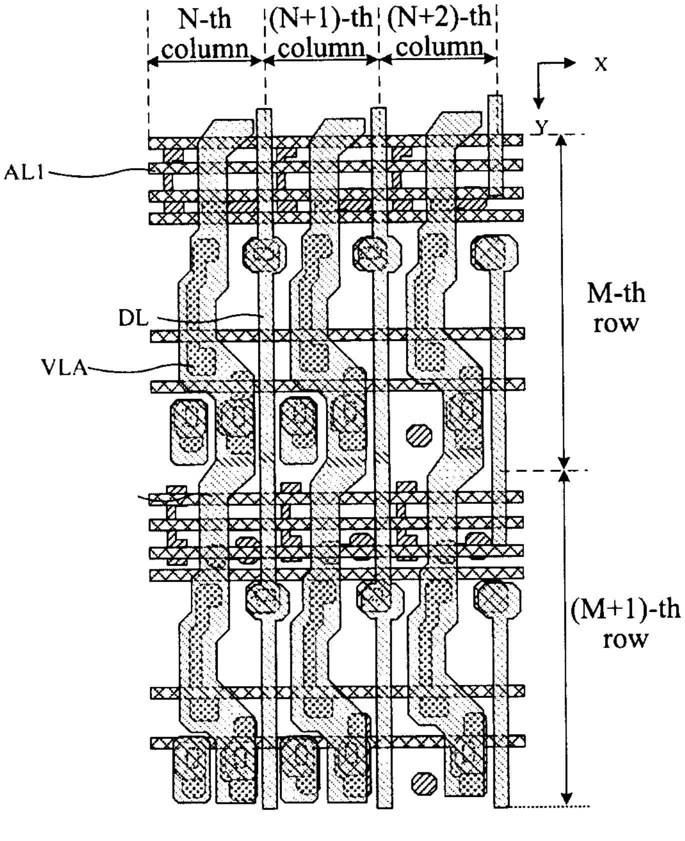
FIG. 8E is a schematic diagram of another structure of the E0 region in FIG. 6.

In an exemplary implementation mode, FIG. 8A is a schematic diagram of wiring of a first anode connection line of a display panel, FIG. 8B is a schematic diagram of a connection of a first anode connection line and a second anode connection line of a display panel, FIG. 8C is a schematic diagram I of partial wiring of a first anode connection line of a display panel, FIG. 8D is a schematic diagram II of partial wiring of a first anode connection line of a display panel, and FIG. 8E is a schematic diagram of another structure of the E0 region in FIG. 6. As shown in FIGS. 8A to 8E, a light emitting device may include an anode, an organic emitting layer, and a cathode, and the display panel may further include a plurality of first anode connection lines AL1 extending along a first direction, a first anode connection line AL1 is disposed in a same layer as a third high-voltage power supply line VLC and configured to connect at least one circuit unit of a first region 100A and an anode of a light emitting device located in a light transmitting display region 10.

As shown in FIG. 8B, the circuit unit of the first region 100A may include a plurality of circuit units, and a circuit unit connected with a light emitting device of the light transmitting display region may be located between circuit units connected with a light emitting device of a conventional display region.

In an exemplary implementation mode, as shown in FIG. 8A, the light transmitting display region 10 includes a central region 10A and an edge region 10B surrounding and disposed on an outside of the central region 10A.

In an exemplary implementation mode, as shown in FIG. 8B, the display panel may further include a second anode connection line AL2. The second anode connection line AL2 may be located on a side of a first high-voltage power supply line away from the base substrate; the first anode connection line AL1 is configured to connect at least one circuit unit of the first region and an anode of a light emitting device located in the edge region, and the second anode connection line AL2 is configured to connect at least one circuit unit of the first region and an anode of a light emitting device located in the central region.

In an exemplary implementation mode, the first anode connection line may include a metal signal line. The first anode connection line and the third high-voltage power supply line are disposed in a same layer, which may simplify a manufacturing process of the display panel, be beneficial to saving a cost, and improve a yield and productivity.

In an exemplary implementation mode, the second anode connection line includes a transparent conductive signal line, which may ensure a light transmittance of the light transmitting display region.

In an exemplary implementation mode, since an aperture size of the light transmitting display region is about 2.5 mm, if what are all used for the display panels are second anode connection lines, it is necessary to dispose at least three layers of transparent conductive layers, and a planarization layer or an insulation layer located between the transparent conductive layers. At this time, a quantity of masks used for the display panel is relatively large. In the present disclosure, by disposing a plurality of first anode connection lines AL1 disposed in a same layer as the third high-voltage power supply line VLC, a wiring pressure of a second anode connection line may be relieved, a quantity of masks used in manufacture of the display panel may be reduced, and it is beneficial to saving a cost and improving a yield and productivity.

In an exemplary implementation mode, a light emitting structure layer may include a plurality of light emitting units, at least one light emitting unit includes a first light emitting device, a second light emitting device, and a third light emitting device, different light emitting devices emit light of different colors, the first light emitting device and the second light emitting device emit red or blue light, and the third light emitting device emits green light.

In an exemplary implementation mode, as shown in FIGS. 8C and 8D, an area of a first light emitting device located in a light emitting unit of the light transmitting display region is smaller than an area of a first light emitting device located in a light emitting unit of the conventional display region. An area of a second light emitting device located in a light emitting unit of the light transmitting display region is smaller than an area of a second light emitting device located in a light emitting unit of the conventional display region. An area of a third light emitting device located in a light emitting unit of the light transmitting display region is smaller than an area of a third light emitting device located in a light emitting unit of the conventional display region.

In an exemplary implementation mode, as shown in FIGS. 8C and 8D, for a light emitting unit located in the edge region, a length of a first anode connection line AL1 connected with a third light emitting device of a same light emitting unit along the first direction is smaller than a length of a first anode connection line AL1 connected with a first light emitting device and a second light emitting device of the same light emitting unit along the first direction. The length of the first anode connection line AL1 connected with the third light emitting device of the same light emitting unit along the first direction is smaller than the length of the first anode connection line AL1 connected with the first light emitting device and the second light emitting device of the same light emitting unit along the first direction, which may reduce a load of a sub-pixel where the third light emitting device is located and improve a display effect of a light emitting device of the light transmitting display region.

In an exemplary implementation mode, as shown in FIGS. 8C and 8D, a length of a first anode connection line AL1 connected with any third light emitting device located in the edge region along the first direction X is smaller than a length of a first anode connection line AL1 connected with any first light emitting device located in the edge region and a first anode connection line AL1 connected with any second light emitting device located in the edge region along the first direction X. The length of the first anode connection line connected with any third light emitting device located in the edge region along the first direction X is relatively small, which may improve a display effect of a light emitting device of the light transmitting display region.

In an exemplary implementation mode, the edge region 10B accounts for about 3% to 8% of an area of the light transmitting display region 10, or a quantity of light emitting units included in the edge region 10B is 5% to 10% of a quantity of light emitting units in the light transmitting display region. The edge region 10B accounts for about 3% to 8% of the area of the light transmitting display region 10, or the quantity of light emitting units included in the edge region 10B is 5% to 10% of the quantity of light emitting units in the light transmitting display region, which may ensure a light transmittance of the light transmitting display region.

In an exemplary implementation mode, on a plane perpendicular to the base substrate, the display panel may include a semiconductor layer, a first insulation layer, a first conductive layer, a second insulation layer, a second conductive layer, a third insulation layer, a third conductive layer, a fourth insulation layer, a fourth conductive layer, a first planarization layer, and a fifth conductive layer disposed sequentially on the base substrate; the semiconductor layer includes at least active layers of a plurality of transistors; the first conductive layer includes at least gate electrodes of the plurality of transistors and a first electrode plate of a capacitor, the second conductive layer includes at least a second electrode plate of the capacitor, the third conductive layer includes at least first electrodes and second electrodes of the plurality of transistors and a first connection line, the fourth conductive layer includes at least a first anode connection line, a first sub-high-voltage power supply line, and a third high-voltage power supply line, and the fifth conductive layer includes at least a data signal line, a first high-voltage power supply line, a second sub-high-voltage power supply line, and a second connection line.

In an exemplary implementation mode, a pixel circuit includes a writing transistor connected with a data signal line, and a second electrode plate of a capacitor located in the third region includes a capacitor main body portion and an auxiliary capacitor portion connected with each other, the capacitor main body portion has substantially a same shape as a second electrode plate of a capacitor located in the first region and the second region; an orthographic projection of the auxiliary capacitor portion on the base substrate is at least partially overlapped with an orthographic projection of an active layer of the writing transistor on the base substrate.

In an exemplary implementation mode, the third conductive layer further includes a data connection block, an orthographic projection of the data connection block on the base substrate is at least partially overlapped with orthographic projections of the auxiliary capacitor portion and the second connection line on the base substrate, and the data connection block is connected with the first connection line and the second connection line, respectively.

In an exemplary implementation mode, the data connection block and the second data connection portion are located on a same side of the first data connection portion and are electrically connected with the first data connection portion; an orthographic projection of the first data connection portion on the base substrate is at least partially overlapped with an orthographic projection of a second electrode plate of a capacitor on the base substrate.

In an exemplary implementation mode, the pixel circuit further includes a first light emitting transistor and a second light emitting transistor, the first light emitting transistor is connected with a high-voltage power supply line, the second light emitting transistor is connected with an anode of a light emitting device, and the fourth conductive layer further includes a first connection electrode, a second connection electrode, a third connection electrode, and a fourth connection electrode; an orthographic projection of the first connection electrode on the base substrate is at least partially overlapped with an orthographic projection of a first electrode of a writing transistor of at least one circuit unit located in the first region to the third region on the base substrate, and the first connection electrode is electrically connected with the first electrode of the writing transistor of the at least one circuit unit located in the first region to the third region, an orthographic projection of the second connection electrode on the base substrate is at least partially overlapped with an orthographic projection of a second electrode of a second light emitting transistor in at least one circuit located in the first region to the third region on the base substrate, and the second connection electrode is connected with the second electrode of the second light emitting transistor in the at least one circuit located in the first region to the third region, an orthographic projection of the third connection electrode on the base substrate is at least partially overlapped with an orthographic projection of a first electrode of a first light emitting transistor in at least one circuit unit located in the first region on the base substrate, and the third connection electrode is connected with the first electrode of the first light emitting transistor in the at least one circuit unit located in the first region, and an orthographic projection of the fourth connection electrode on the base substrate is at least partially overlapped with an orthographic projection of the data connection block on the base substrate, and is at least partially overlapped with the orthographic projection of the data connection block on the base substrate.

In an exemplary implementation mode, the fifth conductive layer further includes: a fifth connection electrode, an orthographic projection of the fifth connection electrode on the base substrate is at least partially overlapped with an orthographic projection of the second connection electrode on the base substrate, and the fifth connection electrode is connected with the second connection electrode.

In an exemplary implementation mode, orthographic projections of the plurality of first anode connection lines on the base substrate may be at least partially overlapped with orthographic projections of the second electrode plate of the capacitor and an anode of a light emitting device connected with the plurality of first anode connection lines, on the base substrate.

In an exemplary implementation mode, an orthographic projection of the data signal line on the base substrate is at least partially overlapped with an orthographic projection of the first connection electrode on the base substrate and the data signal line is connected with the first connection electrode, an orthographic projection of the first high-voltage power supply line on the base substrate is at least partially overlapped with an orthographic projection of the third connection electrode on the base substrate and the first high-voltage power supply line is connected with the third connection electrode. An orthographic projection of the second connection line on the base substrate is at least partially overlapped with an orthographic projection of the fourth connection electrode on the base substrate and the second connection line is connected with the fourth connection electrode.

In an exemplary implementation mode, the display panel may further include a transparent conductive layer located on a side of a second planarization layer away from the base substrate, the transparent conductive layer includes the second anode connection line, an orthographic projection of the second anode connection line on the base substrate is at least partially overlapped with an orthographic projection of the fifth connection electrode on the base substrate, and the second anode connection line is connected with the fifth connection electrode.

A preparation process of the display panel will be exemplarily described below. A "patterning process" mentioned in the present disclosure includes photoresist coating, mask exposure, development, etching, photoresist stripping, etc., for a metal material, an inorganic material, or a transparent conductive material, and includes organic material coating, mask exposure, development, etc., for an organic material. Deposition may be any one or more of sputtering, evaporation, and chemical vapor deposition, coating may be any one or more of spray coating, spin coating, and inkjet printing, and etching may be any one or more of dry etching and wet etching, which is not limited in the present disclosure. A "thin film" refers to a layer of thin film made of a certain material on the base substrate using deposition, coating, or another process. If the "thin film" does not need a patterning process in an entire manufacturing process, the "thin film" may also be called a "layer". If the "thin film" needs the patterning process in the entire manufacturing process, the "thin film" is called a "thin film" before the patterning process and is called a "layer" after the patterning process. At least one "pattern" is contained in the "layer" after the patterning process. "A and B are disposed in a same layer" described in the present disclosure means that A and B are formed at the same time through a same patterning process, and a "thickness" of a film layer is a dimension of the film layer in a direction perpendicular to the display panel. In an exemplary embodiment of the present disclosure, "an orthographic projection of B being within a range of an orthographic projection of A" or "an orthographic projection of A containing an orthographic projection of B" means that a boundary of the orthographic projection of B falls within a range of a boundary of the orthographic projection of A, or the boundary of the orthographic projection of A is overlapped with the boundary of the orthographic projection of B.

In an exemplary implementation mode, taking six circuit units (two unit rows and three unit columns) in the E0 region, the E1 region, and the E2 region, wherein circuit units in an N-th column and an (N+1)-th column of circuit units are drive circuit units, and an (N+2)-th column of circuit units are dummy circuit units, as an example, the preparation process of the display panel may include following acts.

(1) A pattern of a semiconductor layer is formed. In an exemplary implementation mode, forming the pattern of the semiconductor layer may include depositing sequentially a semiconductor thin film on the base substrate, patterning the semiconductor thin film through a patterning process to form the pattern of the semiconductor layer, as shown in FIG. 9, FIG. 9 is a schematic diagram of the E0 region, the E1 region, and the E2 region after the pattern of the semiconductor layer is formed.

Figure 9:
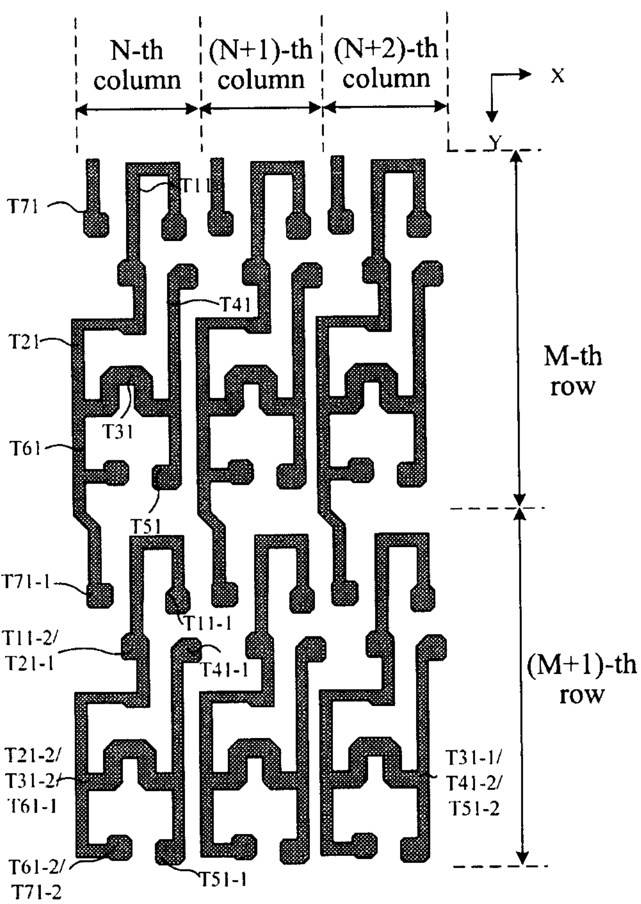
FIG. 9 is a schematic diagram of the E0 region, the E1 region, and the E2 region after a pattern of a semiconductor layer is formed.

In an exemplary implementation mode, as shown in FIG. 9, patterns of semiconductor layer located in the E0 region, the E1 region, and the E2 region each include an active layer T11 of a first transistor to an active layer T71 of a seventh transistor.

In an exemplary implementation mode, as shown in FIG. 9, the active layer T11 of the first transistor to the active layer T61 of the sixth transistor are of an interconnected integral structure.

In an exemplary implementation mode, as shown in FIG. 9, in the first direction X, the active layer T21 of the second transistor and the active layer T61 of the sixth transistor may be located on a same side of the active layer T31 of the third transistor in a present sub-pixel, the active layer T41 of the fourth transistor and the active layer T51 of the fifth transistor may be located on a same side of the active layer T31 of the third transistor in the present sub-pixel, and the active layer T21 of the second transistor and the active layer T41 of the fourth transistor may be located on different sides of the active layer T31 of the third transistor in the present sub-pixel. In the second direction Y, the active layer T11 of the first transistor, the active layer T21 of the second transistor, the active layer T41 of the fourth transistor, and the active layer T71 of the seventh transistor may be located in a same side of the active layer T31 of the third transistor in the present sub-pixel, and the active layer T51 of the fifth transistor and the active layer T61 of the sixth transistor may be located on the other side of the active layer T31 of the third transistor in the present sub-pixel.

In an exemplary implementation mode, as shown in FIG. 9, the active layer T11 of the first transistor may be in an "n" shape, the active layer T21 of the second transistor may be in an "L" shape, the active layer T31 of the third transistor may be in a "Ω" shape, and the active layer T41 of the fourth transistor, the active layer T51 of the fifth transistor, the active layer T61 of the sixth transistor, and the active layer T71 of the seventh transistor may be in an "I" shape.

In an exemplary implementation mode, as shown in FIG. 9, an active layer of each transistor may include a first region, a second region, and a channel region located between the first region and the second region. In an exemplary implementation mode, a second region T11_2 of the active layer T11 of the first transistor may serve as a first region T21_1 of the active layer T21 of the second transistor, a first region T31_1 of the active layer T31 of the third transistor may simultaneously serve as a second region T41_2 of the active layer T41 of the fourth transistor and a second region T51_2 of the active layer T51 of the fifth transistor, a second region T31_2 of the active layer T31 of the third transistor may simultaneously serve as a second region T21_2 of the active layer T21 of the second transistor and a first region T61_1 of the active layer T61 of the sixth transistor, a second region T61_2 of the active layer t61 of the sixth transistor may serve as a second region T71_2 of the active layer T71 of the seventh transistor, a first region T11_1 of the active layer T11 of the first transistor, a first region T41_1 of the active layer T41 of the fourth transistor, a first region T51_1 of the active layer T51_1 of the fifth transistor, and a first region T71_1 of the active layer T71 of the seventh transistor may be disposed separately.

In an exemplary implementation mode, as shown in FIG. 9, the first region T31_1 of the active layer T31 of the third transistor (also the second region T41_2 of the active layer T41 of the fourth transistor and the second region T51_2 of the active layer T51 of the fifth transistor) may be in a shape having a strip structure extending along the second direction Y, and has a length along the first direction X that is larger than a length of the first region T41_1 of the active layer T41 of the fourth transistor and the first region T51_1 of the active layer T51 of the fifth transistor.

In an exemplary implementation mode, patterns of the semiconductor layer of the E1 region and the E2 region in FIG. 9 are substantially the same as the pattern of the semiconductor layer of the E0 region.

Figure 10:
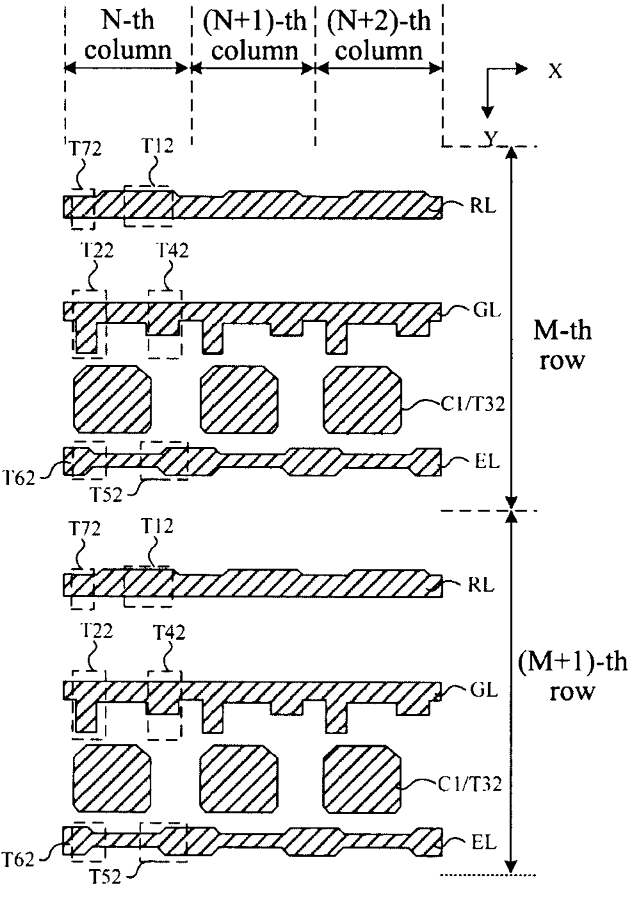
FIG. 10 is a schematic diagram of patterns of a first conductive layer of the E0 region, the E1 region, and the E2 region.
Figure 11:
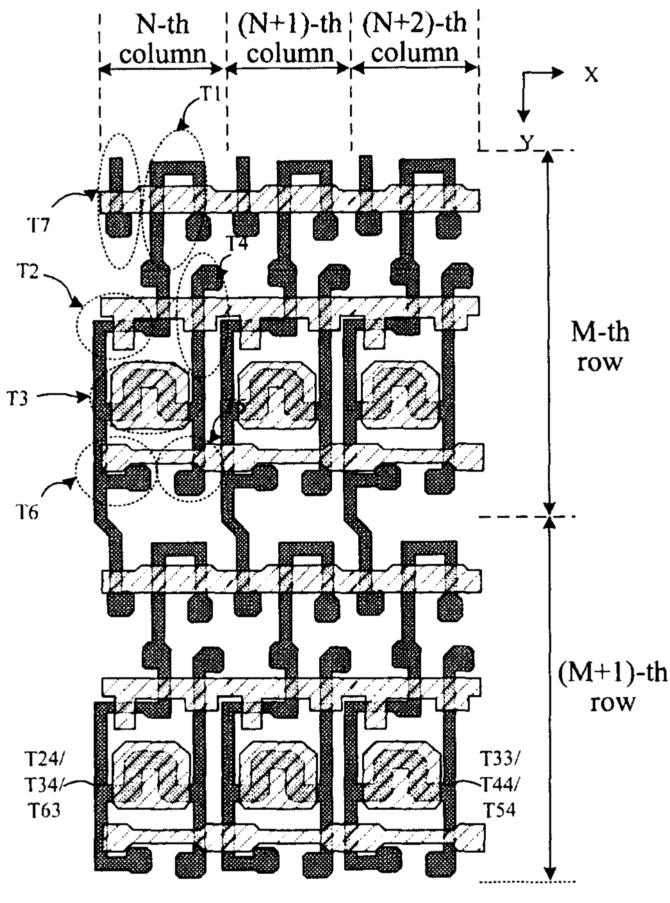
FIG. 11 is a schematic diagram of the E0 region, the E1 region, and the E2 region after the pattern of the first conductive layer is formed.

(2) A pattern of a first conductive layer is formed. In an exemplary implementation mode, forming the pattern of the first conductive layer may include depositing sequentially a first insulation thin film and a first conductive thin film on the base substrate on which the above-mentioned pattern is formed, patterning the first conductive thin film through a patterning process to form a first insulation layer covering the pattern of the semiconductor layer, and the pattern of the first conductive layer located on the first insulation layer, as shown in FIGS. 10 and 11, wherein FIG. 10 is a schematic diagram of patterns of a first conductive layer of the E0 region, the E1 region, and the E2 region, and FIG. 11 is a schematic diagram of the E0 region, the E1 region, and the E2 region after the pattern of the first conductive layer are formed. In an exemplary implementation mode, the first conductive layer may be referred to as a first gate metal (GATE1) layer.

In an exemplary implementation mode, as shown in FIGS. 10 and 11, the patterns of the first conductive layer of the E0 region, the E1 region, and the E2 region may each include a scan signal line GL, a reset signal line RL, a light emitting signal line EL, and a first electrode plate C1 of a capacitor.

In an exemplary implementation mode, as shown in FIGS. 10 and 11, the first electrode plate C1 of the capacitor may be in a shape of a rectangle, corners of the rectangle may be provided with chamfers, and an orthographic projection of the first electrode plate C1 of the capacitor on the base substrate is at least partially overlapped with an orthographic projection of an active layer of a third transistor T3 on the base substrate. In an exemplary implementation mode, the first electrode plate C1 of the capacitor may simultaneously serve as a control electrode T32 of the third transistor.

In an exemplary implementation mode, as shown in FIGS. 10 and 11, the reset signal line RL may have a shape of a line extending along the first direction X, and may be located on a side of the first electrode plate C1 of the capacitor away from the light emitting signal line EL. A region where the reset signal line RL is overlapped with an active layer of the first transistor serves as a control electrode T12 of the first transistor, and a region where the reset signal line RL is overlapped with an active layer of the seventh transistor serves as a control electrode T72 of the seventh transistor. Since the active layer T11 of the first transistor may be in an "n" shape, there are two regions where the reset signal line RL is overlapped with the active layer of the first transistor, that is to say, there are two control electrodes T12 of the first transistor, i.e., the first transistor has a double-gate structure.

In an exemplary implementation mode, as shown in FIGS. 10 and 11, the scan signal line GL may have a shape of a line extending along the first direction X, and the scan signal line GL may be located between the first electrode plate C1 of the capacitor and the reset signal line RL. A region where the scan signal line GL is overlapped with an active layer of the second transistor serves as a control electrode T22 of the second transistor, and a region where the scan signal line GL is overlapped with an active layer of the fourth transistor serves as a control electrode T42 of the fourth transistor. There are two regions where the control electrode T22 of the second transistor is overlapped with the active layer T21 of the second transistor, that is to say, there are two control electrodes T22 of the second transistor, and the second transistor has a double-gate structure.

In an exemplary implementation mode, as shown in FIGS. 10 and 11, the light emitting signal line EL may have a shape of a line extending along the first direction X, a region where the light emitting signal line EL is overlapped with an active layer of the fifth transistor serves as a control electrode T52 of the fifth transistor, and a region where the light emitting signal line EL is overlapped with an active layer of the sixth transistor serves as a control electrode T62 of the sixth transistor.

In an exemplary implementation mode, as shown in FIGS. 10 and 11, the scan signal line GL, the reset signal line RL, and the light emitting signal line EL may be of an equal width design, or may be of a non-equal width design, may be straight lines, or may be broken lines, which may not only facilitate a layout of a pixel structure, but also reduce a parasitic capacitance between signal lines, which is not limited here in the present disclosure.

In an exemplary implementation mode, as shown in FIG. 11, after the pattern of the first conductive layer is formed, the semiconductor layer may be subjected to a conductorization treatment by using the first conductive layer as a shield. The semiconductor layer, in a region shielded by the first conductive layer, forms channel regions of the first transistor T1 to the seventh transistor T7, and the semiconductor layer, in a region which is not shielded by the first conductive layer, is made to be conductorized, that is, first regions and second regions of active layers of the first transistor to the seventh transistor are all made to be conductorized, and a first region of an active layer of the third transistor (which is also a second region of an active layer of the fourth transistor and a second region of an active layer of the fifth transistor) after conductorization may be simultaneously used as a first electrode T33 of the third transistor, a second electrode T44 of the fourth transistor, and a second electrode T54 of the fifth transistor, and a second region of the active layer of the third transistor (which is also a second region of the active layer of the second transistor and the first region T61_1 of the active layer of the sixth transistor) after conductorization may be simultaneously used as a second electrode T24 of the second transistor, a second electrode T34 of the third transistor, and a first electrode T63 of the sixth transistor.

In an exemplary implementation mode, patterns of the first conductive layer of the E1 region and the E2 region in FIG. 10 are substantially the same as the pattern of the first conductive layer of the E0 region.

Figure 14:
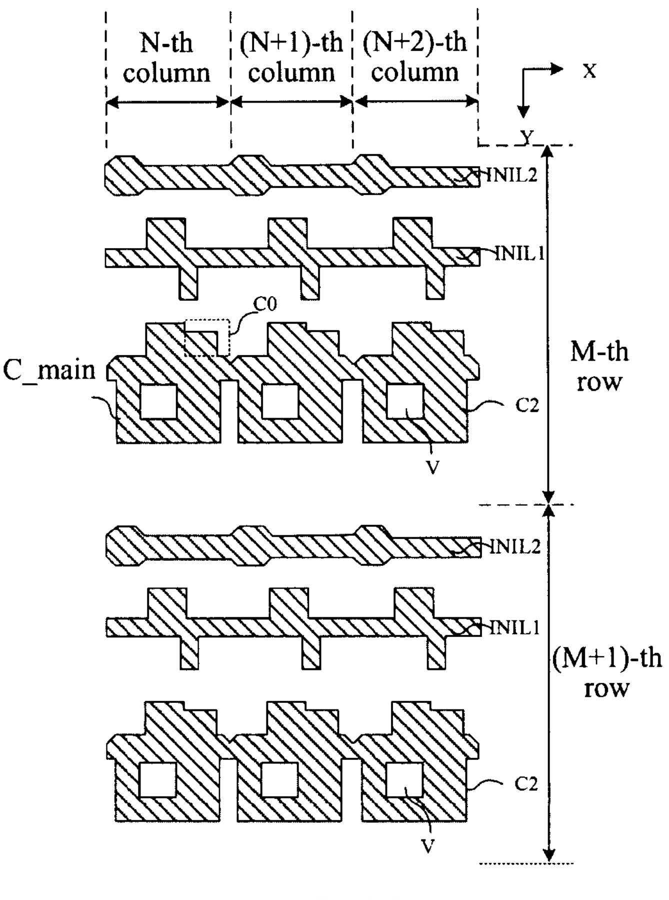
FIG. 14 is a schematic diagram of the pattern of the first conductive layer of the E2 region.
Figure 15:
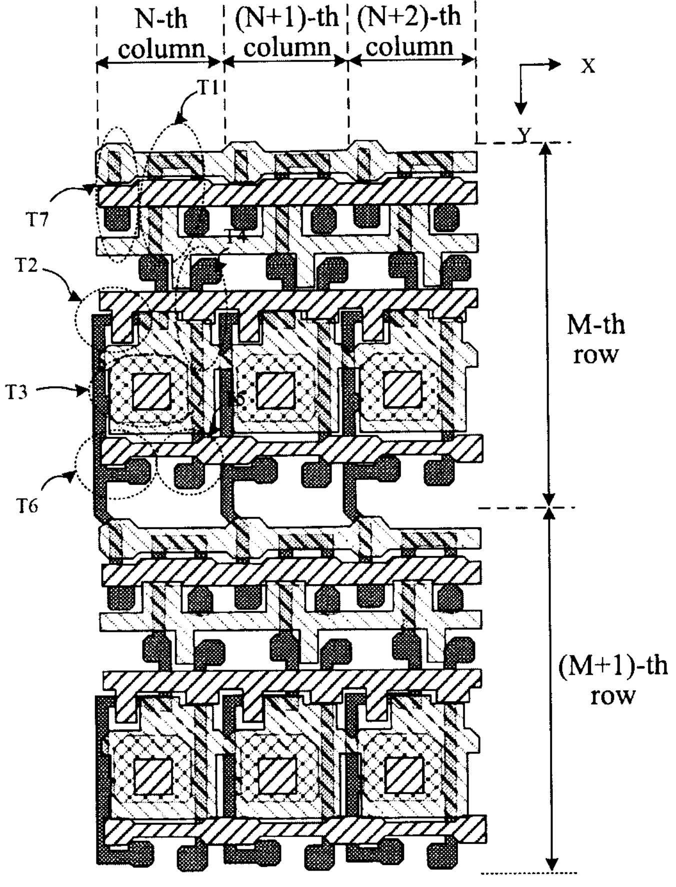
FIG. 15 is a schematic diagram of the E2 region after the pattern of the first conductive layer is formed.

(3) A pattern of a second conductive layer is formed. In an exemplary implementation mode, forming the pattern of the second conductive layer may include depositing a second insulation layer thin film and a second conductive thin film on the base substrate on which the above-mentioned patterns are formed, patterning the second conductive thin film using a patterning process to form the pattern of the second conductive layer on a second insulation layer. As shown in FIG. 12 to FIG. 15, FIG. 12 is a schematic diagram of patterns of the first conductive layer of the E0 region and the E1 region, FIG. 13 is a schematic diagram of the E0 region and the E1 region after the pattern of the first conductive layer is formed, FIG. 14 is a schematic diagram of the pattern of the first conductive layer of the E2 region, and FIG. 15 is a schematic diagram of the E2 region after the pattern of the first conductive layer is formed. In an exemplary implementation mode, the second conductive layer may be referred to as a second gate metal (GATE2) layer.

In an exemplary implementation mode, as shown in FIGS. 12 to 15, patterns of the second conductive layer of the E0 region, the E1 region, and the E2 region may each include a first initial signal line INIL1, a second initial signal line INIL2, and a second electrode plate C2 of the capacitor.

In an exemplary implementation mode, as shown in FIGS. 12 to 15, the first initial signal line INIL1 and the second initial signal line INIL2 may have a shape of a line of which a main body portion may extend along the first direction X. A first initial signal line INIL1 in a circuit unit of an M-th row may be located between a reset signal line RL and a scan signal line GL of a present circuit unit, and a second initial signal line INIL2 may be located on a side of the reset signal line RL of the present circuit unit away from the scan signal line GL.

In an exemplary implementation mode, as shown in FIGS. 12 to 15, a contour of the second electrode plate C2 may be in a shape of a rectangle, corners of the rectangle may be provided with chamfers, an orthographic projection of the second electrode plate C2 on the base substrate and an orthographic projection of the first electrode plate C1 on the base substrate have an overlapping region, the second electrode plate C2, as another electrode plate of the capacitor, is located between the scan signal line GL and a light emitting signal line EL of the present circuit unit, and the first electrode plate C1 and the second electrode plate C2 constitute a capacitor of a pixel circuit.

In an exemplary implementation mode, second electrode plates C2 of adjacent circuit units are connected with each other. The second electrode plates C2 of adjacent circuit units are connected with each other, which may enable second electrode plates of a plurality of circuit units in a unit row to form an interconnected integral structure, and the second electrode plates with the integral structure may be reused as a power supply signal connection line, thus ensuring that a plurality of second electrode plates in one unit row have a same potential, which is conducive to improving uniformity of the display panel, avoiding poor display of the display panel, and ensuring a display effect of the display panel.

In an exemplary implementation mode, a second electrode plate C2 is provided with an opening V, which may be located in a middle of the second electrode plate C2. The opening V may be in a shape of a rectangle, which enables the second electrode plate C2 to form an annular structure. The opening V exposes the second insulation layer covering the first electrode plate C1, and an orthographic projection of the first electrode plate C1 on the base substrate contains an orthographic projection of the opening V on the base substrate. In an exemplary implementation mode, the opening V is configured to accommodate a seventh via subsequently formed, the seventh via is located within the opening V and exposes the first electrode plate C1, so that a second electrode of the first transistor T1 subsequently formed is connected with the first electrode plate C1.

Figure 12:
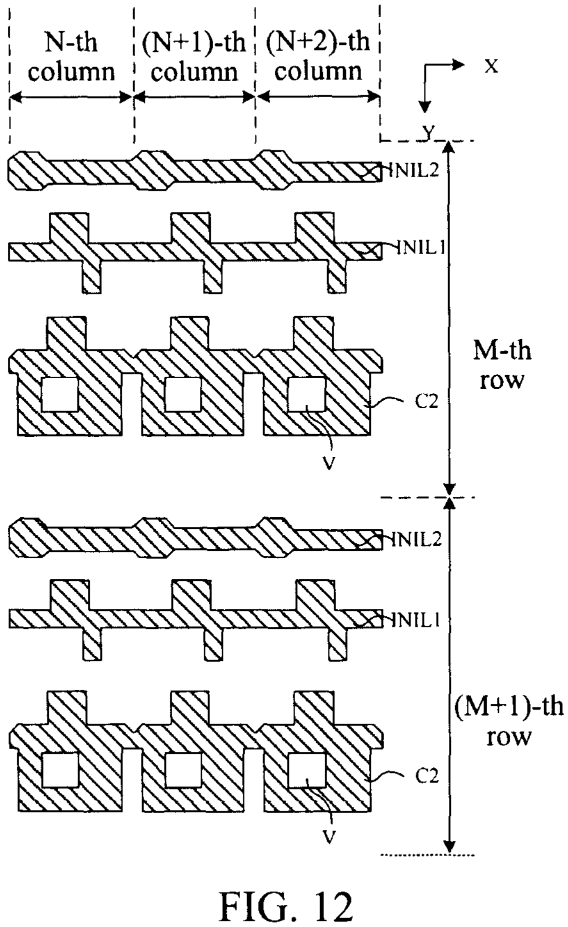
FIG. 12 is a schematic diagram of the pattern of the first conductive layer of the E0 region and the E1 region.
Figure 13:
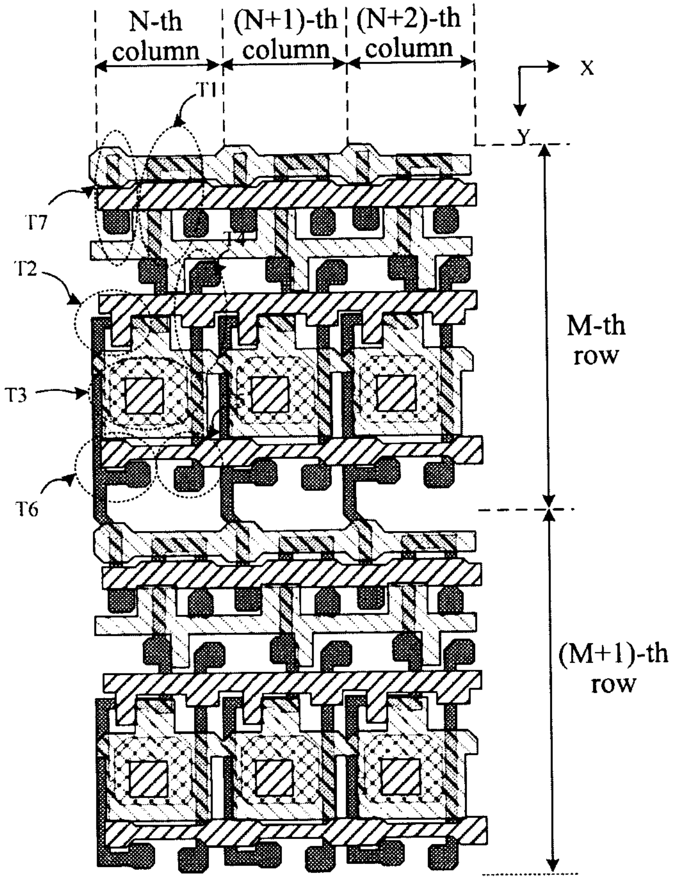
FIG. 13 is a schematic diagram of the E0 region and the E1 region after the pattern of the first conductive layer is formed.

In an exemplary implementation mode, as shown in FIGS. 12 and 13, the pattern of the second conductive layer of the E1 region is substantially the same as the pattern of the second conductive layer of the E0 region.

In an exemplary implementation mode, a second electrode plate in the pattern of the second conductive layer of the E2 region is different from a second electrode plate in the pattern of the second conductive layer of the E0 region. As shown in FIGS. 14 and 15, the second electrode plate in the pattern of the second conductive layer of the E2 region may include a capacitor main body portion C_main and an auxiliary capacitor portion C0 integrally formed.

In an exemplary implementation mode, as shown in FIGS. 14 and 15, a shape of the capacitor main body portion C_main is the same as the shape of a second electrode plate C2 in patterns of the second conductive layer of the E0 region and the E1 region. An orthographic projection of the auxiliary capacitor portion C0 on the base substrate is at least partially overlapped with an orthographic projection of the active layer of the fourth transistor on the base substrate.

In an exemplary implementation mode, the auxiliary capacitor portion may serve to level up a data connection block, which may improve a display effect of the display panel.

In an exemplary implementation mode, as shown in FIGS. 12 to 15, the first initial signal line INIL1 and the second initial signal line INIL2 may be of an equal width design, or may be of a non-equal width design, may be straight lines, or may be broken lines, which may not only facilitate a layout of a pixel structure, but also reduce a parasitic capacitance between signal lines, which is not limited here in the present disclosure.

(4) A pattern of a third insulation layer is formed. In an exemplary implementation mode, forming the pattern of the third insulation layer may include: depositing a third insulation thin film on the base substrate on which the above-mentioned patterns are formed, patterning the third insulation thin film using a patterning process to form a third insulation layer covering the second conductive layer, and a plurality of vias are disposed on the third insulation layer, as shown in FIGS. 16 and 17, FIG. 16 is a schematic diagram of the E0 region and the E1 region after the pattern of the third insulation layer is formed, and FIG. 17 is a schematic diagram of the E2 region after the pattern of the third insulation layer is formed.

Figure 16:
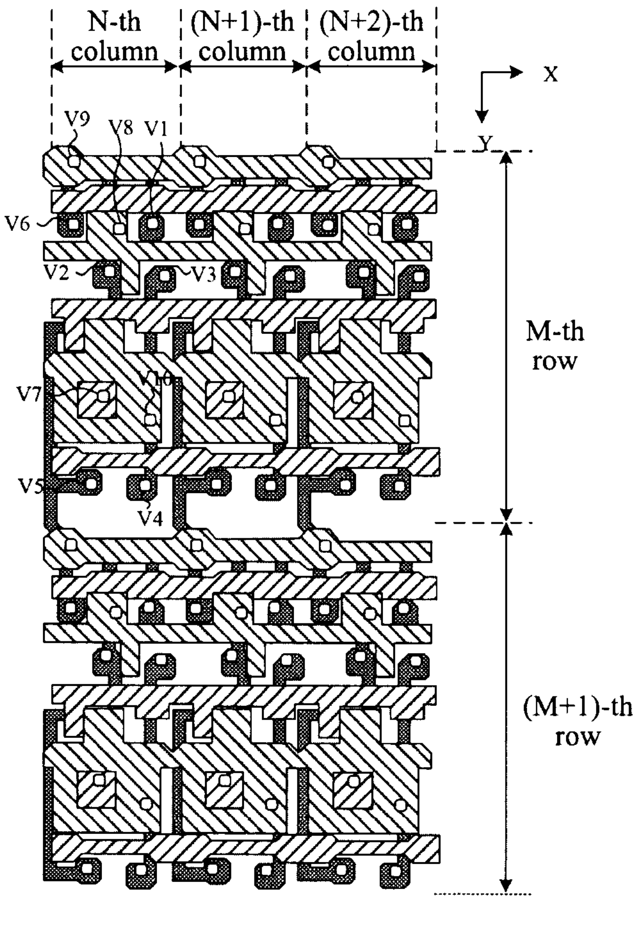
FIG. 16 is a schematic diagram of the E0 region and the E1 region after a pattern of a third insulation layer is formed.
Figure 17:
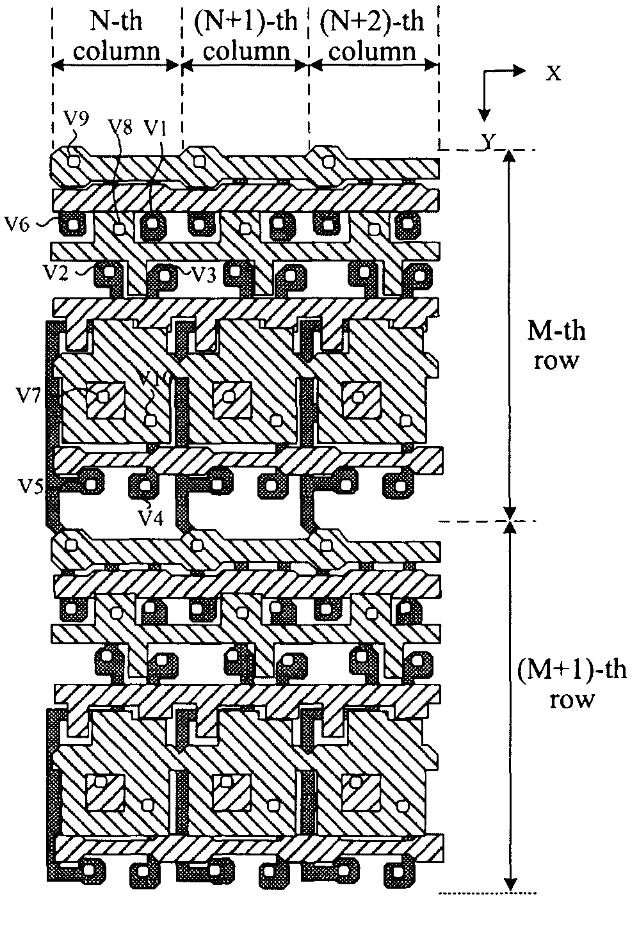
FIG. 17 is a schematic diagram of the E2 region after the pattern of the third insulation layer is formed.

In an exemplary implementation mode, as shown in FIGS. 16 and 17, the plurality of vias in the third insulation layer of the E0 region, the E1 region, and the E2 region may each include a first via V1, a second via V2, a third via V3, a fourth via V4, a fifth via V5, a sixth via V6, a seventh via V7, an eighth via V8, a ninth via V9, and a tenth via V10.

In an exemplary implementation mode, as shown in FIGS. 16 and 17, an orthographic projection of the first via V1 on the base substrate is within a range of an orthographic projection of a first region of the active layer of the first transistor T1 on the base substrate, the first insulation layer and the second insulation layer within the first via V1 are etched away to expose a surface of the first region of the active layer of the first transistor T1, and the first via V1 is configured such that a first electrode of the first transistor T1 subsequently formed is connected with the first region of the active layer of the first transistor T1 through the via.

In an exemplary implementation mode, as shown in FIGS. 16 and 17, an orthographic projection of the second via V2 on the base substrate is within a range of an orthographic projection of a second region of the active layer of the first transistor T1 (which is also a first region of the active layer of the second transistor T2) on the base substrate, the first insulation layer and the second insulation layer within the second via V2 are etched away to expose a surface of the second region of the active layer of the first transistor T1 (which is also the first region of the active layer of the second transistor T2), and the second via V2 is configured such that a second electrode of the first transistor T1 subsequently formed (which is also a first electrode of the second transistor T2) is connected with the first region of the active layer of the first transistor T1 (which is also the first region of the active layer of the second transistor T2) through the via.

In an exemplary implementation mode, as shown in FIGS. 16 and 17, an orthographic projection of the third via V3 on the base substrate is within a range of an orthographic projection of a first region of the active layer of the fourth transistor T4 on the base substrate, the first insulation layer and the second insulation layer within the third via V3 are etched away to expose a surface of the first region of the active layer of the fourth transistor T4, and the third via V3 is configured such that a first electrode of the fourth transistor subsequently formed is connected with the first region of the active layer of the fourth transistor T4 through the via.

In an exemplary implementation mode, as shown in FIGS. 16 and 17, an orthographic projection of the fourth via V4 on the base substrate is within a range of an orthographic projection of a first region of the active layer of the fifth transistor T5 on the base substrate, the first insulation layer and the second insulation layer within the fourth via V4 are etched away to expose a surface of the first region of the active layer of the fifth transistor T5, and the fourth via V4 is configured such that a first electrode of the fifth transistor T5 subsequently formed is connected with the first region of the active layer of the fifth transistor T5 through the via.

In an exemplary implementation mode, as shown in FIGS. 16 and 17, an orthographic projection of the fifth via V5 on the base substrate is within a range of an orthographic projection of a second region of the active layer of the sixth transistor T6 (which is also a second region of the active layer of the seventh transistor T7) on the base substrate, the first insulation layer and the second insulation layer within the fifth via V5 are etched away to expose a surface of the second region of the active layer of the sixth transistor T6 (which is also a second region of the active layer of the seventh crystal T7), and the fifth via V5 is configured such that a second electrode of the sixth transistor T6 subsequently formed (which is also a second electrode of the seventh transistor T7) is connected with the second region of the active layer of the sixth transistor T6 (which is also the second region of the active layer of the seventh transistor T7) through this via.

In an exemplary implementation mode, as shown in FIGS. 16 and 17, an orthographic projection of the sixth via V6 on the base substrate is within a range of an orthographic projection of a first region of the active layer of the seventh transistor T7 on the base substrate, the first insulation layer and the second insulation layer within the sixth via V6 are etched away to expose a surface of the first region of the active layer of the seventh transistor T7, and the sixth via V6 is configured such that a first electrode of the seventh transistor T7 subsequently formed is connected with the first region of the active layer of the seventh transistor T7 through the via.

In an exemplary implementation mode, as shown in FIGS. 16 and 17, an orthographic projection of the seventh via V7 on the base substrate is within a range of an orthographic projection of an opening on the base substrate, the second insulation layer within the seventh via V7 is etched away to expose a surface of a first electrode plate of a first capacitor (which is also a control electrode of the third transistor), and the seventh via V7 is configured such that a second electrode of the first transistor T1 subsequently formed (which is also a first electrode of the second transistor T2) is connected with the first electrode plate of the first capacitor (which is also the control electrode of the third transistor T3) through the via.

In an exemplary implementation mode, as shown in FIGS. 16 and 17, an orthographic projection of the eighth via V8 on the base substrate is within a range of an orthographic projection of the first initial signal line INIL1 on the base substrate, the eighth via V8 exposes a surface of the first initial signal line INIL1, and the eighth via V8 is configured such that a first electrode of the first transistor T1 subsequently formed is connected with the first initial signal line INIL1 through the via.

In an exemplary implementation mode, as shown in FIGS. 16 and 17, an orthographic projection of the ninth via V9 on the base substrate is within a range of an orthographic projection of the second initial signal line INIL2 on the base substrate, the ninth via V9 exposes a surface of the second initial signal line INIL2, and the ninth via V9 is configured such that a first electrode of the seventh transistor subsequently formed is connected with the second initial signal line INIL2 through the via.

In an exemplary implementation mode, as shown in FIGS. 16 and 17, an orthographic projection of the tenth via V10 on the base substrate is within a range of an orthographic projection of a second electrode plate of a capacitor on the base substrate, the tenth via V10 exposes a surface of the second electrode plate of the capacitor, and the tenth via V10 is configured such that a first electrode of the fifth transistor T5 subsequently formed is connected with the second electrode plate of the capacitor through the via. In an exemplary implementation mode, the tenth via V10 may be plural and a plurality of tenth vias V10 may be disposed sequentially along the second direction Y to improve connection reliability.

In an exemplary implementation mode, as shown in FIGS. 16 and 17, patterns of vias of the third insulation layer of the E1 region and the E2 region are substantially the same as patterns of vias of the third insulation layer of the E0 region.

Figure 20:
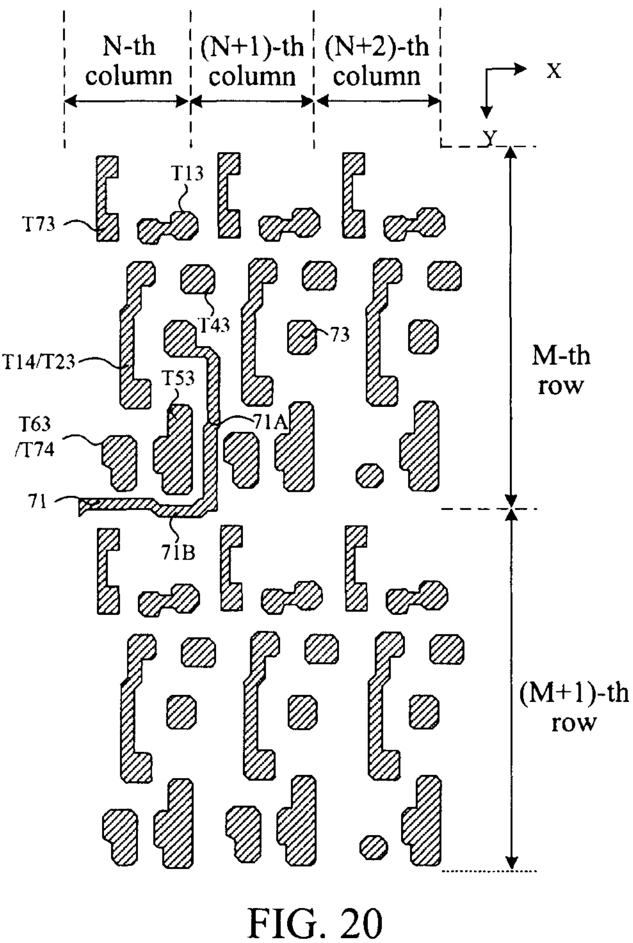
FIG. 20 is a schematic diagram of the pattern of the third conductive layer of the E2 region.
Figure 21:
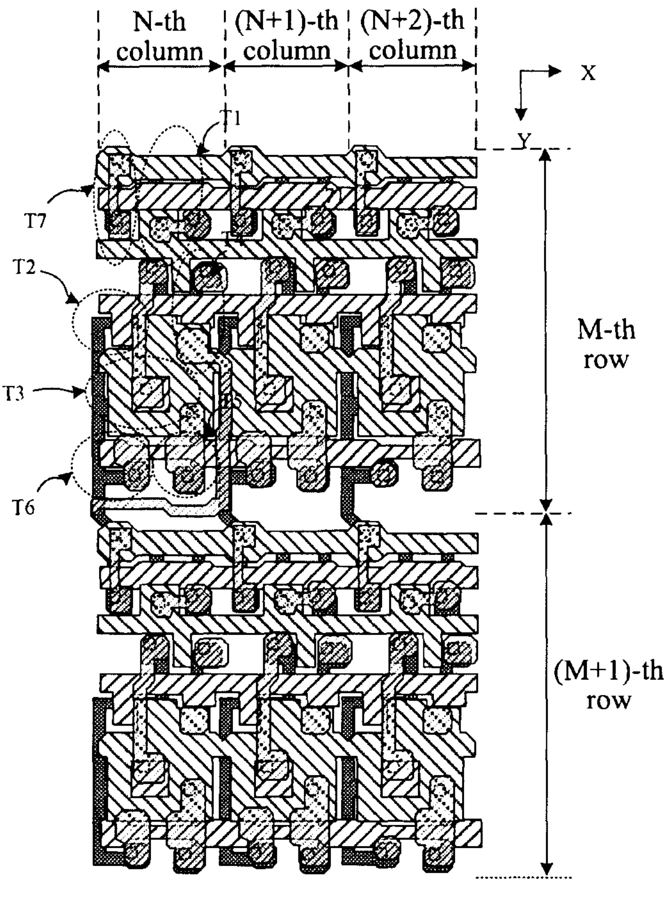
FIG. 21 is a schematic diagram of the E2 region after the pattern of the third conductive layer is formed.

(5) A pattern of a third conductive layer is formed. In an exemplary implementation mode, forming the third conductive layer may include depositing a third conductive thin film on the base substrate on which the above-mentioned patterns are formed, patterning the third conductive thin film using a patterning process to form a third conductive layer disposed on the third insulation layer, as shown in FIGS. 18 to 21, FIG. 18 is a schematic diagram of patterns of the third conductive layer of the E0 region and the E1 region, FIG. 19 is a schematic diagram of the E0 region and the E1 region after the patterns of the third conductive layer are formed, FIG. 20 is a schematic diagram of the pattern of the third conductive layer of the E2 region, and FIG. 21 is a schematic diagram of the E2 region after the pattern of the third conductive layer is formed. In an exemplary implementation mode, the third conductive layer may be referred to as a first source-drain metal (SD1) layer.

In an exemplary implementation mode, as shown in FIGS. 18 to 21, patterns of the third conductive layer of the E0 region, the E1 region, and the E2 region may each include a first electrode T13 and a second electrode T14 of the first transistor, a first electrode T23 of the second transistor, a first electrode T43 of the fourth transistor, a first electrode T53 of the fifth transistor, a second electrode T64 of the sixth transistor, and a first electrode T73 and a second electrode T74 of the seventh transistor.

In an exemplary implementation mode, as shown in FIGS. 18 to 21, the second electrode T14 of the first transistor may simultaneously serve as the first electrode T23 of the second transistor, the second electrode T64 of the sixth transistor may simultaneously serve as the second electrode T74 of the seventh transistor, and the first electrode T13 of the first transistor, the first electrode T43 of the fourth transistor, the first electrode T53 of the fifth transistor, and the first electrode T73 of the seventh transistor may be separately disposed.

In an exemplary implementation mode, as shown in FIGS. 20 and 21, the pattern of the third conductive layer of the E2 region may further include a data connection block 73 and a first connection line 71.

In an exemplary implementation mode, as shown in FIGS. 20 and 21, an orthographic projection of the data connection block 73 on the base substrate is at least partially overlapped with an orthographic projection of the auxiliary capacitor portion on the base substrate.

In an exemplary implementation mode, as shown in FIGS. 20 and 21, the first connection line 71 is connected with the data connection block 73 and has an integrally formed structure.

In an exemplary implementation mode, as shown in FIGS. 20 and 21, the first connection line 71 may include a first data connection portion 71A and a second data connection portion 71B. Among them, the first data connection portion 71A is connected with the data connection block 73 and the second data connection portion 71B respectively, and the data connection block 73 and the second data connection portion 71B are located on a same side of the first data connection portion 71A. An orthographic projection of the first data connection portion 71A on the base substrate is at least partially overlapped with an orthographic projection of the second electrode plate of the capacitor on the base substrate.

In an exemplary implementation mode, as shown in FIGS. 20 and 21, a main body portion of the first data connection portion 71A may have a shape of a line extending along the second direction Y and a main body portion of the second data connection portion 71B may have a shape of a line extending along the first direction X.

In an exemplary implementation mode, as shown in FIGS. 18 to 21, the first electrode T13 of the first transistor may have a shape of a line of which a main body portion extends along the first direction X, and the first electrode T13 of the first transistor may be located between the scan signal line GL and the reset signal line RL. An orthographic projection of the first electrode T13 of the first transistor on the base substrate may be partially overlapped with orthographic projections of the first via and the first initial signal line INIL1 on the base substrate. The first electrode T13 of the first transistor is connected with the first region of the active layer of the first transistor through the first via and is connected with the first initial signal line INIL1 through the eighth via.

In an exemplary implementation mode, as shown in FIGS. 18 to 21, the second electrode T14 of the first transistor (which is also the first electrode T23 of the second transistor) may have a shape of a line extending along the second direction Y, and the second electrode T14 of the first transistor (which is also the first electrode T13 of the second transistor) may be located on a side of the first initial signal line INIL1 away from the reset signal line RL. An orthographic projection of the second electrode T14 of the first transistor (which is also the first electrode T13 of the second transistor) on the base substrate may be at least partially overlapped with orthographic projections of the second via, the seventh via, and the first electrode plate and the second electrode plate of the first capacitor on the base substrate. The second electrode T14 of the first transistor (which is also the first electrode T23 of the second transistor) is connected with the second region of the active layer of the first transistor (which is also the first region of the active layer of the second transistor) through the second via, and is connected with the first electrode plate of the first capacitor through the seventh via.

In an exemplary implementation mode, as shown in FIGS. 18 to 21, a shape of the first electrode T43 of the fourth transistor may be a block structure, and the first electrode T43 of the fourth transistor may be located between the first initial signal line INIL1 and the scan signal line GL. An orthographic projection of the first electrode T43 of the fourth transistor on the base substrate is at least partially overlapped with the third via. The first electrode of the fourth transistor is connected with the first region of the active layer of the fourth transistor through the third via.

In an exemplary implementation mode, as shown in FIGS. 18 to 21, the second electrode T64 of the sixth transistor (the second electrode T74 of the seventh transistor) and the first electrode T53 of the fifth transistor are located on both sides of the second electrode T14 of the first transistor (which is also the first electrode T23 of the second transistor), respectively.

In an exemplary implementation mode, as shown in FIGS. 18 to 21, the first electrode T53 of the fifth transistor may have a shape of a line extending along the second direction Y, and a first electrode T53 of a fifth transistor of a circuit unit of an M-th row may be located between a scan signal line GL of the circuit unit of the M-th row and a second initial signal line INIL2 of a circuit unit of an (M+1)-th row. An orthographic projection of the first electrode T53 of the fifth transistor on the base substrate may be at least partially overlapped with orthographic projections of the fourth via, the tenth via, a light emitting signal line, and the second electrode plate of the capacitor on the base substrate. The first electrode T53 of the fifth transistor is connected with the first region of the active layer of the fifth transistor through the fourth via, and is connected with an orthographic projection of the second electrode plate of the capacitor on the base substrate through the tenth via.

In an exemplary implementation mode, as shown in FIGS. 18 to 21, the second electrode T64 of the sixth transistor (the second electrode T74 of the seventh transistor) may be of a block structure. A second electrode T64 of a sixth transistor (a second electrode T74 of a seventh transistor) of a circuit unit of an M-th row may be located between a scan signal line GL of the circuit unit of the M-th row and a second initial signal line INIL2 of a circuit unit of an (M+1)-th row. An orthographic projection of the second electrode T64 of the sixth transistor (the second electrode T74 of the seventh transistor) on the base substrate may be at least partially overlapped with an orthographic projection of the fifth via on the base substrate. The second electrode T64 of the sixth transistor (the second electrode T74 of the seventh transistor) is connected with the second region of the active layer of the sixth transistor (which is also the second region of the active layer of the seventh transistor) through the fifth via.

In an exemplary implementation mode, as shown in FIGS. 18 to 21, an orthographic projection of a second electrode T64 of a sixth transistor (a second electrode T74 of a seventh transistor) of a dummy pixel circuit on the base substrate is not overlapped with an orthographic projection of a light emitting signal line on the base substrate. An orthographic projection of the second electrode T64 of the sixth transistor (the second electrode T74 of the seventh transistor) of the pixel circuit on the base substrate is at least partially overlapped with an orthographic projection of the light emitting signal line on the base substrate.

In an exemplary implementation mode, as shown in FIGS. 18 to 21, the first electrode T73 of the seventh transistor may have a shape of a line extending along the second direction Y. The first electrode T73 of the seventh transistor is located on a side of the first initial signal line INIL1 away from the scan signal line GL. An orthographic projection of the first electrode T73 of the seventh transistor on the base substrate is at least partially overlapped with orthographic projections of the sixth via, the ninth via, the reset signal line RL, and the second initial signal line INIL2 on the base substrate. The first electrode of the seventh transistor is connected with the first region of the active layer of the seventh transistor through the sixth via, and is connected with the second initial signal line through the ninth via.

Figure 18:
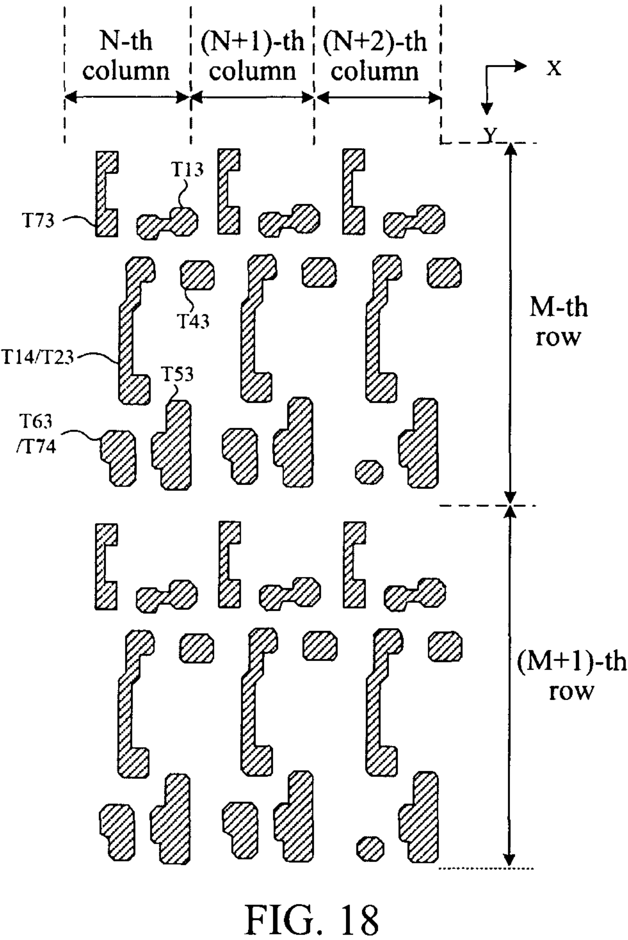
FIG. 18 is a schematic diagram of a pattern of a third conductive layer of the E0 region and the E1 region.
Figure 19:
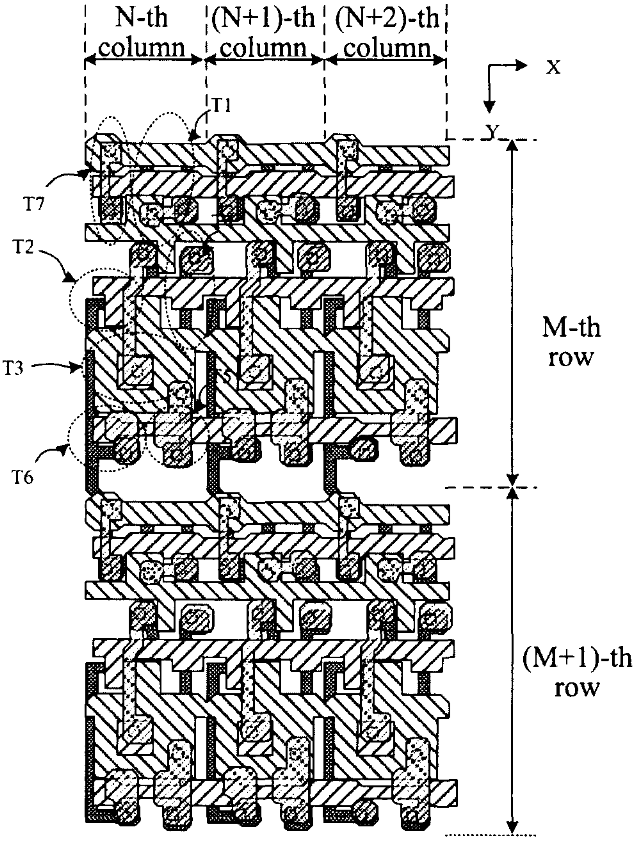
FIG. 19 is a schematic diagram of the E0 region and the E1 region after the pattern of the third conductive layer is formed.

In an exemplary implementation mode, as shown in FIGS. 18 and 19, the pattern of the third conductive layer of the E1 region is substantially the same as the pattern of the third conductive layer of the E0 region.

(6) A fourth insulation layer is formed. In an exemplary implementation mode, forming a pattern of the fourth insulation layer may include depositing a fourth insulation thin film on the base substrate on which the above-mentioned patterns are formed, patterning the fourth insulation thin film using a patterning process to form a fourth insulation layer covering the third conductive layer, and a plurality of vias are disposed on the fourth insulation layer, as shown in FIGS. 22 and 23, wherein FIG. 22 is a schematic diagram of the E0 region and the E1 region after the pattern of the fourth insulation layer is formed, and FIG. 23 is a schematic diagram of the E2 region after the pattern of the fourth insulation layer is formed.

Figure 22:
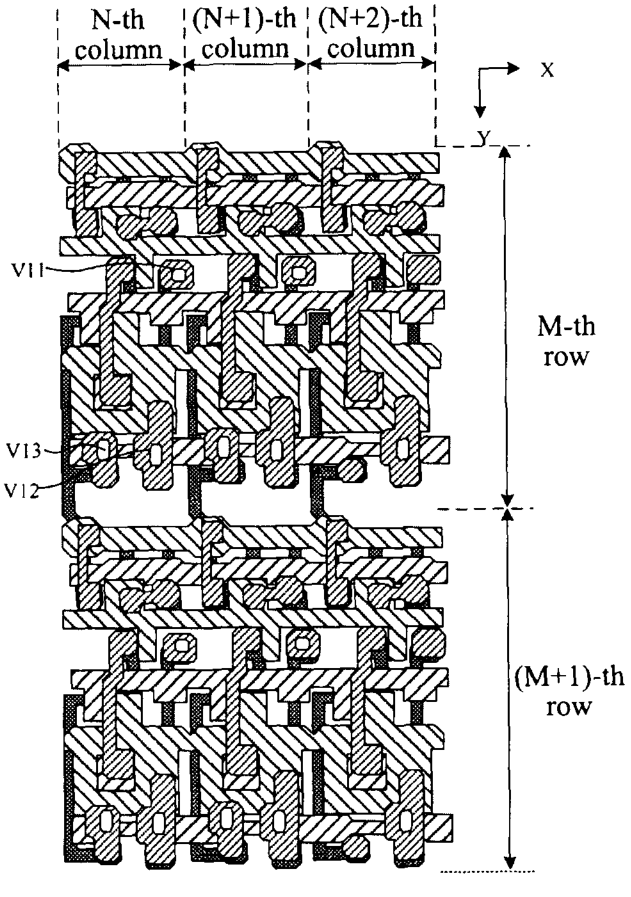
FIG. 22 is a schematic diagram of the E0 region and the E1 region after a pattern of a fourth insulation layer is formed.
Figure 23:
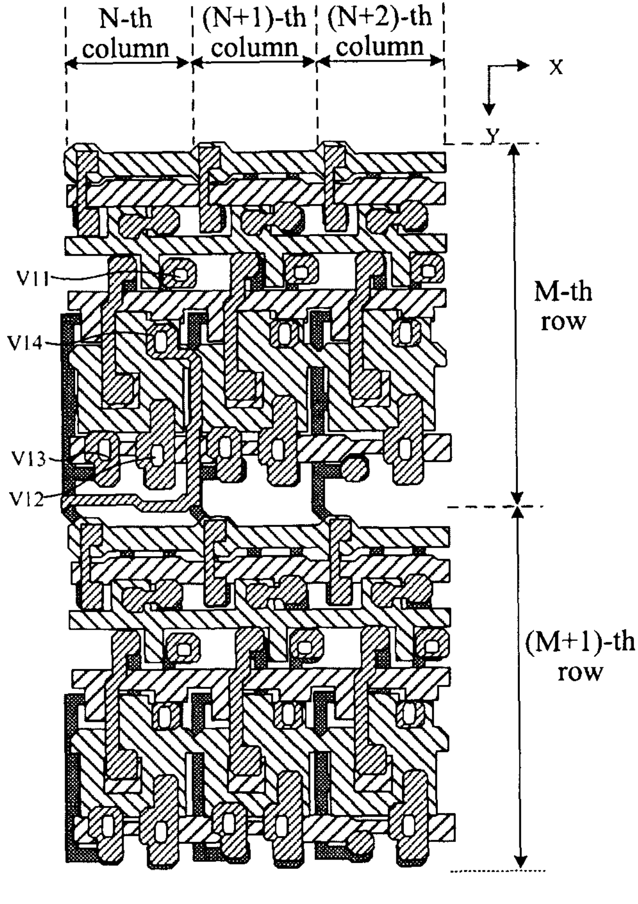
FIG. 23 is a schematic diagram of the E2 region after the pattern of the fourth insulation layer is formed.

In an exemplary implementation mode, as shown in FIGS. 22 and 23, the plurality of vias of patterns of the fourth insulation layer of the E0 region, the E1 region, and the E2 region may each include an eleventh via V11, a twelfth via V12, and a thirteenth via V13.

In an exemplary implementation mode, as shown in FIG. 23, the plurality of vias of the pattern of the fourth insulation layer of the E2 region may further include a fourteenth via V14.

In an exemplary implementation mode, as shown in FIGS. 22 and 23, an orthographic projection of the eleventh via V11 on the base substrate is within a range of orthographic projections of the first electrode of the fourth transistor in a drive circuit unit in the E0 region and the E1 region and a drive circuit unit and a dummy circuit unit in the E2 region on the base substrate, the eleventh via V11 exposes the first electrode of the fourth transistor in the drive circuit unit in the E0 region and the E1 region and the drive circuit unit and the dummy circuit unit in the E2 region, the eleventh via V11 is configured such that a subsequently formed first connection electrode is connected with the first electrode of the fourth transistor in the drive circuit unit in the E0 region and the E1 region and the drive circuit unit and the dummy circuit unit in the E2 region through the via.

In an exemplary implementation mode, as shown in FIGS. 22 and 23, an orthographic projection of the twelfth via V12 on the base substrate is within a range of an orthographic projection of the first electrode of the fifth transistor on the base substrate, and the twelfth via V12 exposes the first electrode of the fifth transistor. The twelfth via V12 of the E0 region is configured such that a subsequently formed third connection electrode is connected with the first electrode of the fifth transistor through the via. The twelfth via V12 of the E1 region is configured such that a subsequently formed first sub-high-voltage power supply line is connected with the first electrode of the fifth transistor through the via. The twelfth via V12 located in the E2 region is configured such that a subsequently formed third high-voltage power supply line is connected with the first electrode of the fifth transistor through the via.

In an exemplary implementation mode, as shown in FIGS. 22 and 23, an orthographic projection of the thirteenth via V13 on the base substrate is within a range of orthographic projections of the second electrode of the sixth transistor (the second electrode of the seventh transistor) in a drive circuit unit of the E0 region, the E1 region, and the E2 region on the base substrate, and the thirteenth via V13 exposes the second electrode of the sixth transistor (the second electrode T74 of the seventh transistor) in the drive circuit unit of the E0 region, the E1 region, and the E2 region. The thirteenth via V13 is configured such that a subsequently formed second connection electrode is connected with the second electrode of the sixth transistor (the second electrode of the seventh transistor) in the drive circuit unit of the E0 region, the E1 region, and the E2 region through the via.

In an exemplary implementation mode, as shown in FIG. 23, an orthographic projection of the fourteenth via V14 on the base substrate is within a range of an orthographic projection of a data connection block on the base substrate, the fourteenth via V14 exposes the data connection block, and the fourteenth via V14 is configured such that a subsequently formed fourth connection electrode is connected with the data connection block through the via.

In an exemplary implementation mode, as shown in FIG. 22, the pattern of the fourth insulation layer of the E1 region is substantially the same as the pattern of the fourth insulation layer of the E0 region.

Figure 24A:
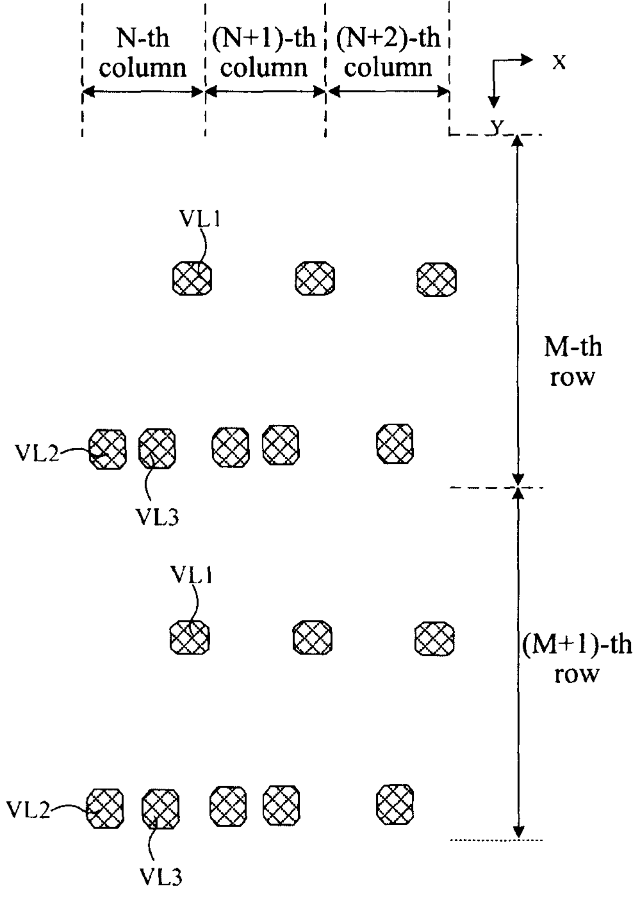
FIG. 24A is a schematic diagram I of a pattern of a fourth conductive layer of the E0 region.
Figure 24B:
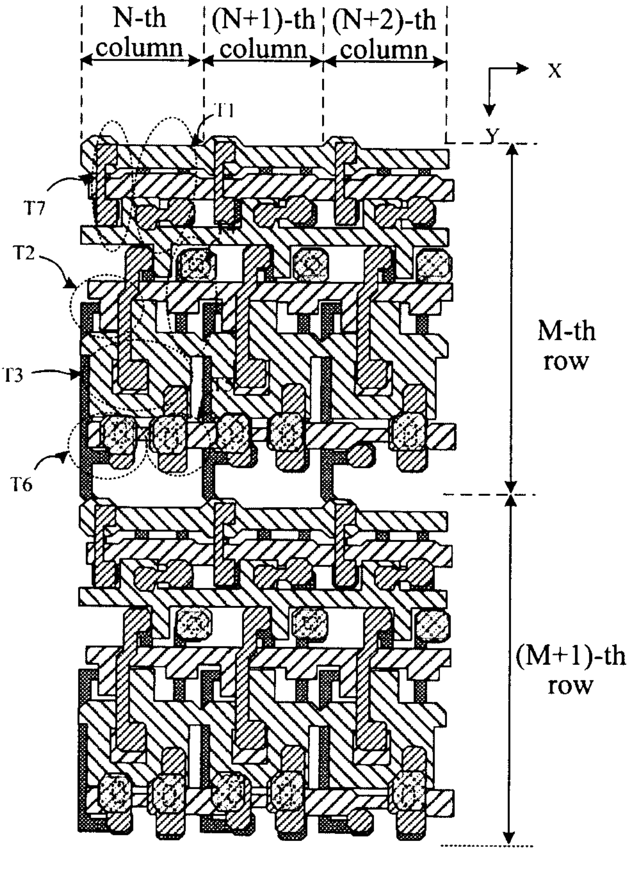
FIG. 24B is a schematic diagram I of the E0 region after the pattern of the fourth conductive layer is formed.
Figure 25A:
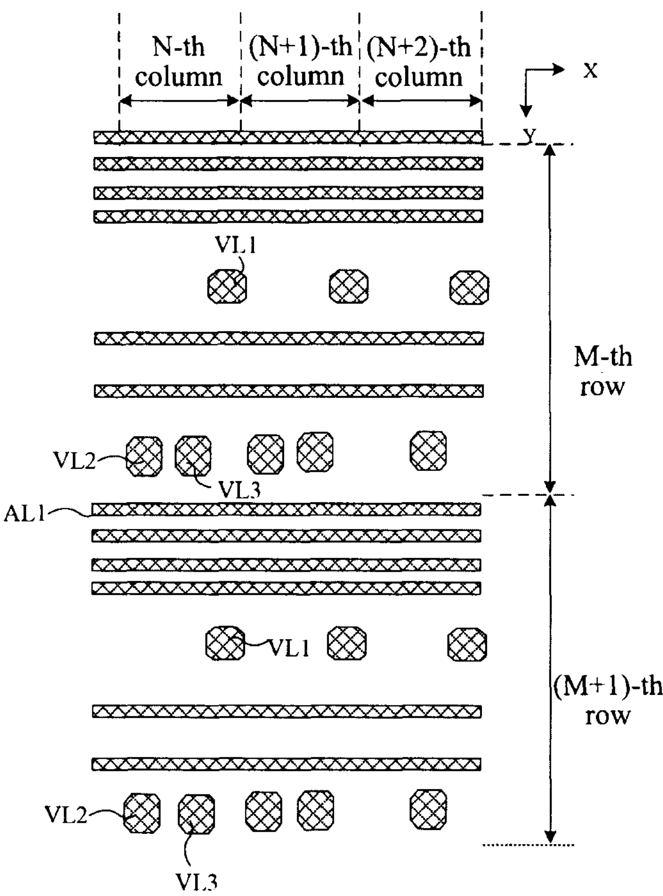
FIG. 25A is a schematic diagram II of the pattern of the fourth conductive layer of the E0 region.
Figure 25B:
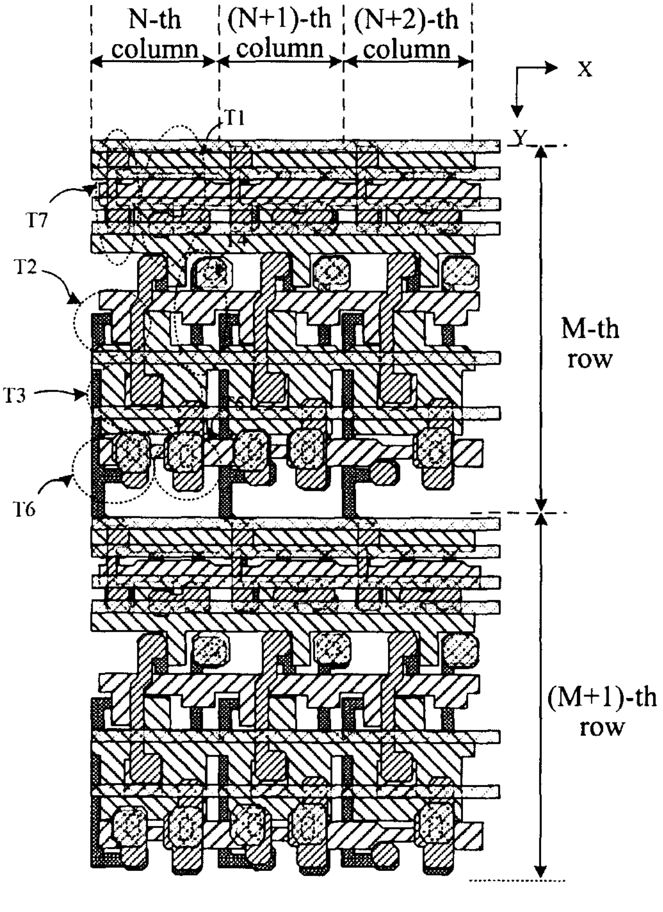
FIG. 25B is a schematic diagram II of the E0 region after the pattern of the fourth conductive layer is formed.
Figure 26:
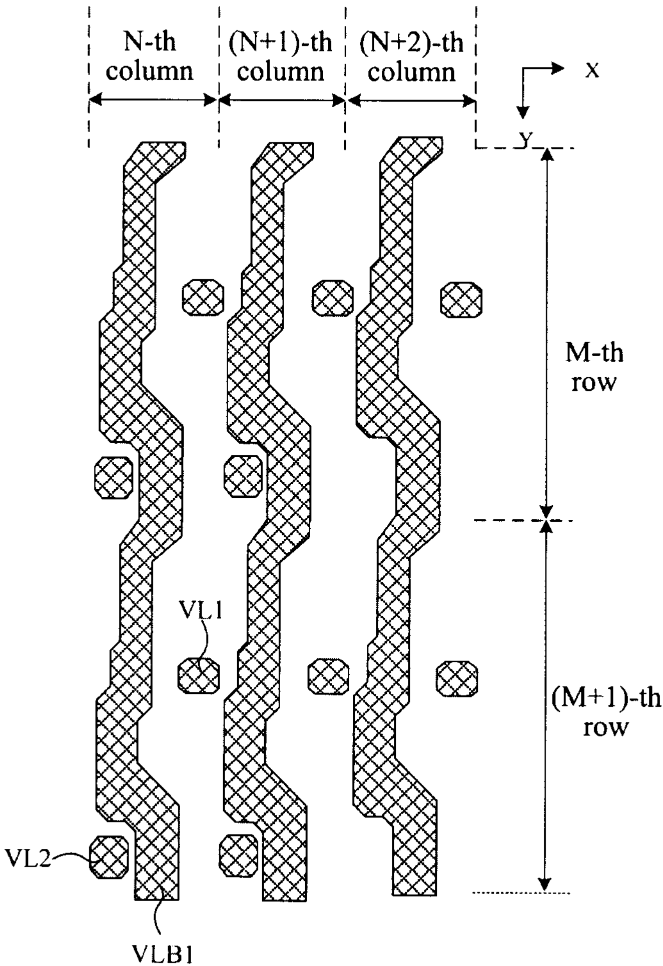
FIG. 26 is a schematic diagram of the pattern of the fourth conductive layer of the E1 region.
Figure 27:
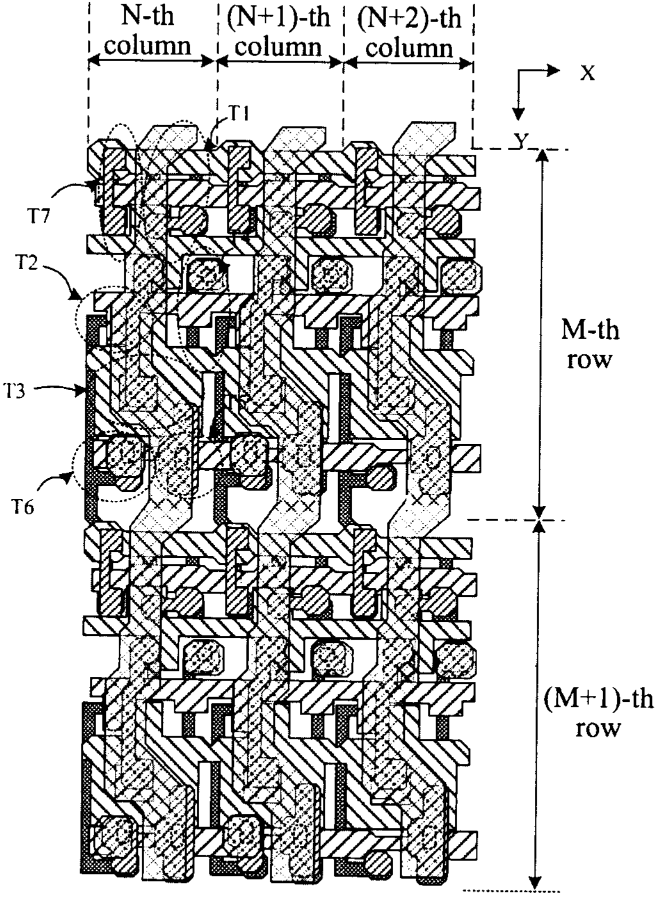
FIG. 27 is a schematic diagram of the E1 region after the pattern of the fourth conductive layer is formed.
Figure 28:
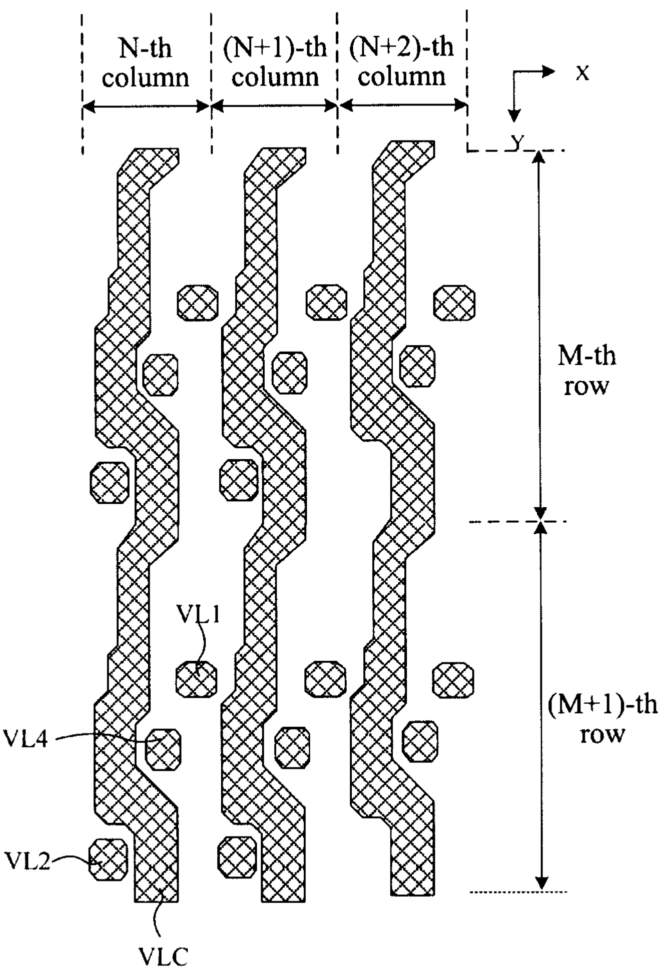
FIG. 28 is a schematic diagram of the pattern of the fourth conductive layer of the E2 region.

(7) A pattern of a fourth conductive layer is formed. In an exemplary implementation mode, forming the pattern of the fourth conductive layer may include: depositing a fourth conductive thin film on the base substrate on which the above-mentioned patterns are formed, patterning the fourth conductive thin film using a patterning process to form a fourth conductive layer disposed on the fourth insulation layer, as shown in FIGS. 24A, 24B, 25A, 25B, and 26 to 29, FIG. 24A is a schematic diagram I of the pattern of the fourth conductive layer of the E0 region, FIG. 24B is a schematic diagram I of the E0 region after the pattern of the fourth conductive layer is formed, FIG. 25A is a schematic diagram II of the pattern of the fourth conductive layer of the E0 region, FIG. 25B is a schematic diagram II of the E0 region after the pattern of the fourth conductive layer is formed, FIG. 26 is a schematic diagram of the pattern of the fourth conductive layer of the E1 region, FIG. 27 is a schematic diagram of the E1 region after the pattern of the fourth conductive layer is formed, FIG. 28 is a schematic diagram of the pattern of the fourth conductive layer of the E2 region, and FIG. 29 a schematic diagram of the E2 region after the pattern of the fourth conductive layer is formed. In an exemplary implementation mode, the fourth conductive layer may be referred to as an intermediate source-drain metal (SDM) layer. FIGS. 24A and 24B are illustrated by taking a case that the fourth conductive layer does not include a first anode connection line as an example, and FIGS. 25A and 25B are illustrated by taking a case that the fourth conductive layer includes a first anode connection line as an example.

In an exemplary implementation mode, as shown in FIGS. 24A to 29, patterns of the fourth conductive layer of the E0 region, the E1 region, and the E2 region may each include a first connection electrode VL1 and a second connection electrode VL2.

In an exemplary implementation mode, as shown in FIGS. 24A and 24B, the pattern of the fourth conductive layer of the E0 region may further include a third connection electrode VL3.

In an exemplary implementation mode, as shown in FIGS. 25A and 25B, the pattern of the fourth conductive layer of the E0 region may further include a third connection electrode VL3 and a plurality of first anode connection lines AL1.

In an exemplary implementation mode, as shown in FIGS. 26 and 27, the pattern of the fourth conductive layer of the E1 region may further include a first sub-high-voltage power supply line VLB1 in a second high-voltage power supply line.

Figure 29:
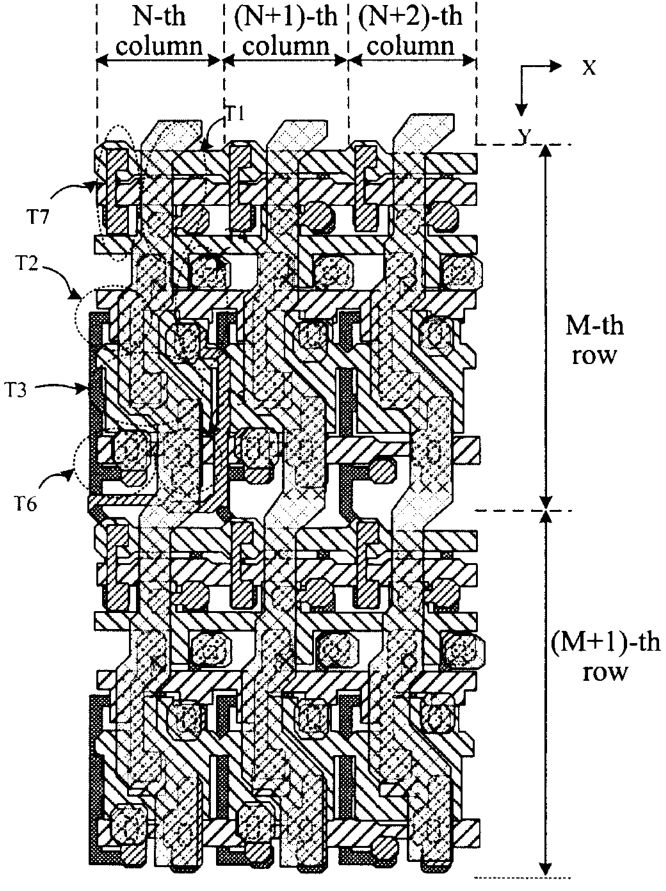
FIG. 29 a schematic diagram of the E2 region after the pattern of the fourth conductive layer is formed.

In an exemplary implementation mode, as shown in FIGS. 28 and 29, the pattern of the fourth conductive layer of the E2 region may further include a third high-voltage power supply line VLC and a fourth connection electrode VL4.

In an exemplary implementation mode, as shown in FIGS. 24A to 29, a shape of the first connection electrode VL1 may be a block structure. An orthographic projection of the first connection electrode VL1 on the base substrate may be partially overlapped with the orthographic projection of the eleventh via on the base substrate. The first connection electrode VL1 is connected with the first electrode of the fourth transistor in the drive circuit unit in the E0 region and the E1 region and the drive circuit unit and the dummy circuit unit in the E2 region through the eleventh via.

In an exemplary implementation mode, the first connection electrode plays a role of undertaking and receiving a data signal line and the first electrode of the fourth transistor and reliability of the display panel is improved since unreliability a connection caused by opening a relatively deep via is avoided.

In an exemplary implementation mode, as shown in FIGS. 24A to 29, a shape of the second connection electrode VL2 may be a block structure. An orthographic projection of the second connection electrode VL2 on the base substrate may be partially overlapped with an orthographic projection of the thirteenth via on the base substrate. The second connection electrode VL2 is connected with the second electrode of the sixth transistor (the second electrode of the seventh transistor) in the drive circuit unit of the E0 region, the E1 region, and the E2 region through the thirteenth via.

In an exemplary implementation mode, the second connection electrode plays a role of undertaking and receiving the fifth connection electrode and the second electrode of the sixth transistor (the second electrode of the seventh transistor), and reliability of the display panel is improved since unreliability of a connection caused by opening a relatively deep via is avoided.

In an exemplary implementation mode, as shown in FIGS. 24A, 24B, 25A, and 25B, a shape of the third connection electrode VL3 may be a block structure. An orthographic projection of the third connection electrode VL3 on the base substrate may be partially overlapped with the orthographic projection of the twelfth via on the base substrate. The third connection electrode VL3 is connected with the first electrode of the fifth transistor through the twelfth via.

In an exemplary implementation mode, the third connection electrode plays a role of undertaking and receiving the first high-voltage power supply line and the first electrode of the fifth transistor, and reliability of the display panel is improved since unreliability of a connection caused by opening a relatively deep via is avoided.

In an exemplary implementation mode, as shown in FIGS. 25A and 25B, the first anode connection line AL1 may have a shape of a line extending along the first direction X. Orthographic projections of the plurality of first anode connection lines AL1 on the base substrate may be overlapped with orthographic projections of the first electrode of the seventh transistor and the second electrode plate of the capacitor in the E0 region on the base substrate. The first anode connection line AL1 is configured to be connected with an anode of a subsequently formed light emitting device.

In an exemplary implementation mode, as shown in FIGS. 26 and 27, the first sub-high-voltage power supply line VLB1 may have a shape of a broken line of which a main body portion extends along the second direction Y, and the first sub-high-voltage power supply line VLB1 is configured to provide a high power supply voltage signal to the first electrode of the fifth transistor. An orthographic projection of the first sub-high-voltage power supply line VLB1 on the base substrate is partially overlapped with orthographic projections of the twelfth via and the second electrode of the first transistor (which is also the first electrode of the second transistor) on the base substrate, respectively. The first sub-high-voltage power supply line VLB1 is connected with the first electrode of the fifth transistor through the twelfth via.

In an exemplary implementation mode, as shown in FIGS. 28 and 29, the third high-voltage power supply line VLC may have a shape of a broken line of which a main body portion extends along the second direction Y, and the third high-voltage power supply line VLC is configured to provide a high power supply voltage signal to the first electrode of the fifth transistor of the E2 region. An orthographic projection of the third high-voltage power supply line VLC on the base substrate is partially overlapped with orthographic projections of the twelfth via and the second electrode of the first transistor (which is also the first electrode of the second transistor) on the base substrate, respectively. The third high-voltage power supply line VLC is connected with the first electrode of the fifth transistor through the twelfth via.

In an exemplary implementation mode, the pattern of the third high-voltage power supply line VLC is substantially the same as that of the first sub-high-voltage power supply line VLB1 and they are connected with each other. The third high-voltage power supply line VLC and the first sub-high-voltage power supply line VLB1 are of an integrally formed structure.

In an exemplary implementation mode, a length of the third high-voltage power supply line along the first direction X may be approximately equal to a length of the first sub-high-voltage power supply line VLB1 along the first direction X.

In an exemplary implementation mode, as shown in FIGS. 28 and 29, a shape of the fourth connection electrode VL4 may be a block structure. An orthographic projection of the fourth connection electrode VL4 on the base substrate may be at least partially overlapped with an orthographic projection of the data connection block on the base substrate. The fourth connection electrode VL4 is connected with the data connection block through the fourteenth via.

In an exemplary implementation mode, the fourth connection electrode plays a role of undertaking and receiving the data connection block and the second connection line, and reliability of the display panel is improved since unreliability of a connection caused by opening a relatively deep via is avoided.

(8) A pattern of a first planarization layer is formed. In an exemplary implementation mode, forming the pattern of the first planarization layer may include: coating a first planarization thin film on the base substrate on which the above-mentioned patterns are formed, patterning the first planarization thin film using a patterning process to form a first planarization layer covering the fourth conductive layer, wherein the first planarization layer is provided with a plurality of vias, as shown in FIGS. 30 to 32, wherein FIG. 30 is a schematic diagram of the E0 region after the pattern of the first planarization layer is formed, FIG. 31 is a schematic diagram of the E1 region after the pattern of the first planarization layer is formed, and FIG. 32 is a schematic diagram of the E2 region after the pattern of the first planarization layer is formed.

Figure 30:
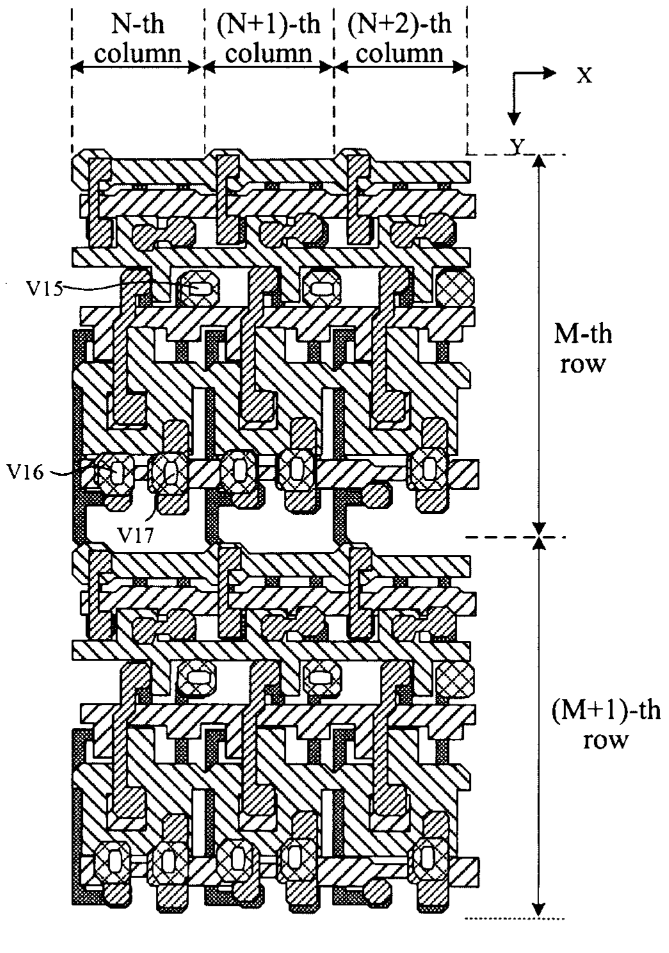
FIG. 30 is a schematic diagram of the E0 region after a pattern of a first planarization layer is formed.
Figure 31:
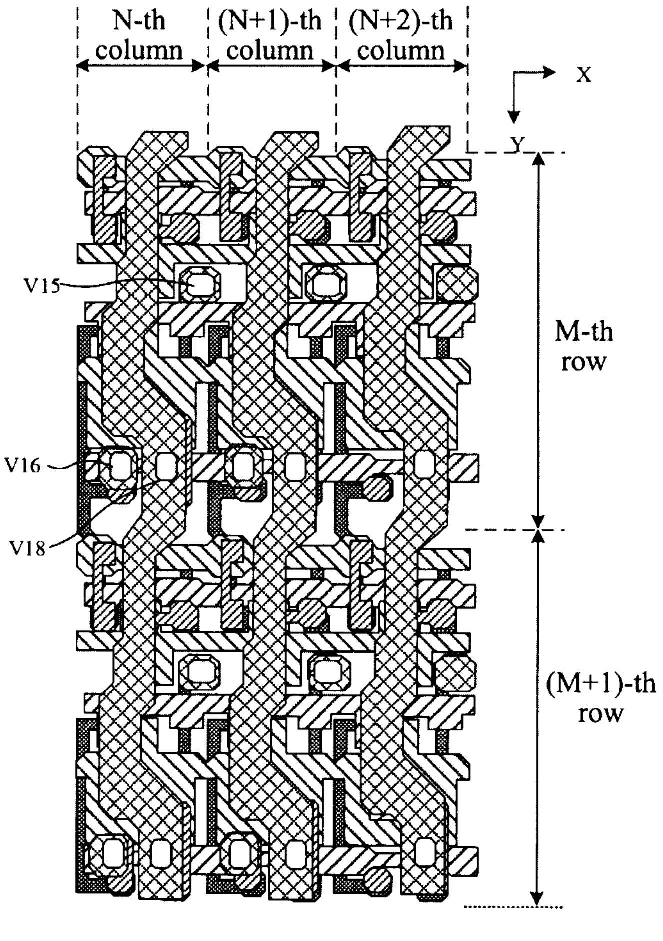
FIG. 31 is a schematic diagram of the E1 region after the pattern of the first planarization layer is formed.
Figure 32:
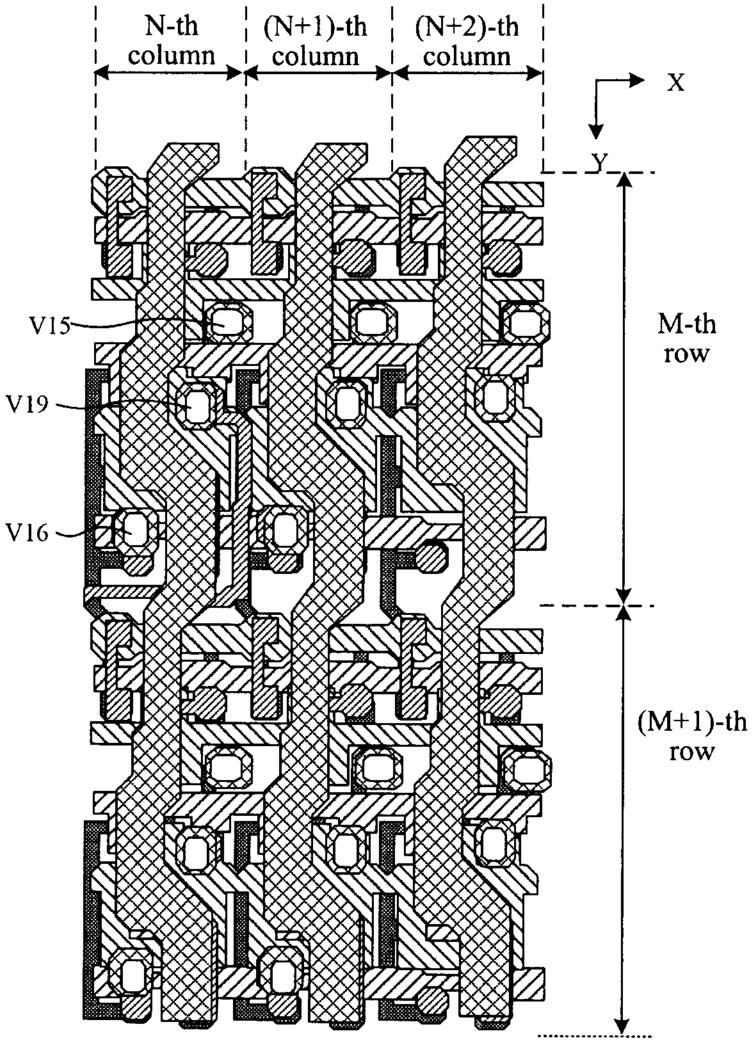
FIG. 32 is a schematic diagram of the E2 region after the pattern of the first planarization layer is formed.

In an exemplary implementation mode, as shown in FIGS. 30 to 32, a plurality of vias of patterns of the first planarization layer of the E0 region, the E1 region, and the E2 region may each include a fifteenth via V15 and a sixteenth via V16.

In an exemplary implementation mode, as shown in FIG. 30, the plurality of vias of the pattern of the first planarization layer of the E0 region may further include a seventeenth via V17.

In an exemplary implementation mode, as shown in FIG. 31, the plurality of vias of the pattern of the first planarization layer of the E1 region may further include an eighteenth via V18.

In an exemplary implementation mode, as shown in FIG. 32, the plurality of vias of the pattern of the first planarization layer of the E2 region may further include a nineteenth via V19.

In an exemplary implementation mode, as shown in FIGS. 30 to 32, an orthographic projection of the fifteenth via V15 on the base substrate is within a range of an orthographic projection of the first connection electrode on the base substrate, the fifteenth via V15 exposes the first connection electrode, and the fifteenth via V15 is configured such that a subsequently formed data signal line is connected with the first connection electrode through the via.

In an exemplary implementation mode, as shown in FIGS. 30 to 32, an orthographic projection of the sixteenth via V16 on the base substrate is within a range of an orthographic projection of the second connection electrode on the base substrate, the sixteenth via V16 exposes the second connection electrode, and the sixteenth via V16 is configured such that a subsequently formed fifth connection electrode is connected with the second connection electrode through the via.

In an exemplary implementation mode, as shown in FIG. 30, an orthographic projection of the seventeenth via V17 on the base substrate is within a range of an orthographic projection of the third connection electrode on the base substrate, and the seventeenth via V17 exposes the third connection electrode. The seventeenth via V17 is configured such that a subsequently formed first high-voltage power supply line is connected with the third connection electrode through the via.

In an exemplary implementation mode, as shown in FIG. 31, an orthographic projection of the eighteenth via V18 on the base substrate is within a range of an orthographic projection of the first sub-high-voltage power supply line of the second high-voltage power supply line on the base substrate, and the eighteenth via V18 exposes the first sub-high-voltage power supply line. The eighteenth via V18 is configured such that a second sub-high-voltage power supply line of the second high-voltage power supply line subsequently formed is connected with the first sub-high-voltage power supply line of the second high-voltage power supply line through the via.

In an exemplary implementation mode, as shown in FIG. 32, an orthographic projection of the nineteenth via V19 on the base substrate is within a range of an orthographic projection of the fourth connection electrode on the base substrate, and the nineteenth via V19 exposes the fourth connection electrode. The nineteenth via V19 is configured such that a subsequently formed second connection line is connected with the fourth connection electrode through the via.

Figure 33:
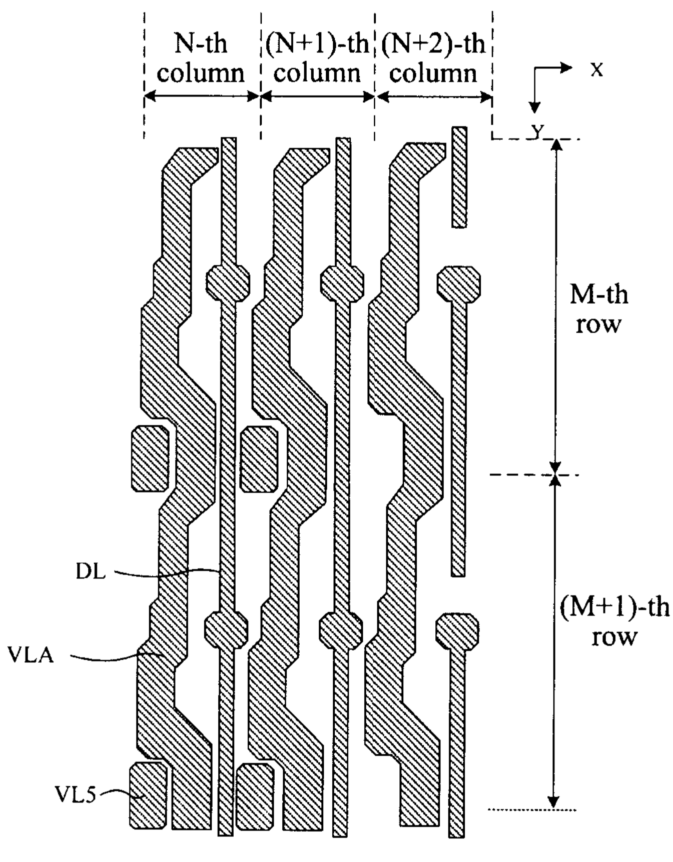
FIG. 33 is a schematic diagram of a pattern of a fifth conductive layer of the E0 region.
Figure 34:
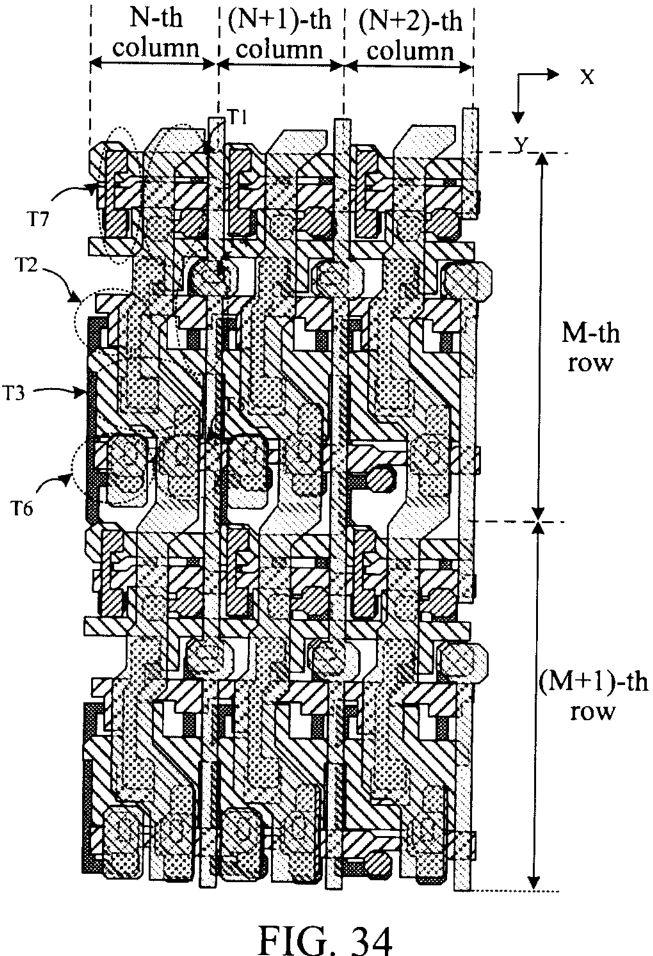
FIG. 34 is a schematic diagram of the E0 region after the pattern of the fifth conductive layer is formed.
Figure 35:
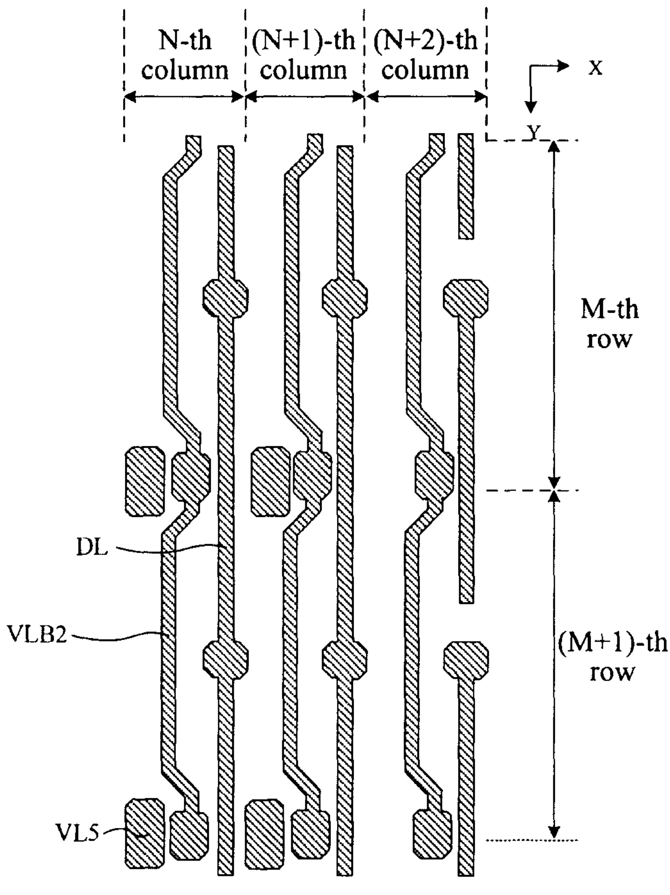
FIG. 35 is a schematic diagram of the pattern of the fifth conductive layer of the E1 region.
Figure 36:
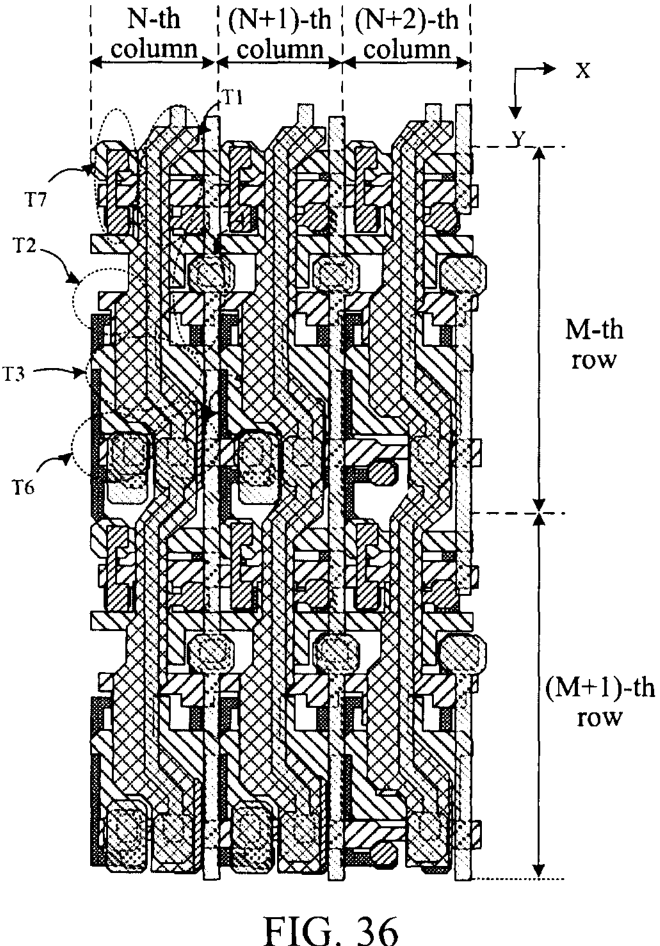
FIG. 36 is a schematic diagram of the E1 region after the pattern of the fifth conductive layer is formed.
Figure 37:
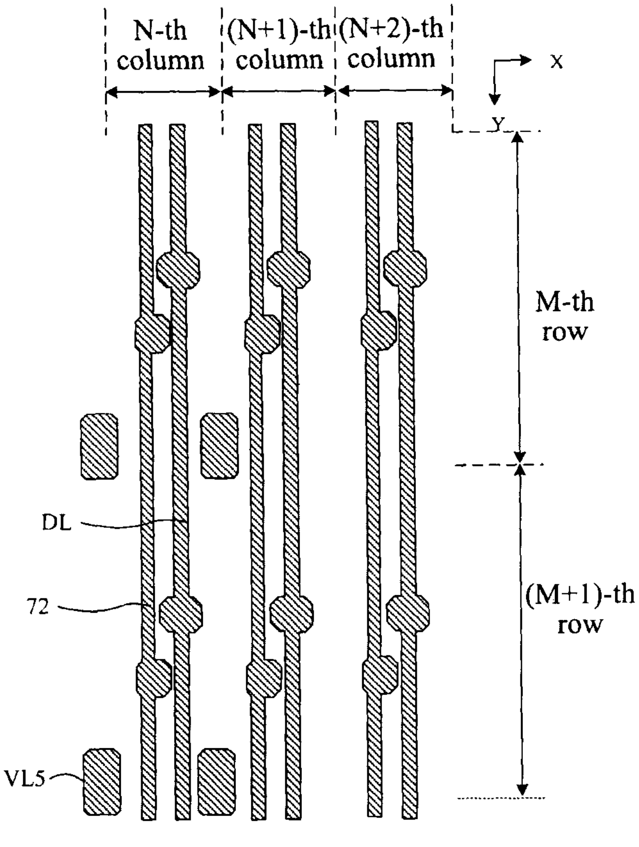
FIG. 37 is a schematic diagram of the pattern of the fifth conductive layer of the E2 region.
Figure 38:
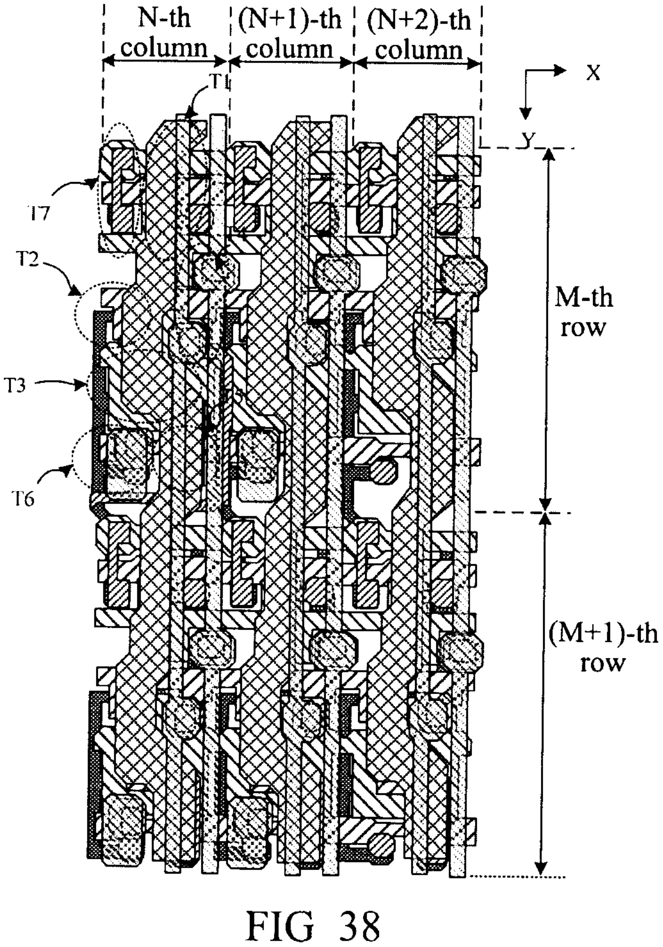
FIG. 38 is a schematic diagram of the E2 region after the pattern of the fifth conductive layer is formed.

(9) A pattern of a fifth conductive layer is formed. In an exemplary implementation mode, forming the pattern of the fifth conductive layer may include: depositing a fifth conductive thin film on the base substrate on which the above-mentioned patterns are formed, patterning the fifth conductive thin film using a patterning process to form a fifth conductive layer disposed on the first planarization layer, FIG. 33 is a schematic diagram of the pattern of the fifth conductive layer of the E0 region, FIG. 34 is a schematic diagram of the E0 region after the pattern of the fifth conductive layer is formed, FIG. 35 is a schematic diagram of the pattern of the fifth conductive layer of the E1 region, FIG. 36 is a schematic diagram of the E1 region after the pattern of the fifth conductive layer is formed, FIG. 37 is a schematic diagram of the pattern of the fifth conductive layer of the E2 region, and FIG. 38 is a schematic diagram of the E2 region after the pattern of the fifth conductive layer is formed. In an exemplary implementation mode, the fifth conductive layer may be referred to as a second source-drain metal (SD2) layer.

In an exemplary implementation mode, as shown in FIGS. 33 to 38, patterns of the fifth conductive layer of the E0 region, the E1 region, and the E2 region may each include a data signal line DL and a fifth connection electrode VL5.

In an exemplary implementation mode, as shown in FIGS. 33 and 34, the pattern of the fifth conductive layer of the E0 region may further include a first high-voltage power supply line VLA.

In an exemplary implementation mode, as shown in FIGS. 35 and 36, the pattern of the fifth conductive layer of the E1 region may further include a second sub-high-voltage power supply line VLB2.

In an exemplary implementation mode, as shown in FIGS. 37 and 38, the pattern of the fifth conductive layer of the E2 region may further include a second connection line 72.

In an exemplary implementation mode, as shown in FIGS. 33 to 38, data signal lines DL located in the E0 region to the E2 region and connected with drive circuit units of a same column are connected with each other and are a same data signal line. Data signal lines DL located in the E2 region and connected with dummy drive circuit units of a same column are connected with each other and are a same data signal line. Data signal lines DL located in the E0 region and the E1 region and connected with adjacent circuit units are disposed at intervals.

In an exemplary implementation mode, as shown in FIGS. 33 to 38, a data signal line DL may have a shape of a line extending along the second direction Y. An orthographic projection of the data signal line DL on the base substrate is at least partially overlapped with an orthographic projection of the fifteenth via on the base substrate. The data signal line DL is connected with the first connection electrode through the fifteenth via.

In an exemplary implementation mode, as shown in FIGS. 33 to 38, a shape of the fifth connection electrode VL5 may be a block structure. An orthographic projection of the fifth connection electrode VL5 on the base substrate is partially overlapped with an orthographic projection of the sixteenth via on the base substrate. The fifth connection electrode VL5 is connected with the second connection electrode through the sixteenth via.

In an exemplary implementation mode, the fifth connection electrode plays a role of undertaking and receiving an anode of a light emitting device and the second connection line, and reliability of the display panel is improved since unreliability of a connection caused by opening a relatively deep via is avoided.

In an exemplary implementation mode, as shown in FIGS. 33 and 34, the first high-voltage power supply line VLA has a shape of a broken line of which a main body portion extends along the second direction Y, and the first high-voltage power supply line VLA is configured to provide a high power supply voltage signal to the first electrode of the fifth transistor of the E0 region. The first high-voltage power supply line VLA is located between a data line DL and the fifth connection electrode VL5. An orthographic projection of the first high-voltage power supply line VLA on the base substrate is partially overlapped with orthographic projections of the seventeenth via and the second electrode of the first transistor (which is also the first electrode of the second transistor) on the base substrate, respectively. The first high-voltage power supply line VLA is connected with the third connection electrode through the seventeenth via.

In an exemplary implementation mode, as shown in FIGS. 33 and 34, a length of the data signal line DL along the first direction is smaller than a length of the first high-voltage power supply line VLA along the first direction.

In an exemplary implementation mode, the first high-voltage power supply line VLA may have substantially a same pattern as the third high-voltage power supply line and the first sub-high-voltage power supply line, respectively.

In an exemplary implementation mode, a length of the first high-voltage power supply line VLA along the first direction may be substantially the same as that of the third high-voltage power supply line and the first sub-high-voltage power supply line along the first direction.

In an exemplary implementation mode, as shown in FIGS. 35 and 36, the second sub-high-voltage power supply line VLB2 has a shape of a broken line of which a main body portion extends along the second direction Y, the second sub-high-voltage power supply line VLB2 is configured to provide a high power supply voltage signal to the first electrode of the fifth transistor of the E1 region. The second sub-high-voltage power supply line VLB2 is located between the data line DL and the fifth connection electrode VL5. An orthographic projection of the second sub-high-voltage power supply line VLB2 on the base substrate is partially overlapped with an orthographic projection of the eighteenth via on the base substrate, respectively. The second sub-high-voltage power supply line VLB2 is connected with the first sub-high-voltage power supply line VLB2 through the eighteenth via.

In an exemplary implementation mode, the second sub-high-voltage power supply line VLB2 is connected with the first high-voltage power supply line.

In an exemplary implementation mode, as shown in FIGS. 35 and 36, a length of the data signal line DL along the first direction is substantially the same as that of the second sub-high-voltage power supply line VLB2 along the first direction.

In an exemplary implementation mode, as shown in FIGS. 37 and 38, the second connection line 72 may have a shape of a line of which a main body portion extends along the second direction Y. The second connection line 72 is located between the data signal line DL and the fifth connection electrode VL5. An orthographic projection of the second connection line 72 on the base substrate is partially overlapped with orthographic projections of the nineteenth via and the first connection line on the base substrate, respectively. The second connection line 72 is connected with the fourth connection electrode through the nineteenth via.

In an exemplary implementation mode, as shown in FIGS. 37 and 38, a pattern of the second connection line 72 may be substantially the same as a pattern of the second sub-high-voltage power supply line.

In an exemplary implementation mode, as shown in FIGS. 37 and 38, orthographic projections of the second connection line 72 and the third high-voltage power supply line on the base substrate are at least partially overlapped.

In an exemplary implementation mode, as shown in FIGS. 37 and 38, a length of the data signal line DL along the first direction may be substantially the same as that of the second connection line 72 along the first direction.

(10) A pattern of a second planarization layer is formed. In an exemplary implementation mode, forming the pattern of the second planarization layer may include: coating a second planarization thin film on the base substrate on which the above-mentioned patterns are formed, patterning the second planarization thin film using a patterning process to form a second planarization layer covering the fifth conductive layer, wherein a plurality of vias are disposed on the second planarization layer, as shown in FIGS. 39 to 41, wherein FIG. 39 is a schematic diagram of the E0 region after the pattern of the second planarization layer is formed, FIG. 40 is a schematic diagram of the E1 region after the pattern of the second planarization layer is formed, and FIG. 41 is a schematic diagram of the E2 region after the pattern of the second planarization layer is formed.

Figure 39:
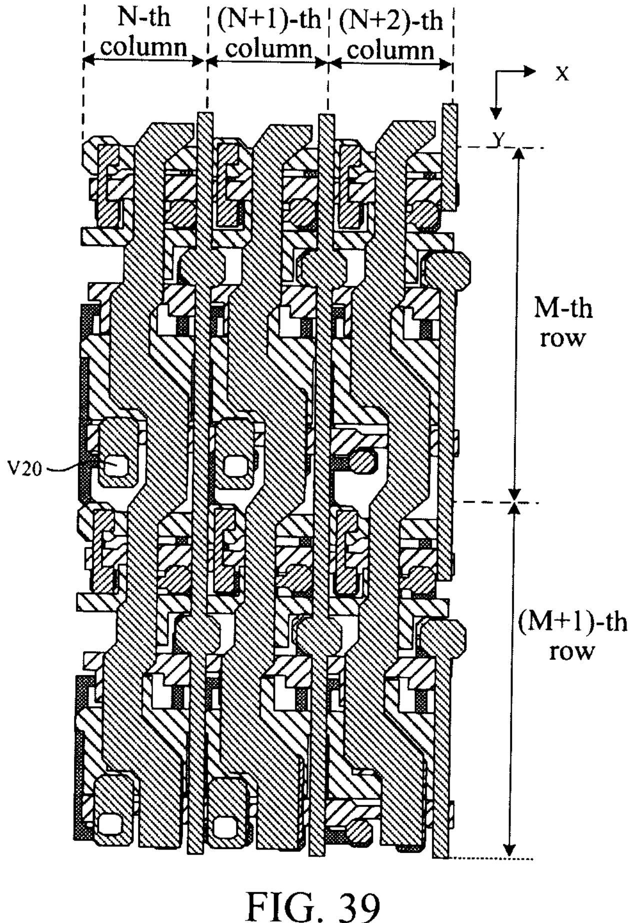
FIG. 39 is a schematic diagram of the E0 region after a pattern of a second planarization layer is formed.
Figure 40:
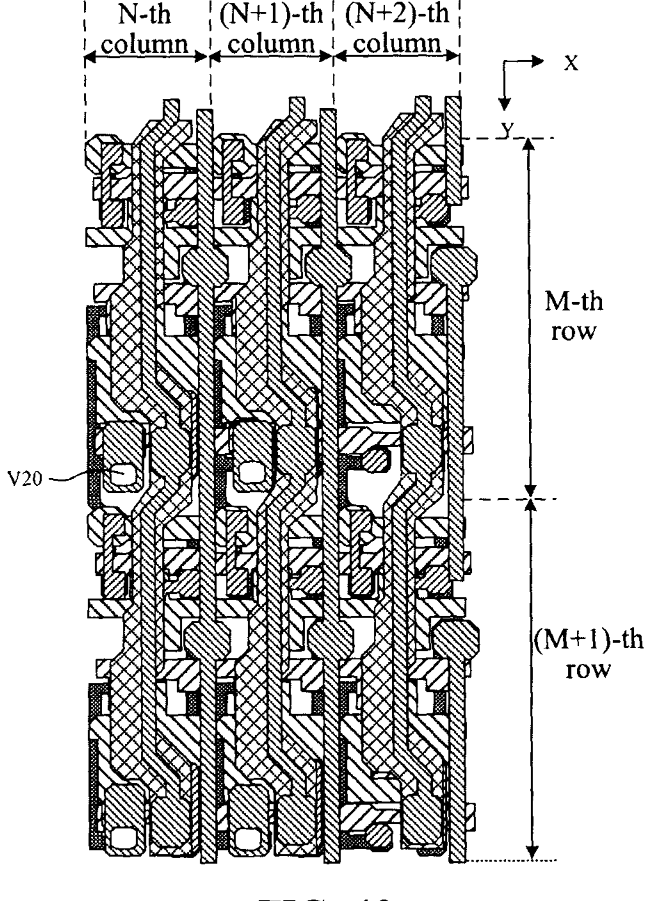
FIG. 40 is a schematic diagram of the E1 region after the pattern of the second planarization layer is formed.
Figure 41:
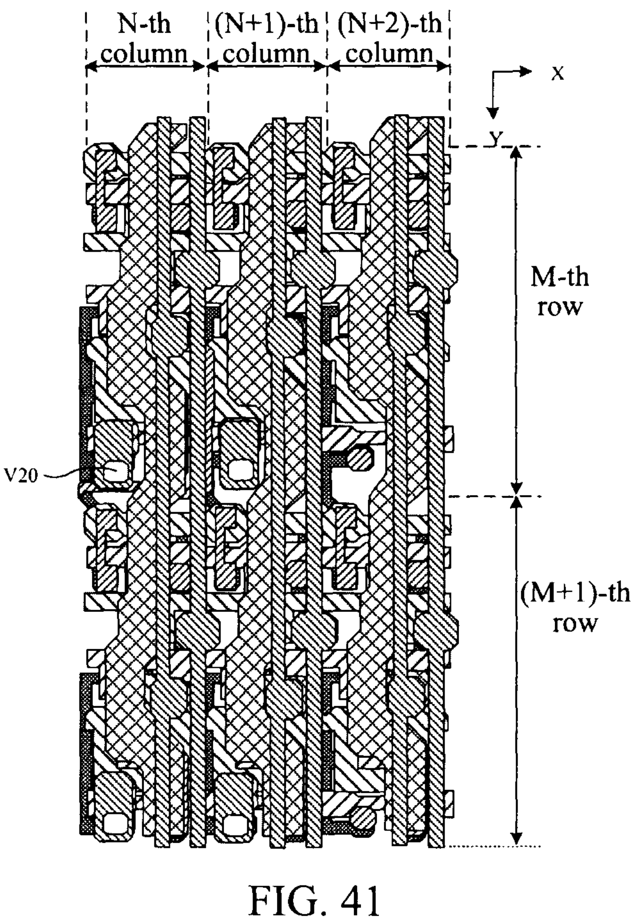
FIG. 41 is a schematic diagram of the E2 region after the pattern of the second planarization layer is formed.

In an exemplary implementation mode, as shown in FIGS. 39 to 41, a plurality of vias of patterns of the second planarization layer of the E0 region, the E1 region, and the E2 region may each include a twentieth via V20.

In an exemplary implementation mode, as shown in FIGS. 39 to 41, an orthographic projection of the twentieth via V20 on the base substrate is within a range of an orthographic projection of the fifth connection electrode on the base substrate, and the twentieth via V20 exposes the fifth connection electrode. The twentieth via V20 is configured such that an anode of a light emitting device formed subsequently is connected with the fifth connection electrode through the via. Positions of twentieth vias V20 in a plurality of circuit units may be different in order to adapt to a connection with a subsequently formed anode.

In an exemplary implementation mode, patterns of vias of patterns of the second planarization layer of the E0 region, the E1 region, and the E2 region are substantially the same.

(11) A pattern of a third planarization layer is formed. In an exemplary implementation mode, forming the pattern of the third planarization layer may include coating a transparent conductive thin film on the base substrate on which the above-mentioned patterns are formed, patterning the transparent conductive thin film using a patterning process to form a transparent conductive layer covering the second planarization layer, coating a third planarization thin film on the base substrate on which a pattern of the transparent conductive layer is formed, patterning the third planarization thin film using a patterning process to form a third planarization layer covering the transparent conductive layer, and a via exposing the fifth connection electrode is disposed on the third planarization layer. The transparent conductive layer may include a second anode connection line.

So far, preparation of a drive circuit layer on the base substrate is completed. On a plane parallel to the display panel, the drive circuit layer may include a plurality of circuit units, each of which may include a pixel circuit, and a scan signal line, a reset signal line, a light emitting signal line, a data signal line, a high-voltage power supply line, a low-voltage power supply line, a first initial signal line, and a second initial signal line connected with the pixel circuit. On a plane perpendicular to the display panel, the drive circuit layer may include a semiconductor layer, a first insulation layer, a first conductive layer, a second insulation layer, a second conductive layer, a third insulation layer, a third conductive layer, a fourth insulation layer, a fourth conductive layer, a first planarization layer, a fifth conductive layer, a second planarization layer, a transparent conductive layer, and a third planarization layer that are sequentially stacked on the base substrate.

In an exemplary implementation mode, the base substrate may be a flexible base substrate, or may be a rigid base substrate. The rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation mode, the flexible base substrate may include a first flexible material layer, a first inorganic material layer, a semiconductor layer, a second flexible material layer, and a second inorganic material layer which are stacked, wherein materials of the first flexible material layer and the second flexible material layer may be Polyimide (PI), Polyethylene Terephthalate (PET), or a surface-treated polymer soft film, or the like, materials of the first inorganic material layer and the second inorganic material layer may be Silicon Nitride (SiNx) or Silicon Oxide (SiOx), or the like, for improving a water and oxygen resistance capability of the base substrate, and a material of the semiconductor layer may be amorphous silicon (a-si).

In an exemplary implementation mode, the first conductive layer, the second conductive layer, the third conductive layer, the fourth conductive layer, and the fifth conductive layer may be made of a metal material, such as any one or more of Argentum (Ag), Copper (Cu), Aluminum (Al), and Molybdenum (Mo), or an alloy material of the above-mentioned metals, such as an Aluminum-Neodymium alloy (AlNd) or a Molybdenum-Niobium alloy (MoNb), and may be of a single-layer structure, or a multilayer composite structure such as Mo/Cu/Mo.

In an exemplary embodiment, for the transparent conductive layer, Indium Tin Oxide (ITO) or Indium Zinc Oxide (IZO) may be adopted, or a multi-layer composite structure, such as ITO/Ag/ITO, may be adopted.

In an exemplary implementation mode, the first insulation layer, the second insulation layer, the third insulation layer, the fourth insulation layer, and the fifth insulation layer may be made of any one or more of Silicon Oxide (SiOx), Silicon Nitride (SiNx) and Silicon Oxynitride (SiON), and may be a single layer, a multi-layer, or a composite layer. The first insulation layer may be referred to as a buffer layer, the second insulation layer and the third insulation layer may be referred to as Gate Insulation (GI) layers, the fourth insulation layer may be referred to as an Interlayer Dielectric (ILD) layer, and the fifth insulation layer may be referred to as a Passivation (PVX) layer. The first planarization layer, the second planarization layer, and the third planarization layer may be made of an organic material, such as a resin. The semiconductor layer may be made of a material, such as an amorphous Indium Gallium Zinc Oxide material (a-IGZO), Zinc Oxynitride (ZnON), Indium Zinc Tin Oxide (IZTO), amorphous Silicon (a-Si), polycrystalline Silicon (p-Si), hexthiophene, or polythiophene, that is, the present disclosure is applicable to a transistor manufactured based on an oxide technology, a silicon technology, or an organic matter technology.

In an exemplary implementation mode, after preparation of the drive circuit layer is completed, a light emitting structure layer is prepared on the drive circuit layer, and a preparation process of the light emitting structure layer may include following operations.

Figure 42:
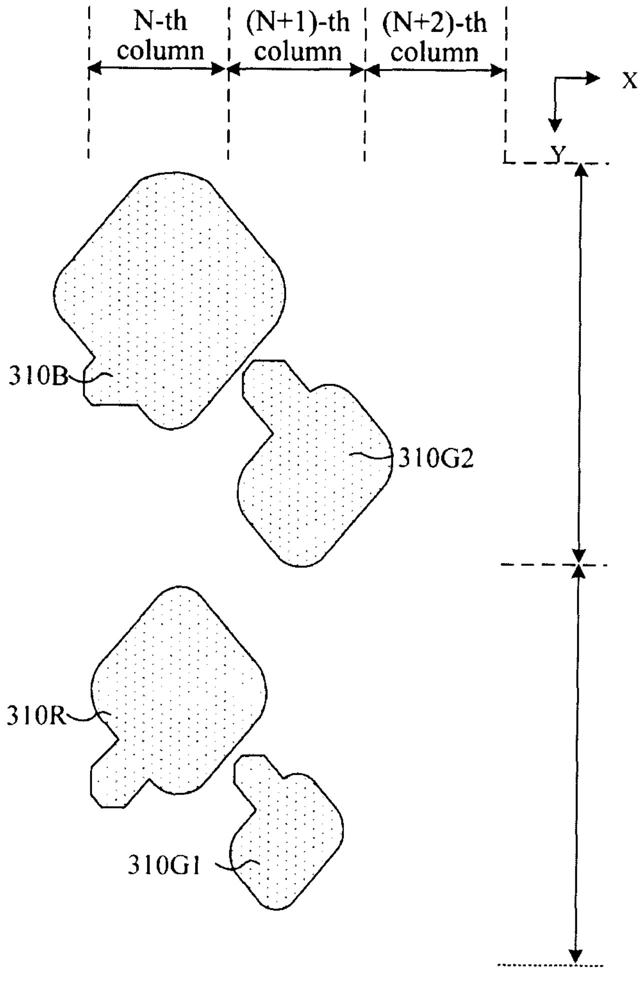
FIG. 42 is a schematic diagram of a pattern of an anode conductive layer.
Figure 43:
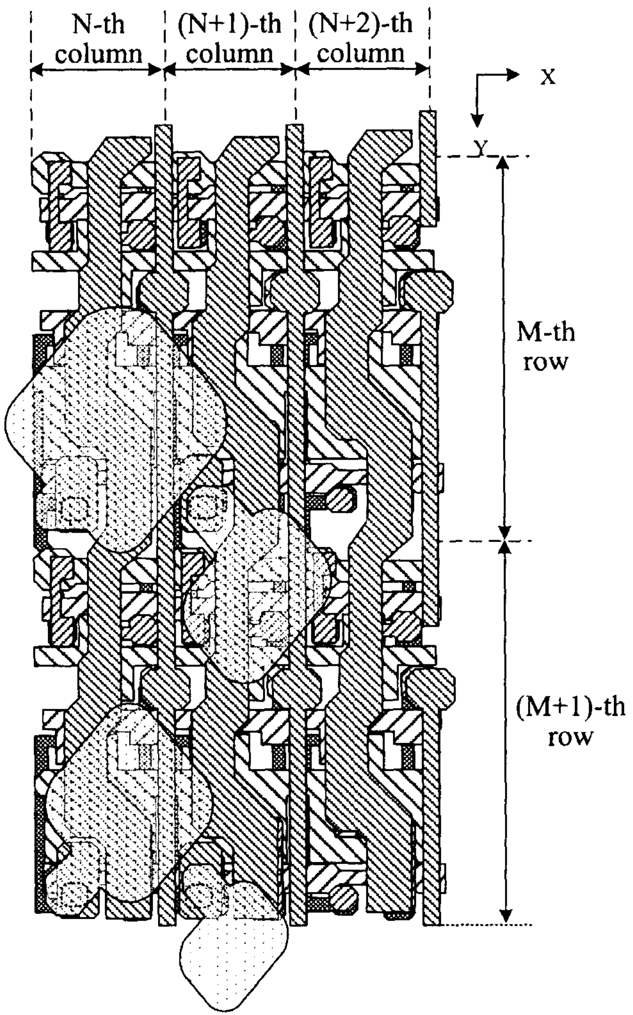
FIG. 43 is a schematic diagram of the E0 region after the pattern of the anode conductive layer is formed.
Figure 44:
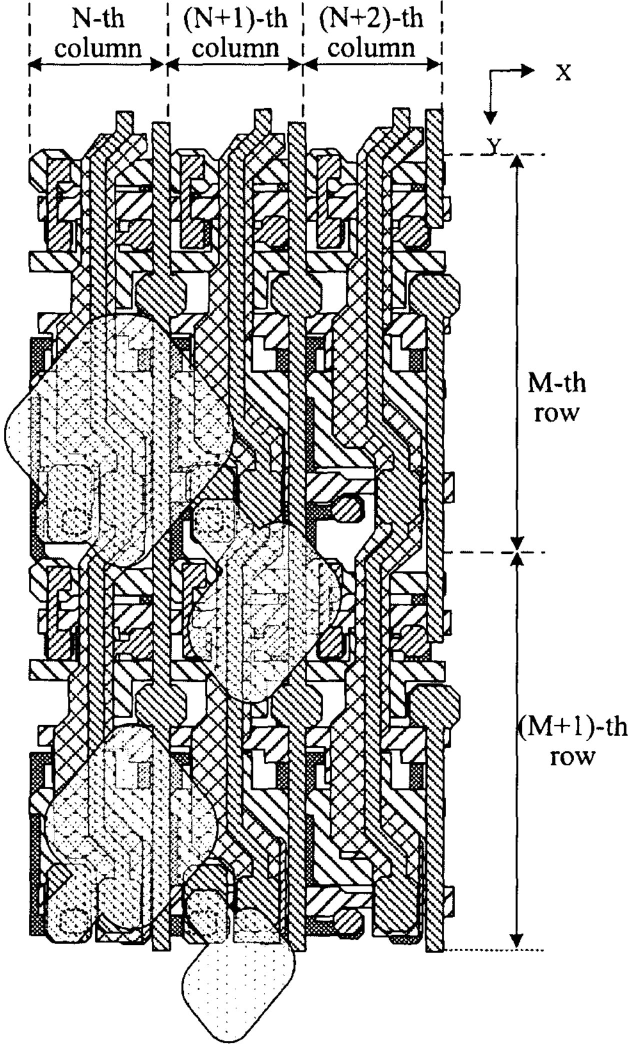
FIG. 44 is a schematic diagram of the E1 region after the pattern of the anode conductive layer is formed.
Figure 45:
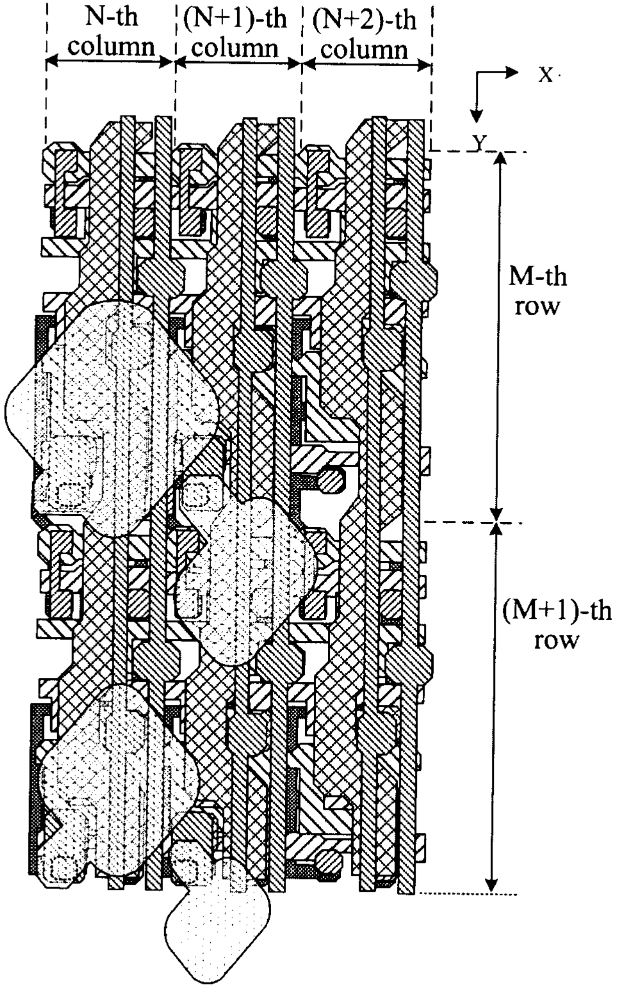
FIG. 45 is a schematic diagram of the E2 region after the pattern of the anode conductive layer is formed.

(11) A pattern of an anode conductive layer is formed. In an exemplary implementation mode, forming the pattern of the anode conductive layer may include depositing an anode conductive thin film on the base substrate on which the above-mentioned patterns are formed, patterning the anode conductive thin film using a patterning process to form the pattern of the anode conductive layer disposed on the third planarization layer, as shown in FIGS. 42 to 45, wherein FIG. 42 is a schematic diagram of the pattern of the anode conductive layer, FIG. 43 is a schematic diagram of the E0 region after the pattern of the anode conductive layer is formed, FIG. 44 is a schematic diagram of the E1 region after the pattern of the anode conductive layer is formed, and FIG. 45 is a schematic diagram of the E2 region after the pattern of the anode conductive layer is formed.

In an exemplary implementation mode, the anode conductive layer may be of a single-layer structure, such as Indium Tin Oxide (ITO) or Indium Zinc Oxide (IZO), or may be of a multi-layer composite structure, such as ITO/Ag/ITO.

In an exemplary implementation mode, the pattern of the anode conductive layer may include a first anode 301R of a red light emitting device, a second anode 301B of a blue light emitting device, a third anode 301G1 of a first green light emitting device, and a fourth anode 301G2 of a second green light emitting device. A region where the first anode 301R is located may form a red sub-pixel R emitting red light, a region where the second anode 301B is located may form a blue sub-pixel B emitting blue light, a region where the third anode 301G1 is located may form a first green sub-pixel G1 emitting green light, and a region where the fourth anode 301G2 is located may form a second green sub-pixel G2 emitting green light.

In an exemplary implementation mode, the first anode 301A and the second anode 301B may be sequentially disposed along the second direction Y, the third anode 301C and the fourth anode 301D may be sequentially disposed along the second direction Y, and the third anode 301C and the fourth anode 301D may be disposed on one side of the first anode 301A and the second anode 301B in the first direction X. Or, the first anode 301A and the second anode 301B may be sequentially disposed along the first direction X, the third anode 301C and the fourth anode 301D may be sequentially disposed along the first direction X, and the third anode 301C and the fourth anode 301D may be disposed on one side of the first anode 301A and the second anode 301B in the second direction Y.

In an exemplary implementation mode, the first anode 301R, the second anode 301B, the third anode 301G1, and the fourth anode 301G2 may be connected with fifth connection electrodes in corresponding circuit units through the twentieth via V20, respectively. Since each anode is connected with the second electrode of the sixth transistor (which is also the second electrode of the seventh transistor) through a fifth connection electrode and a second connection electrode in one circuit unit, four anodes in one light emitting unit are correspondingly connected with pixel circuits of four circuit units respectively, and it is achieved that a pixel circuit may drive a light emitting device to emit light.

In an exemplary implementation mode, shapes and areas of anodes of four sub-pixels in one light emitting unit may be the same or different, positional relationships between the four sub-pixels of one light emitting unit and four circuit units in one circuit unit group may be the same or different, and shapes and positions of first anodes 301R, second anodes 301B, third anodes 301G1 and fourth anodes 301G2 in different light emitting units may be the same or different, which is not limited here in the present disclosure.

In an exemplary implementation mode, at least one of the first anode 301A, the second anode 301B, the third anode 301C, and the fourth anode 301D may include a main body portion and a connection portion connected with each other, the main body portion may have a rectangular shape, a corner portion of the rectangular shape may be provided with an arc-shaped chamfer, the connection portion may have a shape of a strip extending along a direction away from the main body portion, and the connection portion is connected with a fifth connection electrode through the twentieth via V20.

As shown in FIG. 45, in the E2 region, orthographic projections of main body portions of the first anode 301A, the second anode 301B, the third anode 301C, and the fourth anode 301D on the base substrate are at least partially overlapped with orthographic projections of a second connection line and a data signal line on the base substrate.

As shown in FIG. 44, in the E1 region, orthographic projections of main body portions of the first anode 301A, the second anode 301B, the third anode 301C, and the fourth anode 301D on the base substrate are at least partially overlapped with orthographic projections of a second sub-high-voltage power supply line and a data signal line on the base substrate.

As shown in FIG. 43, in the E0 region, orthographic projections of main body portions of the first anode 301A, the second anode 301B, the third anode 301C, and the fourth anode 301D on the base substrate are at least partially overlapped with orthographic projections of a first high-voltage power supply line and a data signal line on the base substrate.

In an exemplary implementation mode, a subsequent preparation process may include: forming a pattern of a pixel definition layer at first, then forming an organic emitting layer using an evaporation or inkjet printing process, then forming a cathode on the organic emitting layer, and then forming an encapsulation structure layer, wherein the encapsulation structure layer may include a first encapsulation layer, a second encapsulation layer, and a third encapsulation layer which are stacked, the first encapsulation layer and the third encapsulation layer may be made of an inorganic material, the second encapsulation layer may be made of an organic material, and the second encapsulation layer is disposed between the first encapsulation layer and the third encapsulation layer, which may ensure that external water vapor cannot enter the light emitting structure layer.

The aforementioned structure shown in the present disclosure and the preparation process thereof are merely exemplary description. In an exemplary implementation mode, corresponding structures may be changed and patterning processes may be added or reduced according to actual needs, which is not limited here in the present disclosure.

In an exemplary implementation mode, the display panel of the present disclosure may be applied to a display apparatus with a pixel circuit, such as an OLED, Quantum dot display (QLED), Light Emitting Diode display (Micro LED or Mini LED), or Quantum Dot Light Emitting Diode display (QDLED), which is not limited here in the present disclosure.

Figure 46:
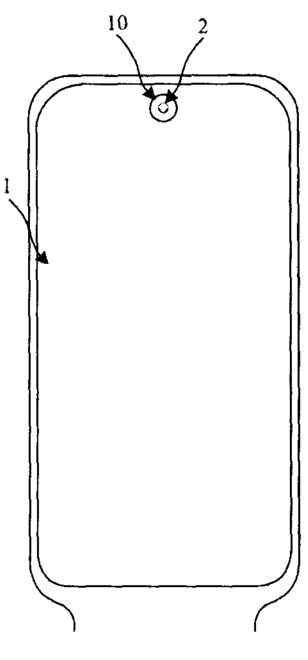
FIG. 46 is a schematic diagram of a structure of a display apparatus according to an embodiment of the present disclosure.

FIG. 46 is a schematic diagram of a structure of a display apparatus according to an embodiment of the present disclosure. As shown in FIG. 46, an embodiment of the present disclosure also provide a display apparatus, which includes a display panel 1 according to any of the foregoing embodiments and a photosensitive sensor 2, and the photosensitive sensor is located in a light transmitting display region 10 of the display panel 1.

In an exemplary implementation mode, the display apparatus may be any product or component with a display function, such as a mobile phone, a tablet computer, a television, a display, a laptop computer, a digital photo frame, or a navigator, and the present disclosure is not limited thereto.

In an exemplary implementation mode, when the light transmitting display region 10 is rectangular, an area of an orthographic projection of the photosensitive sensor 2 on a base substrate is less than or equal to an area of an inscribed circle of the light transmitting display region 10.

In an exemplary implementation mode, the photosensitive sensor 2 may include at least one of a camera module (e.g., a front camera module), a 3D structured light module (e.g., a 3D structured light sensor), a Time of Flight 3D imaging module (e.g., a Time of Flight sensor), an infrared sensing module (e.g., an infrared sensing sensor), and the like.

In an exemplary implementation mode, the front camera module is usually enabled when a user takes a selfie or makes a video call, and a display region of the display apparatus displays an image obtained by the selfie for the user to view. The front camera module includes, for example, a lens, an image sensor, an image processing chip, and the like. An optical image of a scene generated by the lens is projected onto a surface of the image sensor (the image sensor includes CCD and CMOS) and converted into electrical signals, which are converted into digital image signals after analog-to-digital conversion through the image processing chip, and then sent to a processor for processing, and the image of the scene is output on a display screen.

In an exemplary implementation mode, the 3D structured light sensor and the Time of Flight (ToF) sensor may be used for face recognition to unlock the display apparatus.

The display apparatus according to the embodiment of the present disclosure may display images in the light transmitting display region to maintain display integrity of the whole display apparatus.

The accompanying drawings of the present disclosure only involve structures involved in the embodiments of the present disclosure, and other structures may be referred to conventional designs.

For the sake of clarity, a thickness and size of a layer or a micro structure are enlarged in the accompanying drawings used for describing the embodiments of the present disclosure. It may be understood that when an element such as a layer, a film, a region, or a substrate is described as being "on" or "under" another element, the element may be "directly" located "on" or "under" the another element, or there may be an intermediate element.

Although implementation modes disclosed in the present disclosure are as above, contents described are only implementation modes adopted for convenience of understanding the present disclosure and are not intended to limit the present disclosure. Any of those skilled in the art of the present disclosure may make any modification and variation in forms and details of implementation without departing from the spirit and scope of the present disclosure. However, the scope of patent protection of the present disclosure should still be subject to the scope defined in the appended claims.

The invention claimed is:

1. A display panel, comprising a display region, wherein the display region comprises: a light transmitting display region and a conventional display region located on at least one side of the light transmitting display region, the conventional display region comprises a first region, a second region, and a third region, at least one circuit unit of the first region is connected with a light emitting device in the light transmitting display region, at least one circuit unit of the third region comprises a data connection line, a high-voltage power supply line located in the first region is a first high-voltage power supply line, a high-voltage power supply line located in the second region is a second high-voltage power supply line, and a high-voltage power supply line located in the third region is a third high-voltage power supply line;

the second high-voltage power supply line comprises a first sub-high-voltage power supply line and a second sub-high-voltage power supply line connected with each other, the second sub-high-voltage power supply line is located on a side of the first sub-high-voltage power supply line away from a base substrate, the first high-voltage power supply line and the second sub-high-voltage power supply line are disposed in a same layer, and the third high-voltage power supply line and the first sub-high-voltage power supply line are disposed in a same layer.

2. A display apparatus comprising: a display panel according to claim 1 and a photosensitive sensor; the photosensitive sensor is located in a light transmitting display region of the display panel.

3. The display panel according to claim 1, wherein the light emitting device comprises an anode, an organic emitting layer, and a cathode, and the display panel further comprises a plurality of first anode connection lines extending along a first direction, a first anode connection line is disposed in a same layer as the third high-voltage power supply line, and is configured to connect at least one circuit unit of the first region and the anode of the light emitting device located in the light transmitting display region.

4. The display panel according to claim 3, wherein the light transmitting display region comprises: a central region and an edge region surrounding and disposed on an outside of the central region; the display panel further comprises a second anode connection line, and the second anode connection line is located on a side of the first high-voltage power supply line away from the base substrate;

the first anode connection line is configured to connect at least one circuit unit of the first region and an anode of a light emitting device located in the edge region, and the second anode connection line is configured to connect at least one circuit unit of the first region and an anode of a light emitting device located in the central region.

5. The display panel according to claim 4, wherein the display region comprises: a plurality of light emitting units, at least one light emitting unit comprises: a first light emitting device, a second light emitting device, and a third light emitting device, different light emitting devices emitting light of different colors, the first light emitting device and the second light emitting device emit red or blue light, and the third light emitting device emits green light;

for a light emitting unit located in the edge region, a length of a first anode connection line connected with a third light emitting device of a same light emitting unit along the first direction is smaller than a length of a first anode connection line connected with a first light emitting device and a second light emitting device of the same light emitting unit along the first direction.

6. The display panel according to claim 5, wherein a length of a first anode connection line connected with any third light emitting device located in the edge region along the first direction is smaller than a length of a first anode connection line connected with any first light emitting device located in the edge region and a first anode connection line connected with any second light emitting device located in the edge region along the first direction.

7. The display panel according to claim 1, wherein a length of the second sub-high-voltage power supply line along a first direction is less than a length of the first sub-high-voltage power supply line along the first direction, and an orthographic projection of the second sub-high-voltage power supply line on the base substrate is at least partially overlapped with an orthographic projection of the first sub-high-voltage power supply line on the base substrate.

8. The display panel according to claim 7, wherein a length of the first high-voltage power supply line along the first direction and a length of the first sub-high-voltage power supply line along the first direction are approximately equal to that of the third high-voltage power supply line, and a shape of the first high-voltage power supply line, a shape of the first sub-high-voltage power supply line, and a shape of the third high-voltage power supply line are approximately the same.

9. The display panel according to claim 7, wherein a length of the second sub-high-voltage power supply line along the first direction is approximately equal to a length of a second connection line along the first direction, and a shape of the second sub-high-voltage power supply line is approximately the same as a shape of the second connection line.

10. The display panel according to claim 9, wherein an area of an overlapping region of an orthographic projection of the second sub-high-voltage power supply line on the base substrate and an orthographic projection of the first sub-high-voltage power supply line on the base substrate is larger than an area of an overlapping region of an orthographic projection of the second connection line on the base substrate and an orthographic projection of the third high-voltage power supply line on the base substrate.

11. The display panel according to claim 1, wherein the data connection line comprises: a first connection line and a second connection line extending along a second direction which are connected with each other, the first connection line is located on a side of the third high-voltage power supply line close to the base substrate, the second connection line and the first high-voltage power supply line are disposed in a same layer;

an orthographic projection of the first connection line on the base substrate is at least partially overlapped with an orthographic projection of a data signal line on the base substrate, and an orthographic projection of the second connection line on the base substrate is at least partially overlapped with an orthographic projection of the third high-voltage power supply line on the base substrate.

12. The display panel according to claim 11, wherein the first connection line comprises: a first data connection portion extending along the second direction and a second data connection portion extending along a first direction, the first data connection portion is connected with the second data connection portion and the second connection line, respectively, and the first direction and the second direction intersect;

an orthographic projection of the first data connection portion on the base substrate is at least partially overlapped with the orthographic projection of the data signal line on the base substrate.

13. The display panel according to claim 11, wherein a pixel circuit comprises at least a capacitor and a plurality of transistors, the capacitor comprises: a first electrode plate and a second electrode plate; the display panel comprises a semiconductor layer, a first insulation layer, a first conductive layer, a second insulation layer, a second conductive layer, a third insulation layer, a third conductive layer, a fourth insulation layer, a fourth conductive layer, a first planarization layer, and a fifth conductive layer disposed sequentially on the base substrate;

the semiconductor layer comprises at least active layers of the plurality of transistors; the first conductive layer comprises at least gate electrodes of the plurality of transistors and the first electrode plate of the capacitor, the second conductive layer comprises at least the second electrode plate of the capacitor, the third conductive layer comprises at least first electrodes and second electrodes of the plurality of transistors and the first connection line, the fourth conductive layer comprises at least a first anode connection line, the first sub-high-voltage power supply line, and the third high-voltage power supply line, and the fifth conductive layer comprises at least the data signal line, the first high-voltage power supply line, the second sub-high-voltage power supply line, and the second connection line.

14. The display panel according to claim 13, wherein the pixel circuit comprises: a writing transistor connected with the data signal line, and the second electrode plate of the capacitor located in the third region comprises: a capacitor main body portion and an auxiliary capacitor portion connected with each other, a shape of the capacitor main body portion is substantially the same as that of the second electrode plate of the capacitor located in the first region and the second region; an orthographic projection of the auxiliary capacitor portion on the base substrate is at least partially overlapped with an orthographic projection of an active layer of the writing transistor on the base substrate.

15. The display panel according to claim 13, wherein the third conductive layer further comprises: a data connection block, an orthographic projection of the data connection block on the base substrate is at least partially overlapped with orthographic projections of the auxiliary capacitor portion and the second connection line on the base substrate;

the data connection block is respectively connected with the first connection line and the second connection line.

16. The display panel according to claim 15, wherein the data connection block and a second data connection portion are located on a same side of a first data connection portion and are electrically connected with the first data connection portion;

an orthographic projection of the first data connection portion on the base substrate is at least partially overlapped with an orthographic projection of the second electrode plate of the capacitor on the base substrate.

17. The display panel according to claim 13, wherein the pixel circuit further comprises: a first light emitting transistor and a second light emitting transistor, the first light emitting transistor is connected with a high-voltage power supply line and the second light emitting transistor is connected with an anode of a light emitting device; the fourth conductive layer further comprises: a first connection electrode, a second connection electrode, a third connection electrode, and a fourth connection electrode;

the first connection electrode has an orthographic projection on the base substrate which is at least partially overlapped with an orthographic projection of a first electrode of a writing transistor in at least one circuit unit located in the first region to the third region on the base substrate, and is electrically connected with the first electrode of the writing transistor in the at least one circuit unit located in the first region to the third region, the second connection electrode has an orthographic projection on the base substrate which is at least partially overlapped with an orthographic projection of a second electrode of a second light emitting transistor in at least one circuit located in the first region to the third region on the base substrate, and is electrically connected with the second electrode of the second light emitting transistor in the at least one circuit located in the first region to the third region, the third connection electrode has an orthographic projection on the base substrate which is at least partially overlapped with an orthographic projection of a first electrode of a first light emitting transistor in at least one circuit unit located in the first region on the base substrate, and is connected with the first electrode of the first light emitting transistor in the at least one circuit unit located in the first region, an orthographic projection of the fourth connection electrode on the base substrate is at least partially overlapped with an orthographic projection of a data connection block on the base substrate, and is at least partially overlapped with the orthographic projection of the data connection block on the base substrate.

18. The display panel according to claim 17, wherein the data signal line has an orthographic projection on the base substrate that is at least partially overlapped with the orthographic projection of the first connection electrode on the base substrate and is connected with the first connection electrode, the first high-voltage power supply line has an orthographic projection on the base substrate that is at least partially overlapped with the orthographic projection of the third connection electrode on the base substrate and is connected with the third connection electrode, and the second connection line has an orthographic projection on the base substrate that is at least partially overlapped with the orthographic projection of the fourth connection electrode on the base substrate and is connected with the fourth connection electrode.

19. The display panel according to claim 17, wherein the fifth conductive layer further comprises: a fifth connection electrode, the fifth connection electrode has an orthographic projection on the base substrate which is at least partially overlapped with the orthographic projection of the second connection electrode on the base substrate, and is connected with the second connection electrode.

20. The display panel according to claim 19, further comprising a transparent conductive layer located on a side of a second planarization layer away from the base substrate, the transparent conductive layer comprises a second anode connection line, the second anode connection line has an orthographic projection on the base substrate that is at least partially overlapped with the orthographic projection of the fifth connection electrode on the base substrate, and is connected with the fifth connection electrode.

* * * * *